(12) United States Patent
Amikura et al.

(10) Patent No.: US 12,165,893 B2
(45) Date of Patent: Dec. 10, 2024

(54) SUBSTRATE PROCESSING SYSTEM AND TRANSFER METHOD

(71) Applicant: Tokyo Electron Limited, Tokyo (JP)

(72) Inventors: Norihiko Amikura, Miyagi (JP); Masatomo Kita, Miyagi (JP); Toshiyuki Makabe, Miyagi (JP); Shin Matsuura, Miyagi (JP); Nobutaka Sasaki, Miyagi (JP); Gyeong min Park, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/182,716

(22) Filed: Mar. 13, 2023

(65) Prior Publication Data

US 2023/0215753 A1 Jul. 6, 2023

Related U.S. Application Data

(63) Continuation of application No. PCT/JP2022/004058, filed on Feb. 2, 2022.

(30) Foreign Application Priority Data

Feb. 9, 2021 (JP) .................. 2021-018937

(51) Int. Cl.
*H01L 21/677* (2006.01)
*H01J 37/32* (2006.01)
(Continued)

(52) U.S. Cl.
CPC .. *H01L 21/67742* (2013.01); *H01J 37/32642* (2013.01); *H01J 37/32715* (2013.01);
(Continued)

(58) Field of Classification Search
CPC .......... H01L 21/6838; H01L 21/68707; H01L 21/67742; H01J 37/32715; H01J 37/32642
See application file for complete search history.

(56) References Cited

U.S. PATENT DOCUMENTS

| | | | |
|---|---|---|---|
| 2020/0013657 A1* | 1/2020 | Lee | H01J 37/32642 |
| 2020/0194295 A1* | 6/2020 | Sugita | H01L 21/67742 |

(Continued)

FOREIGN PATENT DOCUMENTS

| | | |
|---|---|---|
| JP | 2017-098540 | 6/2017 |
| JP | 2019-114790 | 7/2019 |

(Continued)

*Primary Examiner* — Saul Rodriguez
*Assistant Examiner* — Willie W Berry, Jr.
(74) *Attorney, Agent, or Firm* — IPUSA, PLLC

(57) ABSTRACT

A substrate processing system includes a vacuum transfer module; a plasma process module; a transfer robot in the vacuum transfer module; a stage in the plasma process module; a first ring disposed on the stage and a second ring disposed on the first ring to surround a substrate that is placed on the stage, the second ring having an inner diameter smaller than an inner diameter of the first ring; actuators to move support pins vertically to raise the first and the second rings and a transfer jig; and a controller configured to selectively execute a simultaneous transfer mode in which the transfer robot is caused to simultaneously transfer the first ring and the second ring and a sole transfer mode in which the transfer robot is caused to transfer only the second ring.

21 Claims, 66 Drawing Sheets

(51) Int. Cl.
 *H01L 21/67* (2006.01)
 *H01L 21/683* (2006.01)
 *H01L 21/687* (2006.01)

(52) U.S. Cl.
 CPC .... *H01L 21/67196* (2013.01); *H01L 21/6838* (2013.01); *H01L 21/68707* (2013.01); *H01L 21/68721* (2013.01); *H01L 21/68742* (2013.01); *H01J 2237/007* (2013.01)

(56) References Cited

U.S. PATENT DOCUMENTS

| | | | |
|---|---|---|---|
| 2020/0219753 A1* | 7/2020 | Uchida | H01L 21/68735 |
| 2022/0301833 A1* | 9/2022 | Hayashi | H01J 37/32642 |

FOREIGN PATENT DOCUMENTS

| | | |
|---|---|---|
| JP | 2020-113603 | 7/2020 |
| JP | 2020-115541 | 7/2020 |
| KR | 10-2021-0154867 | 12/2021 |
| WO | 2020/231611 | 11/2020 |

\* cited by examiner

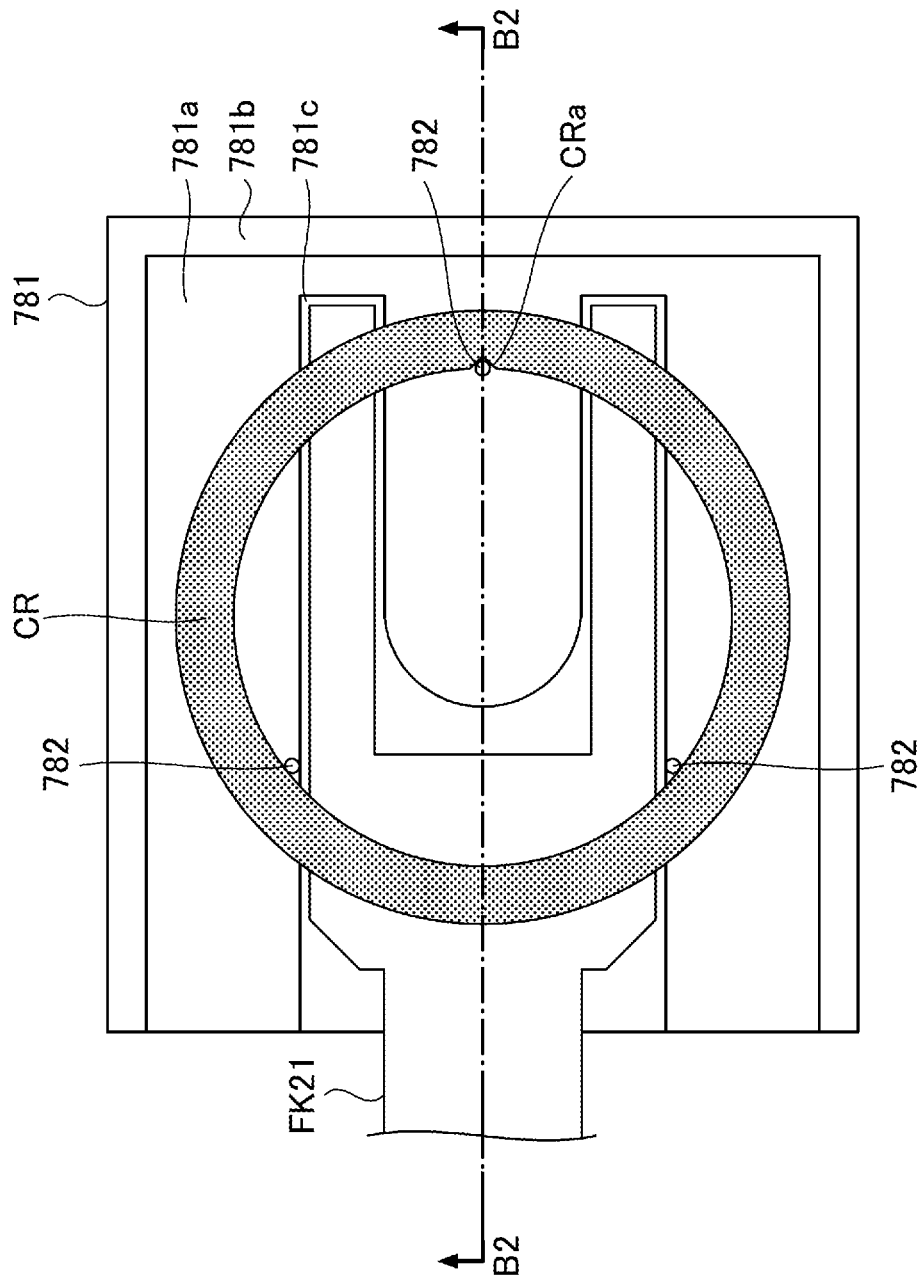

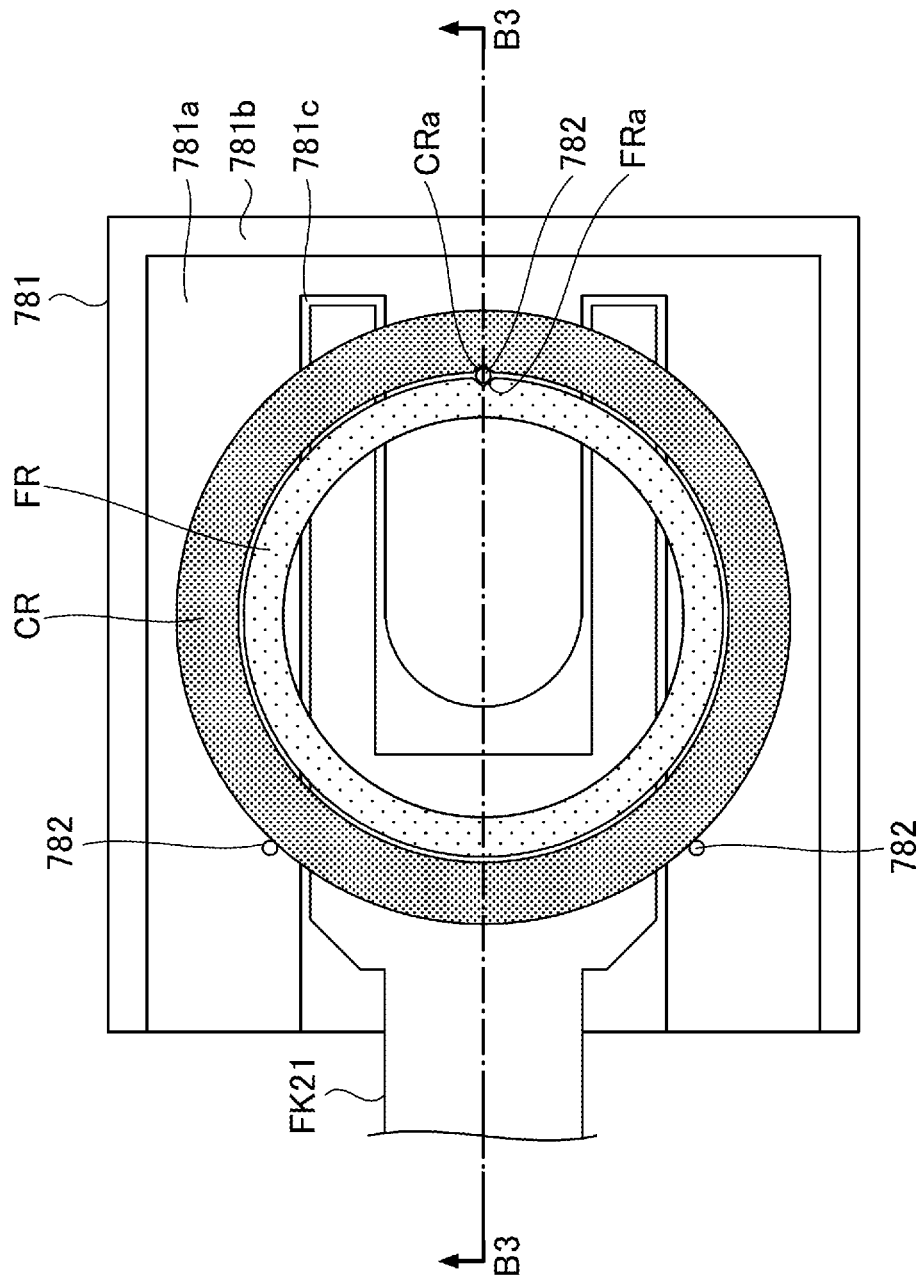

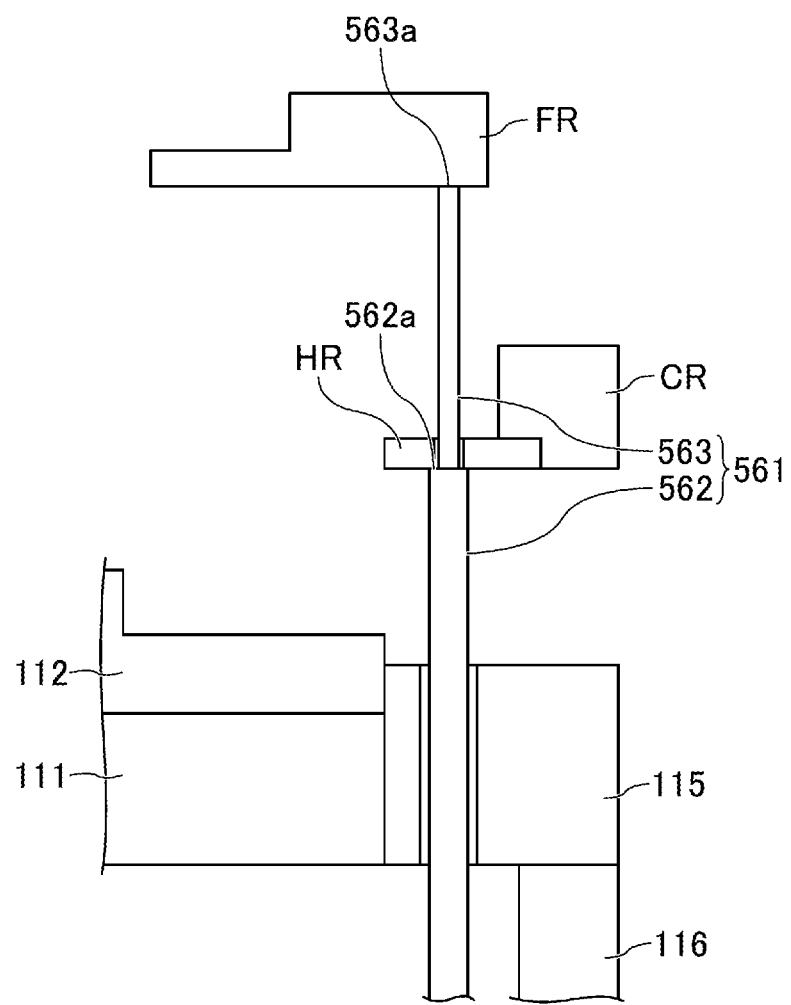

SUBSTRATE PROCESSING SYSTEM AND TRANSFER METHOD

CROSS-REFERENCE TO RELATED APPLICATION

The present application is a continuation application filed under 35 U.S.C. 111 (a) claiming the benefit under 35 U.S.C. 120 and 365 (c) of PCT International Application No. PCT/JP2022/004058, filed on Feb. 2, 2022, and designating the U.S., which is based on and claims priority to Japanese Patent Application No. 2021-018937, filed on Feb. 9, 2021. The entire contents of the PCT International Application No. PCT/JP2022/004058 and the Japanese Patent Application No. 2021-018937 are incorporated herein by reference.

BACKGROUND

1. Field of the Disclosure

The present disclosure relates to a substrate processing system and a transfer method.

2. Description of the Related Art

There is known a technique in which an edge ring and a cover ring are placed around a wafer in a processing container in which a plasma process is performed.

SUMMARY

According to an aspect of the present disclosure, there is provided a substrate processing system that includes a vacuum transfer module; a plasma process module connected to the vacuum transfer module; and a controller. The vacuum transfer module includes a vacuum transfer chamber; and a transfer robot disposed in the vacuum transfer chamber. The plasma process module includes a plasma process chamber; a stage disposed in the plasma process chamber and having a substrate support surface and a ring support surface; a first ring placed on the ring support surface of the stage; a second ring placed on the first ring to surround a substrate that is placed on the substrate support surface of the stage, the second ring having an inner diameter smaller than an inner diameter of the first ring; a plurality of first support pins disposed below the ring support surface; a plurality of second support pins disposed below the substrate support surface; a first actuator configured to vertically move the plurality of first support pins with respect to the stage; and a second actuator configured to vertically move the plurality of second support pins with respect to the stage. The controller is configured to selectively execute a simultaneous transfer mode in which the transfer robot is caused to simultaneously transfer the first ring and the second ring together and a sole transfer mode in which the transfer robot is caused to transfer only the second ring. The simultaneous transfer mode includes raising the plurality of first support pins so that the first ring and the second ring are raised together by the plurality of first support pins; and transferring the first ring and the second ring together between the plurality of first support pins and the transfer robot in a state where the plurality of first support pins have been raised. The sole transfer mode includes raising the plurality of first support pins so that the first ring and the second ring are raised together by the plurality of first support pins; raising the plurality of second support pins so that a transfer jig is supported by the plurality of second support pins at a height lower than a height of the second ring; and lowering the plurality of first support pins so that the first ring is lowered to a position lower than a height of the transfer jig in a state where the first ring is supported by the plurality of first support pins while the second ring is supported by the transfer jig; and transferring the transfer jig and the second ring together between the plurality of second support pins and the transfer robot in a state where the plurality of second support pins have been raised.

The objects and advantages of the embodiments will be realized and attained by means of the elements and combinations particularly pointed out in the claims.

It is to be understood that both the foregoing general description and the following detailed description are exemplary and explanatory and not restrictive of the disclosure.

BRIEF DESCRIPTION OF THE DRAWINGS

FIGS. 12A-12C depict an example of a cover ring positioning mechanism.

FIGS. 13A-13C are diagrams depicting an example of an edge ring and cover ring positioning mechanism.

FIGS. 40A-40B are schematic cross-sectional views depicting an example of the simultaneous transfer mode according to the third variant.

DETAILED DESCRIPTION

Figure 1:
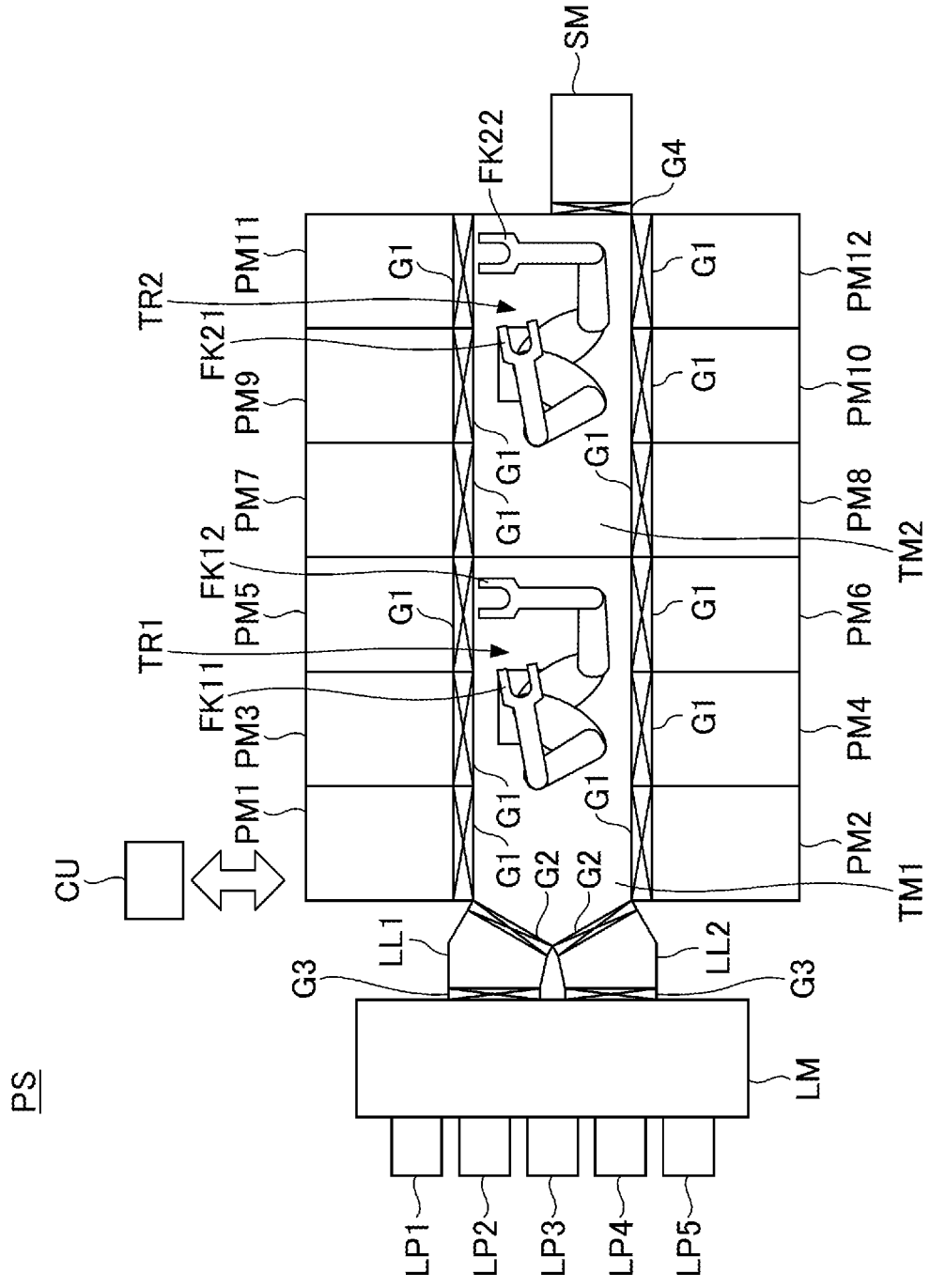
FIG. 1 is a diagram illustrating an example of a processing system according to an embodiment.

Non-limiting exemplary embodiments of the present disclosure will now be described with reference to the accompanying drawings. In all of the accompanying drawings, the same or corresponding members or components are denoted by the same or corresponding reference numerals, and redundant description is omitted.

The present disclosure provides a technique capable of selectively replacing consumable members whose times to be replaced are different.

According to the present disclosure, it is possible to selectively replace consumable members whose times to be replaced are different.

[Processing System]

An example of a processing system according to an embodiment will be described with reference to FIG. 1. As depicted in FIG. 1, the processing system PS is a system capable of performing various processes such as a plasma process on a substrate. The substrate may be, for example, a semiconductor wafer.

The processing system PS includes vacuum transfer modules TM1 and TM2, process modules PM1 to PM12, load lock modules LL1 and LL2, an atmospheric transfer module LM, a storage module SM, and the like.

Each of the vacuum transfer modules TM1 and TM2 has a substantially quadrangular shape in plan view. The process modules PM1 to PM6 are connected to two mutually opposite side surfaces of the vacuum transfer module TM1. The load lock modules LL1 and LL2 are connected to one side surface of the other two mutually opposite side surfaces of the vacuum transfer module TM1, and a path (not depicted) for connection to the vacuum transfer module TM2 is connected to the other side surface of the other two mutually opposite side surfaces of the vacuum transfer module TM1. The side surface of the vacuum transfer module TM1 to which the load lock modules LL1 and LL2 are connected is angled in accordance with the two load lock modules LL1 and LL2. The process modules PM7 to PM12 are connected to two mutually opposite side surfaces of the vacuum transfer module TM2. A path (not depicted) for connection to the vacuum transfer module TM1 is connected to one of the other two mutually opposite side surfaces of the vacuum transfer module TM1, and a storage module SM is connected to the other one of the other two mutually opposite side surfaces of the vacuum transfer module TM1. The vacuum transfer modules TM1 and TM2 include vacuum chambers (vacuum transfer chambers), transfer robots TR1 and TR2 being disposed in the insides thereof, respectively.

The transfer robots TR1 and TR2 are configured to be rotatable, extendable, and vertically movable. The transfer robot TR1 holds and transfers a substrate and a consumable member by an upper fork (first fork) FK11 and a lower fork (second fork) FK12 disposed at a distal end of the transfer robot TR1. In the example of FIG. 1, the transfer robot TR1 holds the substrate and the consumable member by the upper fork FK11 and the lower fork FK12, and transfers the substrate and the consumable member between the load lock modules LL1 and LL2, the process modules PM1 to PM6, and the path (not depicted). The transfer robot TR2 holds and transfers a substrate and a consumable member by an upper fork FK21 and a lower fork FK22 disposed at a distal end of the transfer robot TR2. In the example of FIG. 1, the transfer robot TR2 holds the substrate and the consumable member by the upper fork FK21 and the lower fork FK22, and transfers the substrate and the consumable member between the process modules PM7 to PM12, the storage module SM, and the path (not depicted). Consumable members are members that are replaceably mounted in the process modules PM1 to PM12 and are consumed when any of various processes such as a plasma process are performed in the process modules PM1 to PM12. The consumable members include, for example, edge rings FR, cover rings CR, and top plates 121 of upper electrodes 12, which will be described later.

Each of the process modules PM1 to PM12 includes a processing chamber (plasma process chamber) and includes a stage disposed therein. After substrates are placed on the stages, the process modules PM1 to PM12 decompress the insides, introduce process gas, generate plasma by applying RF power, and perform a plasma process on the substrates by the plasma. The vacuum transfer modules TM1 and TM2 and the process modules PM1 to PM12 are removed from each other by openable/closable gate valves G1. Edge rings FR, cover rings CR, and the like are arranged on the stages. Upper electrodes 12 for applying RF power are disposed on upper portions facing the stages.

The load lock modules LL1 and LL2 are disposed between the vacuum transfer module TM1 and the atmospheric transfer module LM. Each of the load lock modules LL1 and LL2 includes a variable internal pressure chamber, which can be switched between a vacuum state and an atmospheric state. A stage is disposed in each of the load lock modules LL1 and LL2. When a substrate is transferred from the atmospheric transfer module LM to the vacuum transfer module TM1, the load lock modules LL1 and LL2 receive the substrate from the atmospheric transfer module LM while maintaining the insides thereof at atmospheric pressures and transfer the substrate into the vacuum transfer module TM1 while reducing the pressures in the load lock modules LL1 and LL2. When the substrate is transferred from the vacuum transfer module TM1 to the atmospheric transfer module 1M, the load lock modules LL1 and LL2 receive the substrate from the vacuum transfer module TM1 while maintaining the insides thereof in vacuum states, and transfer the substrate into the atmospheric transfer module 1M while increasing the pressures of the insides thereof to the atmospheric pressures. The load lock modules LL1 and LL2 and the vacuum transfer module TM1 are removed from each other by openable/closable gate valves G2. The load lock modules LL1 and LL2 and the atmospheric transfer module LM are removed from each other by openable/closable gate valves G3.

The atmospheric transfer module LM is disposed to face the vacuum transfer module TM1. The atmospheric transfer module LM may be, for example, an equipment front end module (EFEM). The atmospheric transfer module LM has a rectangular parallelepiped shape, includes a fan filter unit (FFU), and is an atmospheric transfer chamber maintained to have an atmosphere at atmospheric pressure. The two load lock modules LL1 and LL2 are connected to one side surface of the atmospheric transfer module 1M, the one side surface being a side surface along the longitudinal direction of the atmospheric transfer module 1M. Load ports LP1 to LP5 are connected to the other side surface of the atmospheric transfer module 1M, the other side surface being a side surfaced along the longitudinal direction. A container (not depicted) accommodating a plurality of (for example, 25) substrates is placed on the load ports LP1 to LP5. The container may be, for example, a front-opening unified pod (FOUP). A transfer robot (not depicted) configured to transfer a substrate is disposed in the atmospheric transfer module 1M. The transfer robot transfers a substrate between the inside of the FOUP and the inside of the variable internal pressure chamber of the load lock module LL1 or LL2.

The storage module SM is detachably connected to the vacuum transfer module TM2. The storage module SM includes a storage chamber and stores a consumable member. The storage module SM is connected to the vacuum transfer module TM2 when, for example, consumable members in the process modules PM1 to PM12 are replaced, and is detached from the vacuum transfer module TM2 after the replacement of the consumable members is completed. Thus, a region around the processing system PS can be effectively utilized. However, the storage module SM may be always connected to the vacuum transfer module TM2. The storage module SM has a position detection sensor for detecting the positions of consumable members stored in the storage chamber. Consumable members are transferred between the process modules PM1 to PM12 and the storage module SM by the transfer robots TR1 and TR2. The vacuum transfer module TM2 and the storage module SM are removed from each other by an openable/closable gate valve G4.

The processing system PS is provided with a controller CU. The controller CU controls each unit of the processing system, for example, the transfer robots TR1 and TR2 provided in the vacuum transfer modules TM1 and TM2, the transfer robot provided in the atmospheric transfer module 1M, and the gate valves G1 to G4. For example, the controller CU is configured to select a simultaneous transfer mode in which the transfer robots TR1 and TR2 are caused to simultaneously transfer an edge ring FR and a cover ring CR and a sole transfer mode in which the transfer robots TR1 and TR2 are caused to transfer only an edge ring FR. The simultaneous transfer mode and the sole transfer mode will be described later. In one example, the controller CU performs the sole transfer mode more frequently than the simultaneous transfer mode.

The controller CU may be, for example, a computer. The controller CU includes a central processing unit (CPU), a random access memory (RAI), a read-only memory (ROM), an auxiliary memory, and the like. The CPU operates based on a program stored in the ROM or the auxiliary memory and controls each unit of the processing system PS.

[Plasma Process Apparatus]

Figure 2:
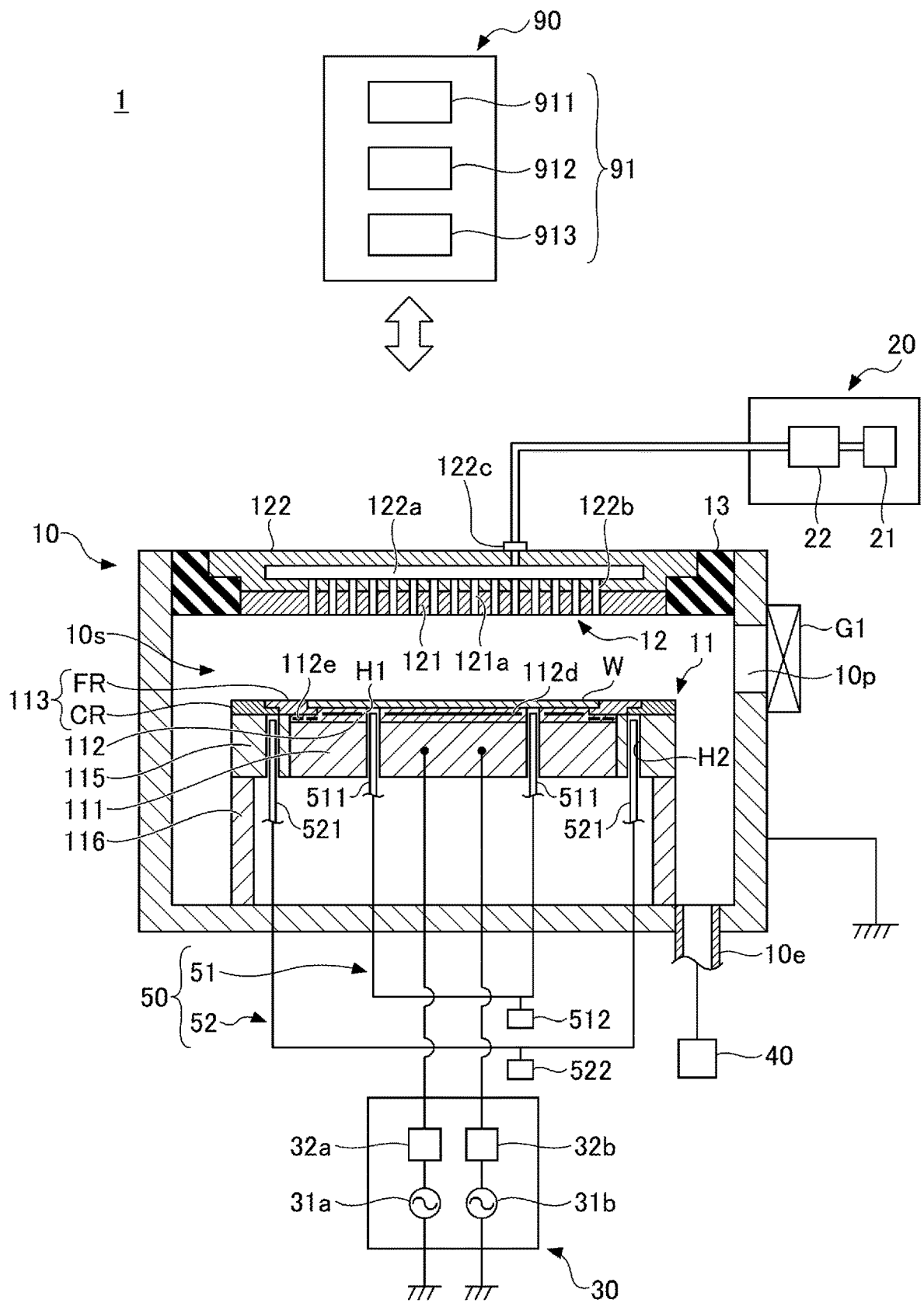
FIG. 2 is a schematic cross-sectional view depicting a process module.
Figure 3:
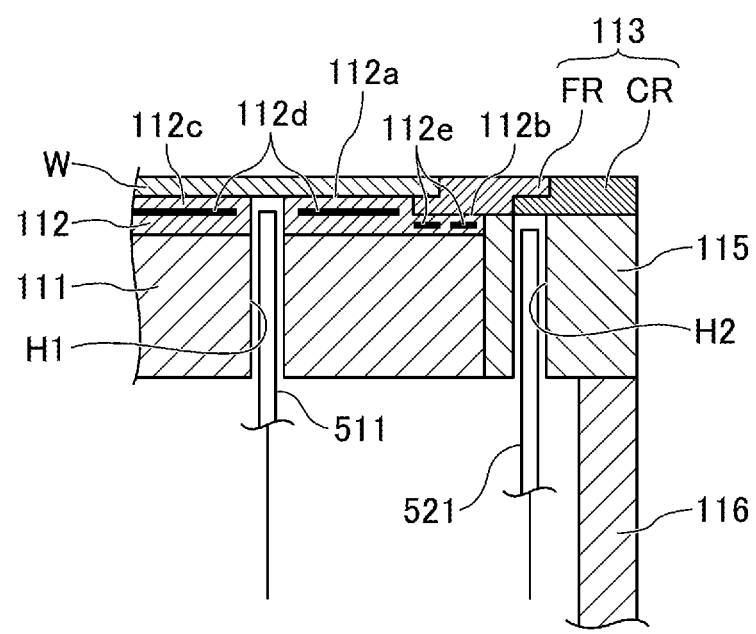
FIG. 3 is a partially magnified view of FIG. 2.

An example of plasma process apparatuses used as each of the process modules PM1 to PM12 included in the processing system PS of FIG. 1 will be described with reference to FIGS. 2 and 3.

The plasma process apparatus 1 includes a plasma process chamber 10, a gas supply 20, an RF power supply 30, an exhaust system 40, a lifter 50, and a controller 90.

The plasma process chamber 10 includes a substrate support 11 and an upper electrode 12. The substrate support 11 is disposed in a lower region of a plasma process space 10s in the plasma process chamber 10. The upper electrode 12 is disposed above the substrate support 11 and can function as a part of a top plate of the plasma process chamber 10.

The substrate support 11 supports a substrate W in the plasma process space 10s. The substrate support 11 includes a lower electrode 111, an electrostatic chuck 112, a ring assembly 113, an insulator 115, and a base 116. The electrostatic chuck 112 is disposed on the lower electrode 111.

The electrostatic chuck 112 has an upper surface including a substrate support surface 112a and a ring support surface 112b. The electrostatic chuck 112 supports a substrate W on the substrate support surface 112a. The electrostatic chuck 112 supports an edge ring FR on the ring support surface 112b. The electrostatic chuck 112 has an insulating material 112c, first attracting electrodes 112d, and second attracting electrodes 112e. The first attracting electrodes 112d and the second attracting electrodes 112e are embedded in the insulating material 112c. The first attracting electrodes 112d are located below the substrate support surface 112a. The electrostatic chuck 112 attracts and holds the substrate W on the substrate support surface 112a by applying a voltage to the first attracting electrodes 112d. The second attracting electrodes 112e are located below the ring support surface 112b. The electrostatic chuck 112 attracts and holds the edge ring FR on the ring support surface 112b by applying a voltage to the second attracting electrodes 112e. In the example of FIGS. 2 and 3, the electrostatic chuck 112 includes a monopolar electrostatic chuck that attracts and holds a substrate W and a bipolar electrostatic chuck that attracts and holds the edge ring FR. However, a bipolar electrostatic chuck may be used instead of the monopolar electrostatic chuck, and a monopolar electrostatic chuck may be used instead of the bipolar electrostatic chuck.

The ring assembly 113 includes the edge ring FR and the cover ring CR. The edge ring FR is an example of a second ring. The edge ring FR has an annular shape and is placed around a substrate W on the upper surface of a peripheral portion of the lower electrode 111. The edge ring FR improves uniformity of plasma process on the substrate W. The edge ring FR is made of a conductive material such as silicon (Si) or silicon carbide (SiC). The cover ring CR is an example of a first ring. The cover ring CR has an annular shape and is placed on an outer peripheral portion of the edge ring FR. The cover ring CR protects the upper surface of the insulator 115 from, for example, plasma. The cover ring CR is made of an insulating material such as quartz. In the example of FIG. 2, the inner peripheral portion of the cover ring CR is located inside the outer peripheral portion of the edge ring FR, and the outer peripheral portion of the edge ring FR is located outside the inner peripheral portion of the cover ring CR, so that the edge ring FR and the cover ring CR partially overlap each other. The outer peripheral portion of the edge ring FR is placed on the inner peripheral portion of the cover ring CR. As a result, when a plurality of support pins 521, to be described later, move up and down, the cover ring CR and the edge ring FR move up and down as a unit. The insulator 115 is disposed on the base 116 to surround the lower electrode 111. The base 116 is fixed to the bottom of the plasma process chamber 10 and supports the lower electrode 111 and the insulator 115.

The plasma process chamber 10 includes the upper electrode 12 and an insulating member 13. The upper electrode 12 supplies one or more types of process gases from the gas supply 20 to the plasma process space 10s. The upper electrode 12 includes a top plate 121 and a support 122. A lower surface of the top plate 121 defines the plasma process space 10s. A plurality of gas introduction ports 121a are formed in the top plate 121. Each of the plurality of gas introduction ports 121a penetrates the top plate 121 in the plate thickness direction (vertical direction). The support 122 detachably supports the top plate 121. A gas diffusion chamber 122a is provided inside the support 122. A plurality of gas introduction ports 122b extend downward from the gas diffusion chamber 122a. The plurality of gas introduction ports 122b communicate with the plurality of gas introduction ports 121a, respectively. A gas supply port 122c is formed in the support 122. The upper electrode 12 supplies one or more process gases from the gas supply port 122c to the plasma process space 10s via the gas diffusion chamber 122a, the plurality of gas introduction ports 122b and the plurality of gas introduction ports 121a.

A transfer exit port 10p is formed in a sidewall of the plasma process chamber 10. A substrate W is transferred between the plasma process space 10s and the outside of the plasma process chamber 10 through the transfer exit port 10p. The transfer exit port 10p is opened and closed by the gate valve G1.

The gas supply 20 includes one or more gas sources 21 and one or more flow rate controllers 22. The gas supply 20 supplies one or more types of process gases from each of the gas sources 21 to the gas supply port 122c via the corresponding flow rate controller 22. The flow rate controllers 22 may include, for example, mass flow controllers or pressure control type flow rate controllers. The gas supply 20 may include one or more flow modulation devices to modulate or pulse the flows of the one or more process gases.

The RF power supply 30 includes two RF power sources (a first RF power source 31a and a second RF power source 31b) and two matching devices (a first matching device 32a and a second matching device 32b). The first RF power source 31a supplies first RF power to the lower electrode 111 via the first matching device 32a. The frequency of the first RF power may be, for example, in a range between 13 MHz and 150 MHz. The second RF power source 31b supplies second RF power to the lower electrode 111 via the second matching device 32b. The frequency of the second RF power may be, for example, in a range between 400 kHz and 13.56 MHz. Instead of the second RF power source 31b, a DC power source may be used.

The exhaust system 40 may be connected to a gas exhaust port 10e provided, for example, at the bottom of the plasma process chamber 10. The exhaust system 40 may include a pressure regulating valve and a vacuum pump. The internal pressure of the plasma process space 10s is controlled by the pressure control valve. The vacuum pump may include a turbo-molecular pump, a dry pump, or a combination thereof.

The lifter 50 raises and lowers a substrate W, the edge ring FR, and the cover ring CR. The lifter 50 includes a first lifter 51 and a second lifter 52.

The first lifter 51 includes a plurality of support pins 511 and an actuator 512. The plurality of support pins 511 are inserted into through-holes H1 formed in the lower electrode 111 and the electrostatic chuck 112 so as to protrude into and retract from the upper surface of the electrostatic chuck 112. The plurality of support pins 511 protrude from the upper surface of the electrostatic chuck 112 so as to support the substrate W with the upper ends thereof in contact with the lower surface of the substrate W. The actuator 512 raises and lowers the plurality of support pins 511. As the actuator 512, for example, a motor such as a DC motor, a stepper motor, or a linear motor, an air driving mechanism such as an air cylinder, or a piezoelectric actuator can be used. For example, when a substrate W is transferred between the transfer robots TR1 and TR2 and the substrate support 11, the first lifter 51 raises and lowers the plurality of support pins 511.

The second lifter 52 includes a plurality of support pins 521 and an actuator 522. The plurality of support pins 521 are inserted into through-holes H2 formed in the insulator 115 so as to protrude into and retreat from the upper surface of the insulator 115. The plurality of support pins 521 protrude from the upper surface of the insulator 115 and support the cover ring CR by bringing the upper ends thereof into contact with the lower surface of the cover ring CR. The actuator 522 raises and lowers the plurality of support pins 521. As the actuator 522, for example, an actuator similar to the actuator 512 can be used. When the edge ring FR and the cover ring CR are transferred between the transfer robots TR1 and TR2 and the substrate support 11, the second lifter 52 raises and lowers the plurality of support pins 521. In the example of FIG. 2, the outer peripheral portion of the edge ring FR is placed on the inner peripheral portion of the cover ring CR. Thus, when the actuator 522 raises and lowers the plurality of support pins 521, the cover ring CR and the edge ring FR move up and down as a unit accordingly.

The controller 90 controls each unit of the plasma process apparatus 1. The controller 90 includes, for example, a computer 91. The computer 91 includes, for example, a CPU 911, a memory 912, and a communication interface 913. The CPU 911 may be configured to perform various control operations based on programs stored in the memory 912. The memory 912 includes at least one memory type selected from a group consisting of auxiliary memories such as a RAM, a ROM, a hard disk drive (HDD), and a solid state drive (SSD). The communication interface 913 may communicate with the plasma process apparatus 1 via a communication line such as a local area network (LAN). The controller 90 may be provided separately from the controller CU, or may be included in the controller CU.

[Storage Module]

Figure 4:
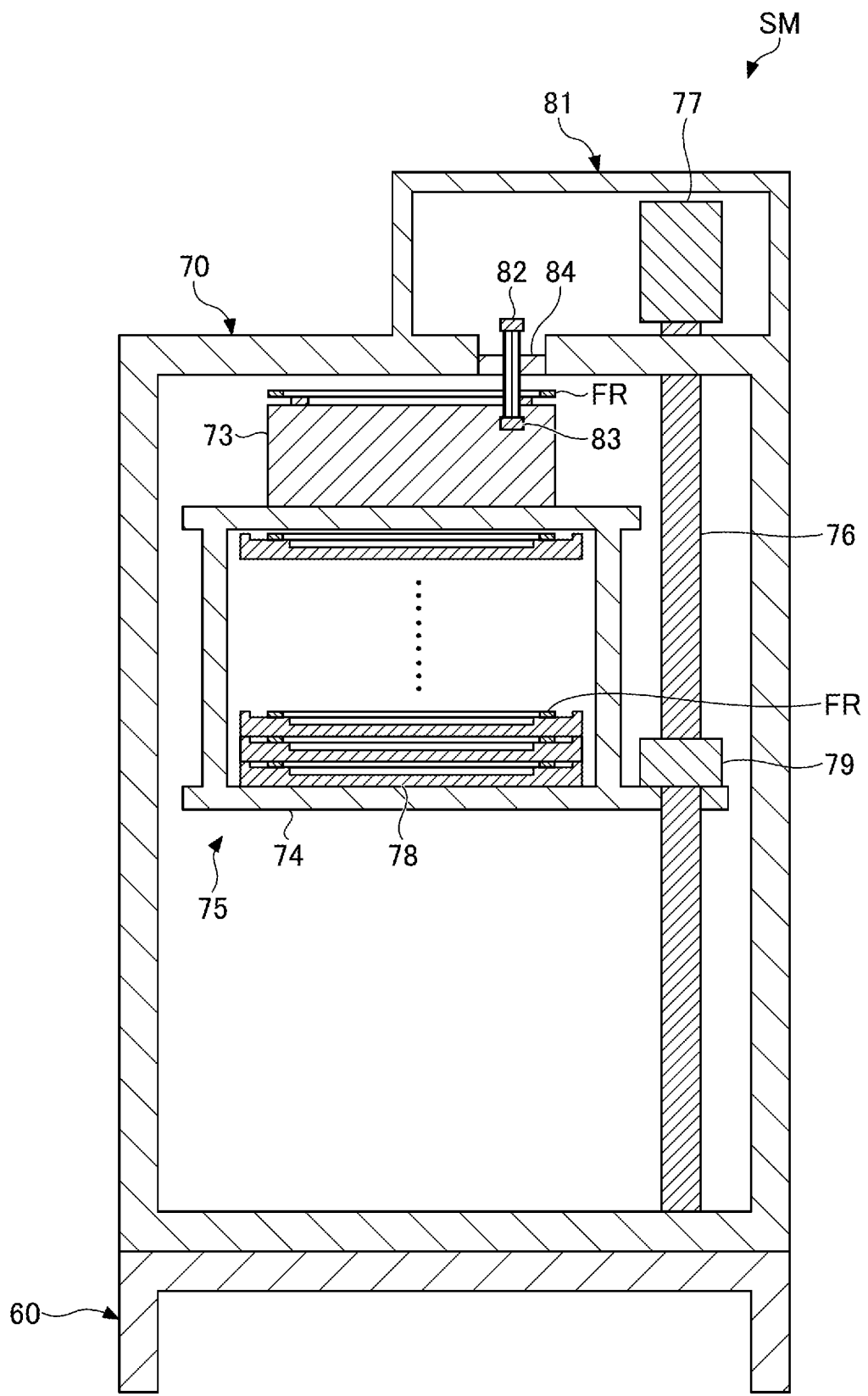
FIG. 4 is a front cross-sectional view depicting an example of a storage module.
Figure 5:
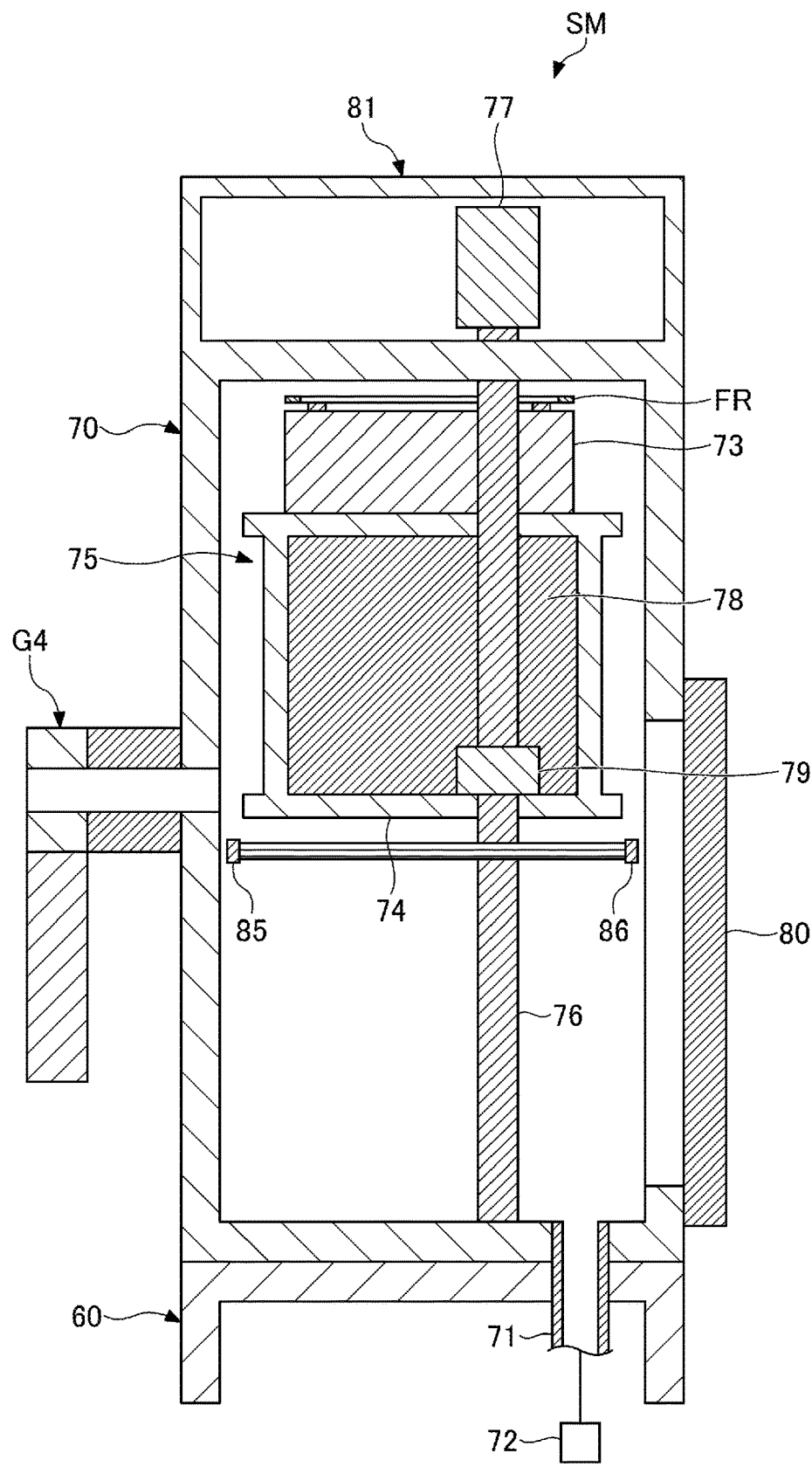
FIG. 5 is a side sectional view depicting the example of the storage module.

An example of the storage module SM included in the processing system PS of FIG. 1 will now be described with reference to FIGS. 4 and 5.

In the storage module SM, a chamber 70 is installed on a frame 60, and a machine compartment 81 is provided at an upper portion of the chamber 70. The inside of the chamber 70 can be reduced in pressure by an exhauster 72 connected to an exhaust port 71 provided at the bottom of the chamber 70. In addition, for example, a $N_2$ gas is supplied to the chamber 70 as a purge gas. Thereby the pressure in the chamber 70 can be adjusted. The machine compartment 81 has an atmosphere, for example, at atmospheric pressure.

In the chamber 70, a storage 75 including a stage 73 and a basket 74 provided below the stage 73 is installed. The storage 75 can be raised and lowered by a ball screw 76. A line sensor 82 for detecting the position, direction, and the like of a consumable member and a motor 77 for driving the ball screw 76 are installed in the machine compartment 81. A window 84 made of quartz or the like is provided between the chamber 70 and the machine compartment 81 so that the line sensor 82 can receive light from a light emitter 83 described later.

A consumable member is placed on the stage 73. The stage 73 has the light emitter 83 facing the line sensor 82. The stage 73 is rotatable in the θ direction and rotates the placed consumable member, for example, an edge ring FR in a given direction. That is, the stage 73 performs alignment of the edge ring FR. In the alignment, the orientation flat (OF) of the edge ring FR is aligned in a given direction. Further, in the alignment, the center position of the edge ring FR may be aligned.

The line sensor 82 detects the amount of light emitted from the light emitter 83 and indicates the detected amount of light to the controller CU. The controller CU detects the orientation flat of the edge ring FR by using the fact that the detected light amount changes depending on presence or absence of the orientation flat of the edge ring FR. The controller CU detects the orientation of the edge ring FR based on the detected orientation flat. The line sensor 82 is, for example, a line sensor such as a charge coupled device (CCD) or a complementary metal oxide semiconductor (CMOS).

The basket 74 is provided below the stage 73. A cassette 78 is placed inside the basket 74. The cassette 78 is a storage container that can be taken out from the basket 74. The cassette 78 stores a plurality of consumable members with intervals therebetween in the vertical direction. In the example of FIG. 4, a plurality of edge rings FR are stored in the cassette 78. The cassette 78 is open to the front side of the storage module SM. Details of the cassette 78 will be described later.

In addition to the stage 73 and the basket 74, the storage 75 has a guide 79 supported by the ball screw 76 on a side surface thereof. The ball screw 76 connects the upper surface and the lower surface of the chamber 70, penetrates the upper surface of the chamber 70, and is connected to the motor 77 in the machine compartment 81. The penetration in the upper surface of the chamber 70 is sealed in such a manner that the ball screw 76 can rotate. The ball screw 76 is rotated by the motor 77 to move the storage 75 in the up-down direction (Z-axis direction).

The storage module SM is detachably connected to the vacuum transfer module TM2 via the gate valve G4. An upper fork FK21 and a lower fork FK22 of the transfer robot TR2 of the vacuum transfer module TM2 can be inserted into the chamber 70 via the gate valve G4. For example, the upper fork FK21 and the lower fork FK22 transfer an edge ring FR into the cassette 78, transfer an edge ring FR placed in the cassette 78 out from the cassette 78, place an edge ring FR on the stage 73, and acquire an edge ring FR placed on the stage 73, for example. A door 80 is opened and closed, for example, when the cassette 78 is taken out from the chamber 70 or when the cassette 78 is set in the chamber 70.

A light emitter 85 and a sheet quantity sensor 86 detect the number of edge rings FR placed in the cassette 78 when the storage 75 moves the cassette 78 from on or near the bottom of the chamber 70 to an upper position such as a position facing the gate valve G4. The light emitter 85 is, for example, a light emitting diode (LED), a semiconductor laser, or the like. The sheet quantity sensor 86 detects the amount of light emitted from the light emitter 85 and outputs the detected amount of light to the controller CU. The controller CU detects the number of edge rings FR by measuring the number of times the light emitted from the light emitter 85 is blocked by the edge rings FR based on the detected amounts of light. The sheet quantity sensor 86 is, for example, a photodiode, a phototransistor, or the like. Further, the sheet quantity sensor 86 may be a line sensor such as a CCD or a CMOS.

In the above example, the case where the controller CU calculates the position information of edge rings FR based on the light amount detected by the line sensor 82 in the storage module SM has been described, but an embodiment is not limited thereto. For example, a position detection sensor including an inner periphery sensor that detects the position of the inner periphery of an edge ring FR and an outer periphery sensor that detects the position of the outer periphery of the edge ring FR may be used. In this case, the controller CU calculates the position information of the edge ring FR based on the position of the inner periphery of the edge ring FR detected by the inner periphery sensor and the position of the outer periphery of the edge ring FR detected by the outer periphery sensor. Further, for example, another optical sensor or a camera may be used instead of the line sensor 82. In this case, the controller CU calculates the position information of an edge ring FR based on the image captured by the camera by using, for example, an image processing technique.

[Transfer Robot]

The upper fork FK21 of the transfer robot TR2 will now be described with reference to FIGS. 6 to 9. The lower fork FK22 of the transfer robot TR2 may have the same configuration as the upper fork FK21. The upper fork FK11 and the lower fork FK12 of the transfer robot TR1 may have the same configurations as those of the upper fork FK21 of the transfer robot TR2.

Figure 6:
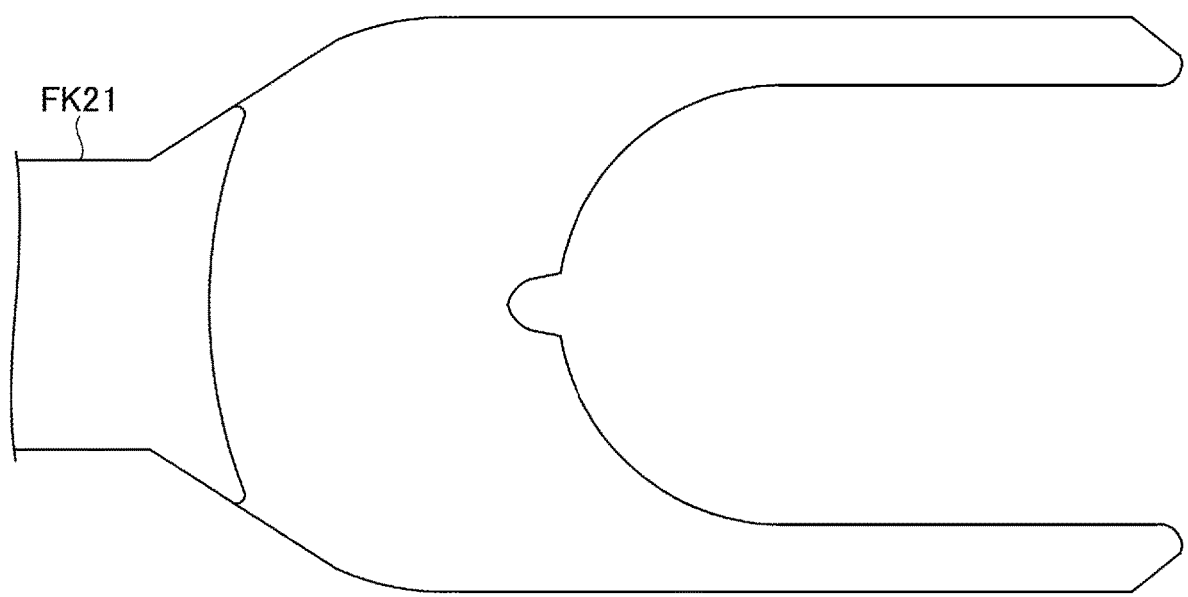
FIG. 6 is a schematic plan view depicting an upper fork not holding a transfer object.

FIG. 6 is a schematic plan view depicting the upper fork FK21 not holding a transfer object. As depicted in FIG. 6, the upper fork FK21 has a substantially U-shape in plan view. The upper fork FK21 is configured to be able to hold, for example, a substrate W, a transfer jig CJ, an edge ring FR, a cover ring CR, a first assembly A1, and a second assembly A2.

The transfer jig CJ is a jig that supports an edge ring FR from below, and can be used when replacing only the edge ring FR. The transfer jig CJ is configured to be able to support only an edge ring FR without supporting a cover ring CR. For example, the transfer jig CJ is a plate-like member including a portion longer than the inner diameter of an edge ring FR and shorter than the inner diameter of a cover ring CR. Specifically, the transfer jig CJ is a substantially rectangular plate-like member having a diagonal line longer than the inner diameter of an edge ring FR and shorter than the inner diameter of a cover ring in plan view. Further, the transfer jig CJ may be a disk-shaped member having a diameter longer than the inner diameter of an edge ring FR and shorter than the inner diameter of a cover ring CR.

The first assembly A1 is an assembly in which an edge ring FR and a cover ring CR are integrated by placing the edge ring FR on the cover ring CR.

The second assembly A2 is an assembly in which the transfer jig CJ and an edge ring FR are integrated by placing the edge ring FR on the transfer jig CJ.

Figure 7:
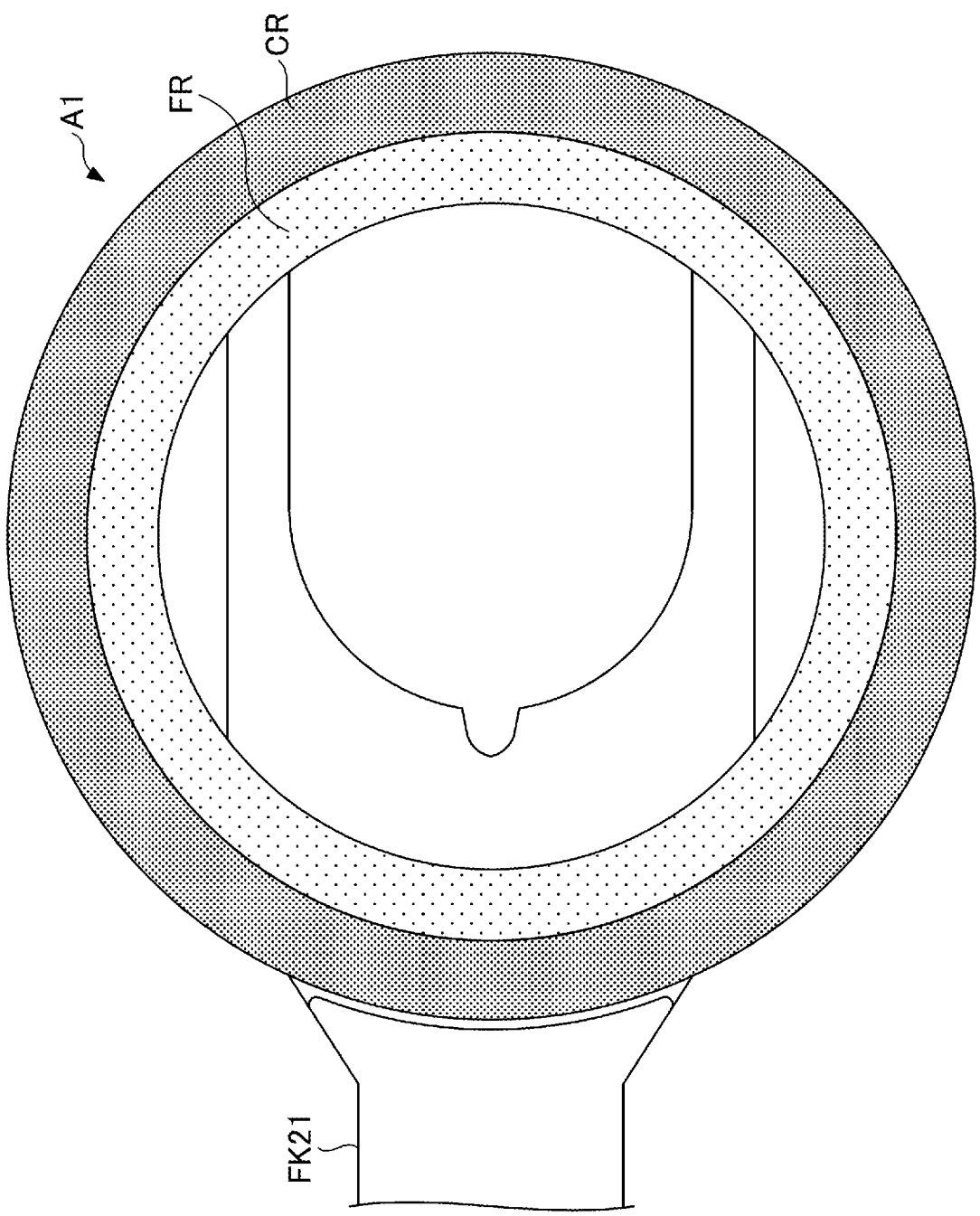
FIG. 7 is a schematic plan view depicting the upper fork holding a first assembly.

FIG. 7 is a schematic plan view depicting the upper fork FK21 holding the first assembly A1 (an edge ring FR and a cover ring CR). As depicted in FIG. 7, the upper fork FK21 is configured to be able to hold the first assembly A1. As a result, the transfer robot TR2 can simultaneously transfer the edge ring FR and the cover ring CR.

Figure 8:
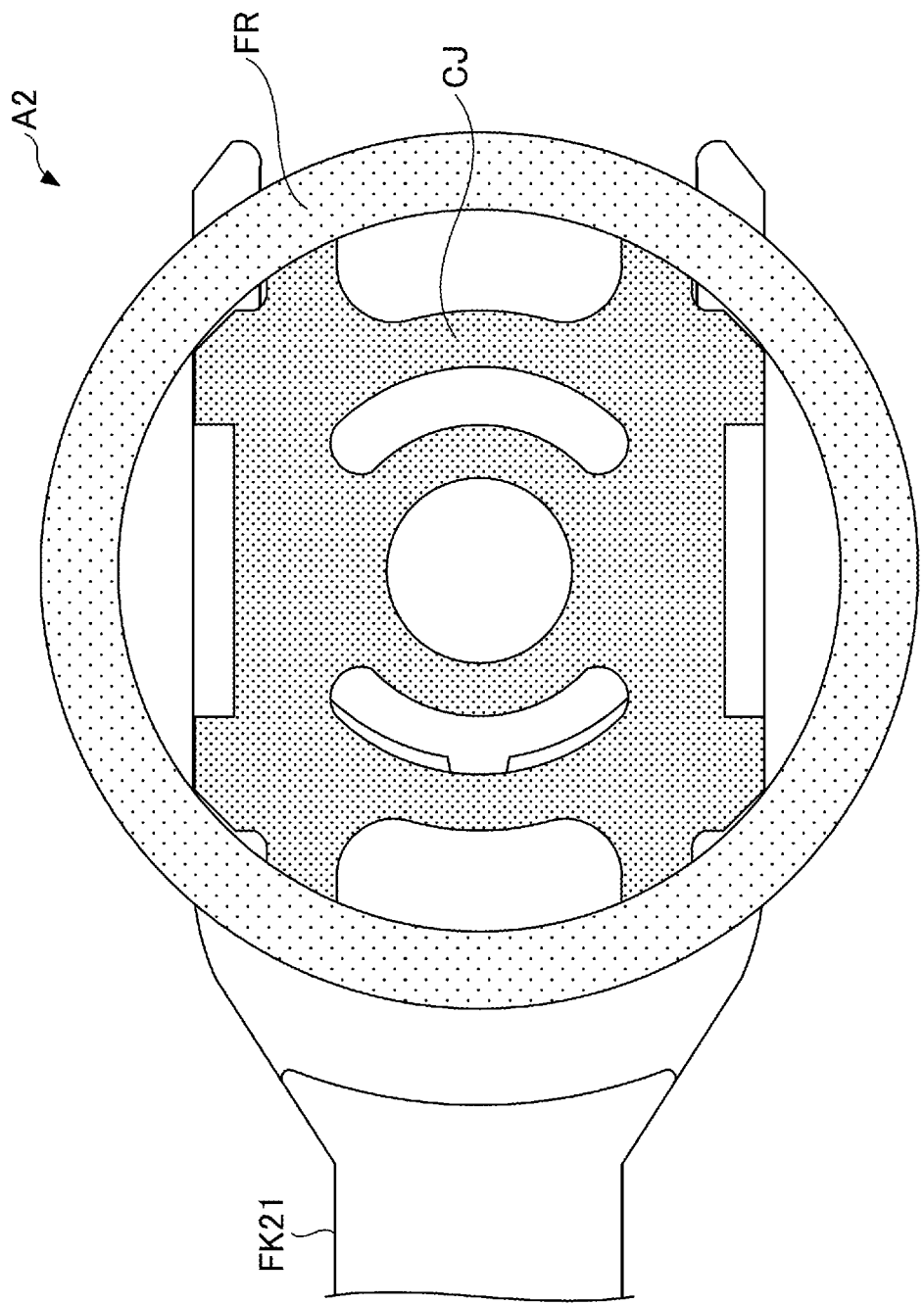
FIG. 8 is a schematic plan view depicting the upper fork holding a second assembly.

FIG. 8 is a schematic plan view depicting the upper fork FK21 holding the second assembly A2 (the transfer jig CJ and an edge ring FR). As depicted in FIG. 8, the upper fork FK21 is configured to be able to hold the second assembly A2. Thus, the transfer robot TR2 can simultaneously transfer the transfer jig CJ and the edge ring FR together.

Figure 9:
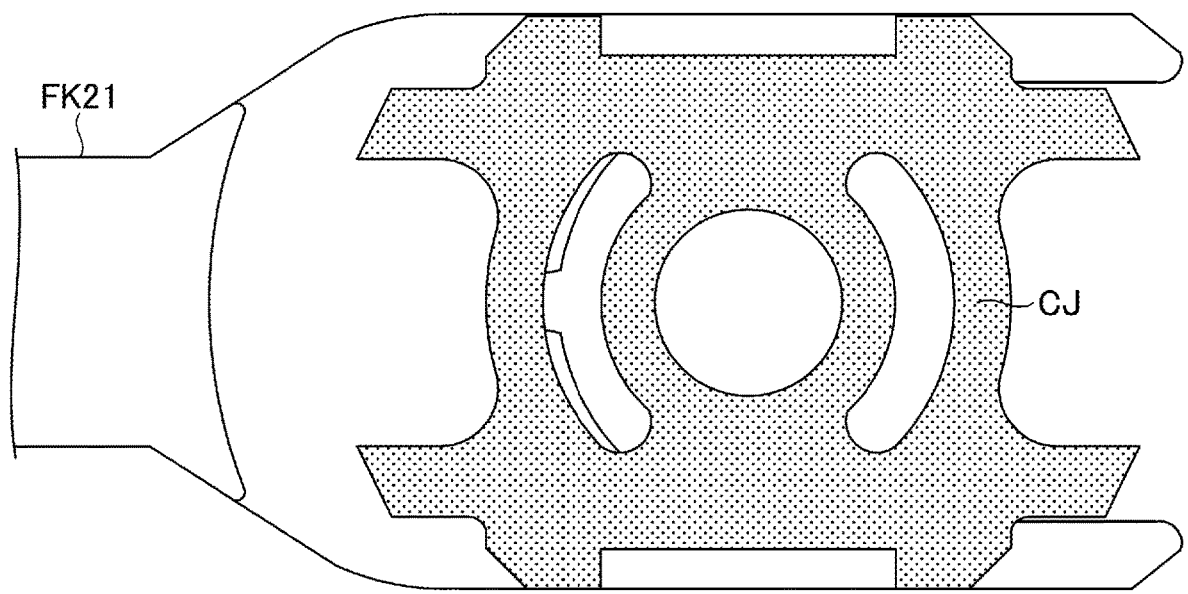
FIG. 9 is a schematic plan view depicting the upper fork holding only a transfer jig.

FIG. 9 is a schematic plan view depicting the upper fork FK21 in a state where only the transfer jig CJ is held. As depicted in FIG. 9, the upper fork FK21 is configured to be able to hold the transfer jig CJ that does not support an edge ring FR. Thus, the transfer robot TR2 can transfer the transfer jig CJ alone.

[Cassette]

Figure 10:
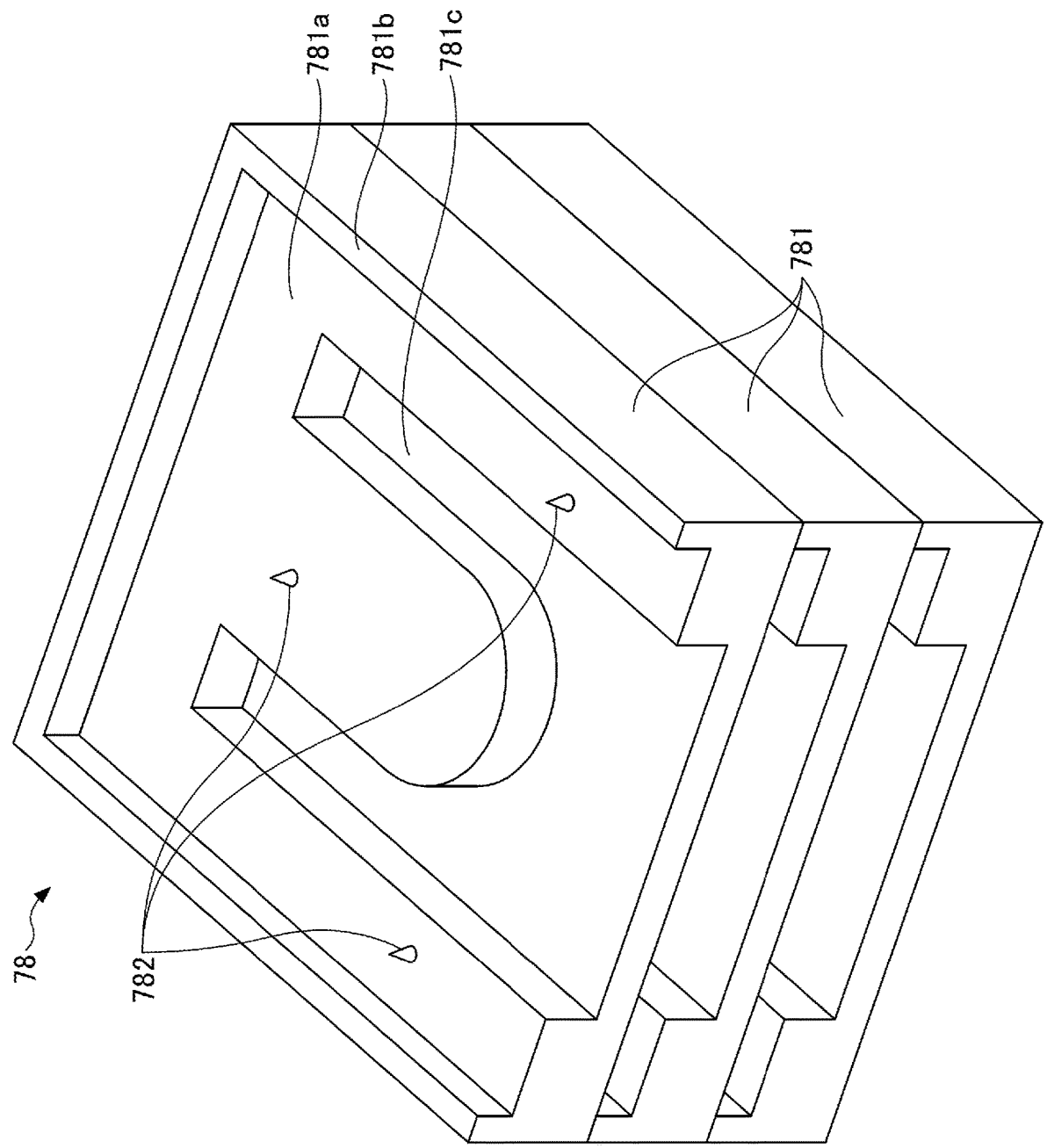
FIG. 10 is a schematic perspective view depicting an example of a cassette in the storage module.

With further reference to FIG. 10, the cassette 78 that stores edge rings FR will be described as an example of the cassette 78 included in the storage module SM. FIG. 10 is a schematic perspective view depicting an example of the cassette 78 in the storage module SM. FIG. depicts cassette 78 in a state where edge rings FR are not stored.

The cassette 78 stores edge rings FR. The cassette 78 includes a plurality of base plates 781 and a plurality of guide pins 782.

The plurality of base plates 781 are provided in multiple stages in the vertical direction. Edge rings FR are placed on the plurality of base plates 781. Each base plate 781 has a substantially rectangular plate shape. Each base plate 781 is made of, for example, resin or metal. Each base plate 781 includes a placement surface 781*a*, an outer frame 781*b*, and a fork insertion groove 781*c*.

Edge rings FR are placed on the placement surfaces 781*a*.

Each of the outer frames 781*b* (forming recesses therein) protrudes upward from the corresponding placement surface 781*a* at outer peripheries of three sides from among the four sides of the placement surface 781*a* except the remaining one side in the front direction, through which the upper fork FK21 and the lower fork FK22 are inserted. Another base plate 781 is placed on the outer frame 781*b*.

The fork insertion grooves 781*c* are formed in the placement surfaces 781*a*. The fork insertion grooves 781*c* are recessed with respect to the placement surfaces 781*a* and have substantially U-shapes in plan view. The upper fork FK21 or the lower fork FK22 of the transfer robot TR2 is inserted into a fork insertion groove 781*c*. In one example, when an edge ring FR positioned on a placement surface 781*a* is to be taken out from the cassette 78, the upper fork FK21 or the lower fork FK22 of the transfer robot TR2 is inserted into the corresponding fork insertion groove 781*c*.

The plurality of guide pins 782 are provided on each of the placement surfaces 781*a*. Each guide pin 782 may have a conical shape with a tapered tip. When an edge ring FR is placed on the placement surface 781*a*, the plurality of guide pins 782 come into contact with the outer peripheral portion of the edge ring FR to guide the edge ring FR so that the edge ring FR is placed at a given position on the placement surface 781*a*. Each of the guide pins 782 may be made of resin, metal, or the like. If resin is used, it is possible to suppress generation of particles that may be generated due to friction when the resin comes into contact with the outer peripheral portion of an edge ring FR.

Although the cassette 78 to store edge rings FR is illustrated in FIG. 10, for example, cassettes 78 that store the transfer jig CJ, cover rings CR, the first assembly A1, and the second assembly A2 may have the same configurations except for the plurality of guide pins 782.

For example, in a cassette 78 to store cover rings CR, a plurality of guide pins 782 are provided at positions to be in contact with the inner peripheral portion of a cover ring CR. As a result, the cover ring CR is guided and placed at a given position on a corresponding placement surface 781*a*.

Further, for example, in a cassette 78 that stores edge rings FR and cover rings CR, a plurality of guide pins 782 are provided at positions that come into contact with the outer peripheral portion of an edge ring FR and the inner peripheral portion of a cover ring CR that are placed on a corresponding placement surface 781*a*. As a result, the edge ring FR and the cover ring CR are guided and placed at given positions on the placement surface 781*a*.

Figure 11A:
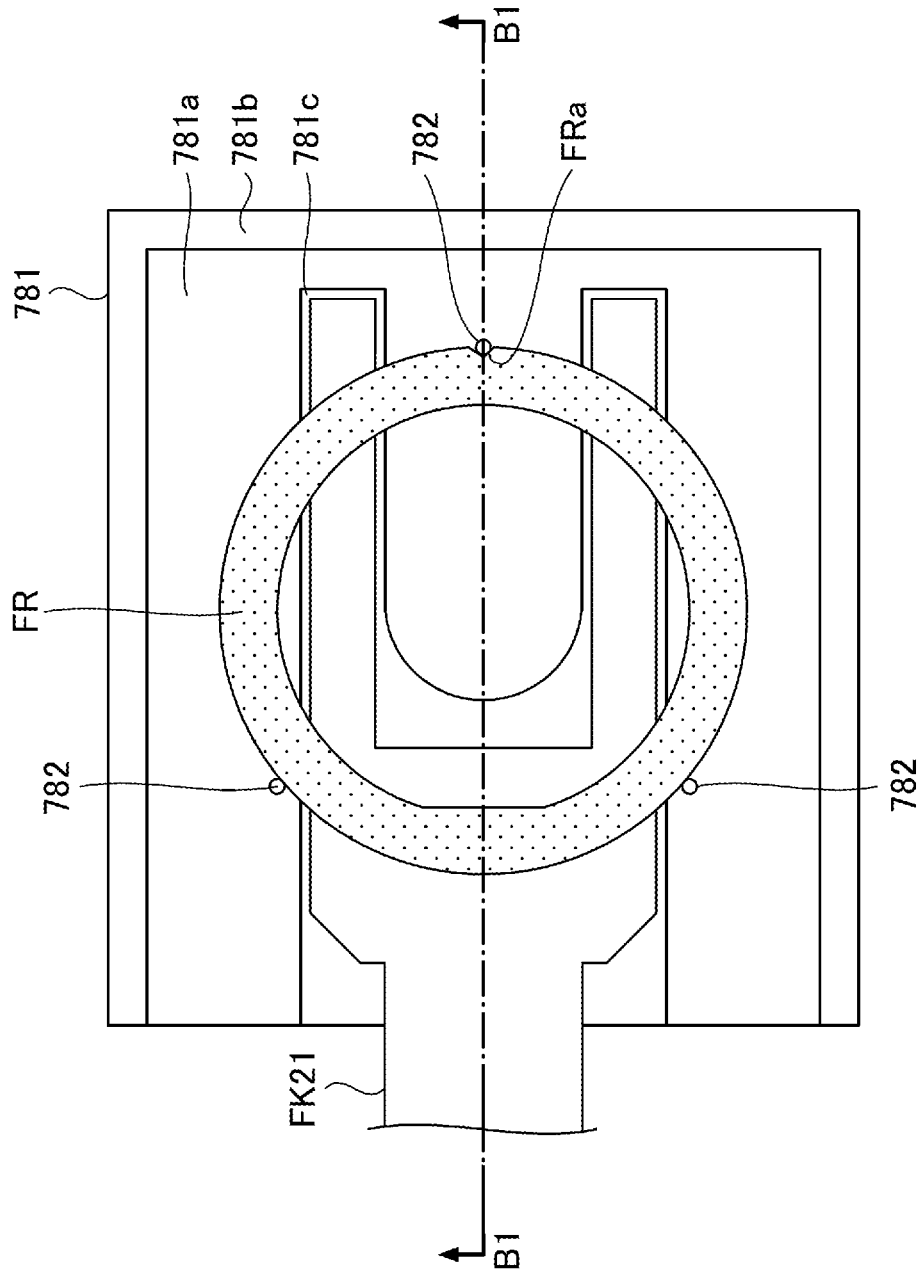
FIGS. 11A-11C are diagrams depicting an example of an edge ring positioning mechanism.
Figure 11B:
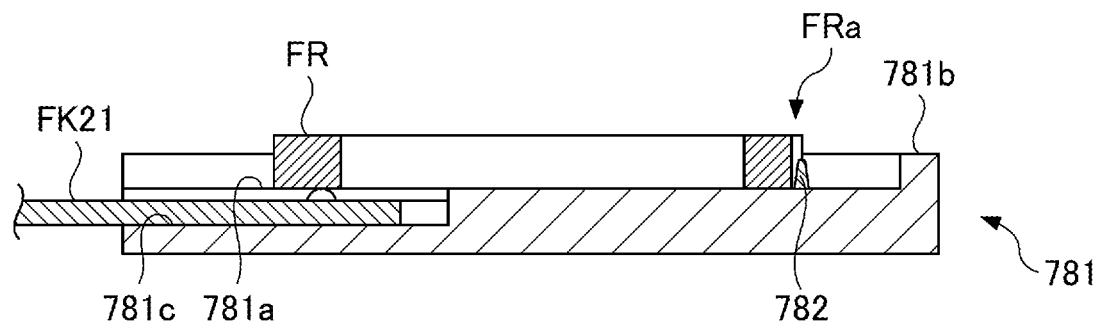
Figure 11C:
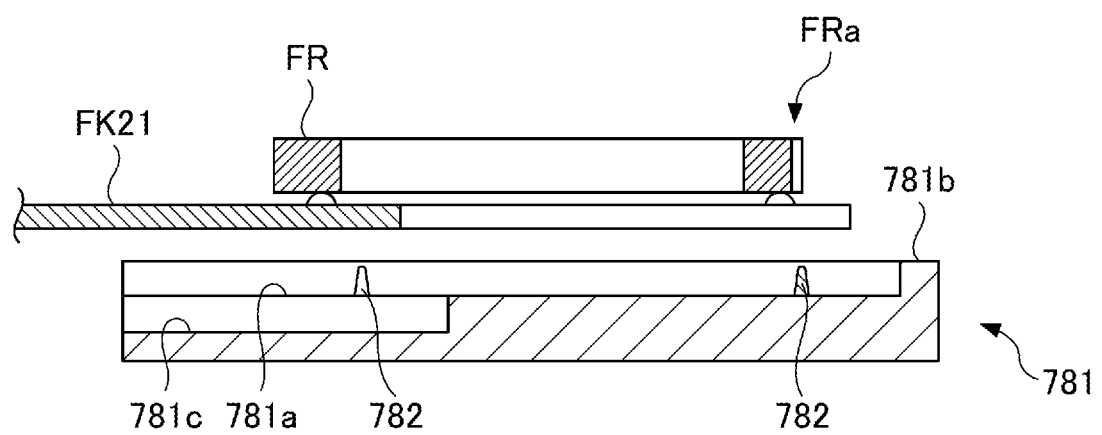

An example of a positioning mechanism for an edge ring FR will now be described with reference to FIGS. 11A to 11C. FIGS. 11A to 11C are views illustrating an example of a positioning mechanism for an edge ring FR. FIG. 11A is a plan view when the upper fork FK21 is inserted below an edge ring FR placed on a base plate 781. FIG. 11B depicts a cross-sectional view taken along a chain line B1-B1 in FIG. 11A. FIG. 11C is a cross-sectional view when the edge ring FR placed on the base plate 781 is raised by the upper fork FK21.

As depicted in FIGS. 11A and 11B, the edge ring FR has a cutout FRa in its outer periphery. The cutout ERa has, for example, a V-shape in plan view. The opening angle of the V-shape may be set as appropriate, and may be 90 degrees, for example. The cutout FRa may have a curved shape such as a U-shape in plan view.

First, as depicted in FIGS. 11A and 11B, the upper fork FK21 is inserted below the edge ring FR placed on the base plate 781.

Subsequently, as depicted in FIG. 11C, the upper fork FK21 is raised. Thus, the upper fork FK21 holds the edge ring FR stored in the cassette 78 in a state where the edge ring FR has been positioned on the base plate 781 and transfers the edge ring FR to any one of the process modules PM1 to PM12.

Thus, the upper fork FK21 holds the edge ring FR stored in the cassette 78 in a state where the edge ring FR has been positioned on the base plate 781 and transfers the edge ring FR to any one of the process modules PM1 to PM12. Therefore, without providing a special apparatus such as an aligner for positioning an edge ring FR, the edge ring FR can be transferred to any one of the process modules PM1 to PM12 in a state where the edge ring FR has been precisely positioned. As a result, it is possible to reduce downtime otherwise caused by transferring the edge ring FR to the aligner. In addition, the cost for introducing the special apparatus can be reduced. Further, space efficiency is improved. However, an aligner may be specially provided, and an edge ring FR may be more precisely aligned by the aligner and transferred.

Note that, in the example of FIGS. 11A to 11C, the case where an edge ring FR has one cutout FRa in the outer periphery is illustrated, but the number of cutouts FRa is not limited thereto. For example, an edge ring FR may have a plurality of cutouts FRa spaced apart from each other in the circumferential direction in the outer periphery. In this case, it is preferable to provide a guide pin 782 corresponding to each of the plurality of cutouts FRa. Thereby, the angular error can be reduced.

Further, in the example of FIGS. 11A to 11C, the case where the upper fork FK21 is used is illustrated, but the lower fork FK22 may be used instead.

Figure 12B:
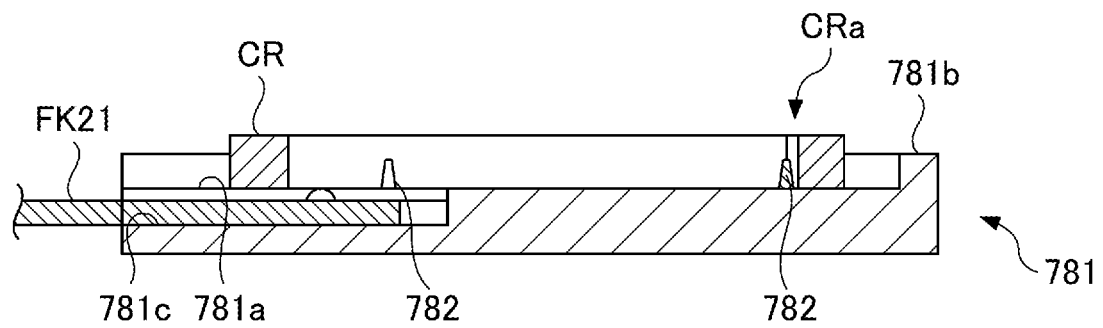
Figure 12C:
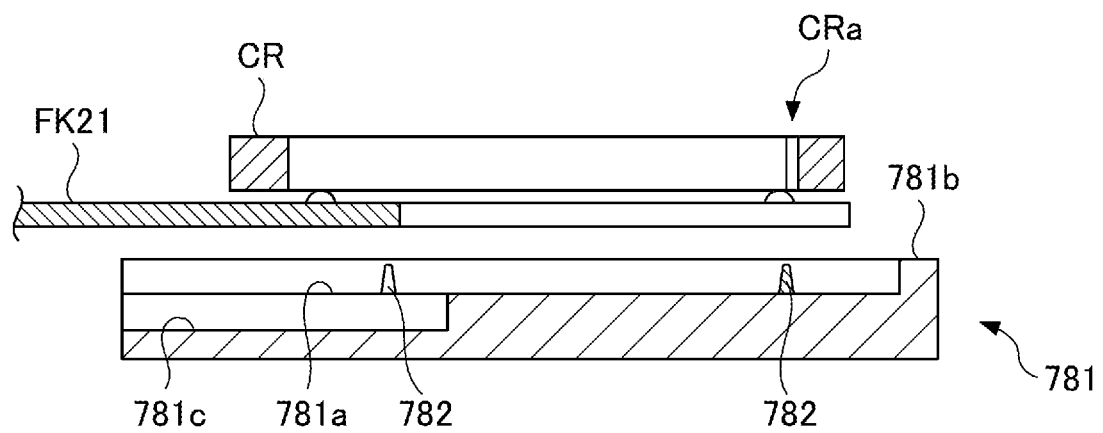

An example of a positioning mechanism for a cover ring CR will now be described with reference to FIGS. 12A to 12C. FIGS. 12A to 12C are views illustrating an example of a positioning mechanism for a cover ring CR. FIG. 12A is a plan view when the upper fork FK21 is inserted below a cover ring CR placed on the base plate 781. FIG. 12B depicts a cross-sectional view taken along a chain line B2-B2 in FIG. 12A. FIG. 12C is a cross-sectional view when the cover ring CR placed on the base plate 781 is raised by the upper fork FK21.

As depicted in FIGS. 12A and 12B, the cover ring CR has a cutout CRa in its inner periphery. The cutout CRa has, for example, a V-shape in plan view. The opening angle of the V-shape may be set as appropriate, and may be 90 degrees, for example. The cutout CRa may have, for example, a curved shape such as a U-shape in plan view.

First, as depicted in FIGS. 12A and 12B, the upper fork FK21 is inserted below the cover ring CR placed on the base plate 781.

Subsequently, as depicted in FIG. 12C, the upper fork FK21 is raised. Thus, the upper fork FK21 holds the cover ring CR stored in the cassette 78 in a state where the cover ring CR has been positioned on the base plate 781, and transfers the cover ring CR to any one of the process modules PM1 to PM12.

Thus, the upper fork FK21 holds the cover ring CR stored in the cassette 78 in a state where the cover ring CR has been positioned on the base plate 781, and transfers the cover ring CR to any one of the process modules PM1 to PM12. Thus, the cover ring CR can be transferred to any one of the process modules PM1 to PM12 in a precisely positioned state without providing a special apparatus such as an aligner for positioning the cover ring CR. As a result, it is possible to reduce downtime otherwise caused by transferring the cover ring CR to the aligner. In addition, the cost for introducing the special apparatus can be reduced. Further, space efficiency is improved. However, the aligner may be specially provided so that the aligner aligns the cover ring CR more precisely and transfers the cover ring CR.

In the example of FIGS. 12A to 12C, a cover ring CR has one cutout CRa in the inner periphery, but the number of the cutouts CRa is not limited thereto. For example, a cover ring CR may have a plurality of cutouts CRa spaced apart from each other in the circumferential direction in its inner periphery. In this case, it is preferable to provide a guide pin 782 corresponding to each of the plurality of cutouts CRa. Thus, the angular error can be reduced.

Further, in the example of FIGS. 12A to 12C, the case where the upper fork FK21 is used is illustrated, but the lower fork FK22 may be used instead.

Figure 13B:
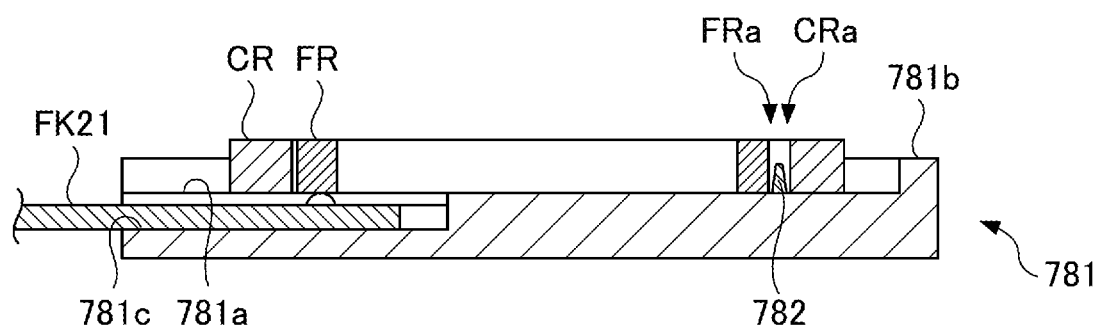
Figure 13C:
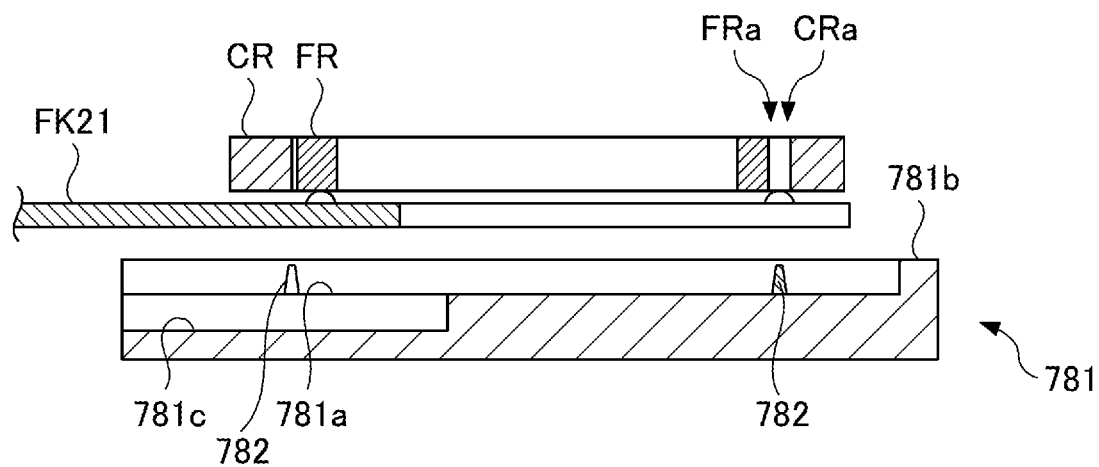

A positioning mechanism for an edge ring FR and a cover ring CR will now be described with reference to FIGS. 13A to 13C. FIGS. 13A to 13C are diagrams illustrating an example of a positioning mechanism for an edge ring FR and a cover ring CR. FIG. 13A is a plan view when the upper fork FK21 is inserted below an edge ring FR and a cover ring CR placed on the base plate 781. FIG. 13B depicts a cross-sectional view taken along a chain line B3-B3 in FIG. 13A. FIG. 13C is a cross-sectional view when the edge ring FR and the cover ring CR placed on the base plate 781 are raised by the upper fork FK21.

Figure 29:
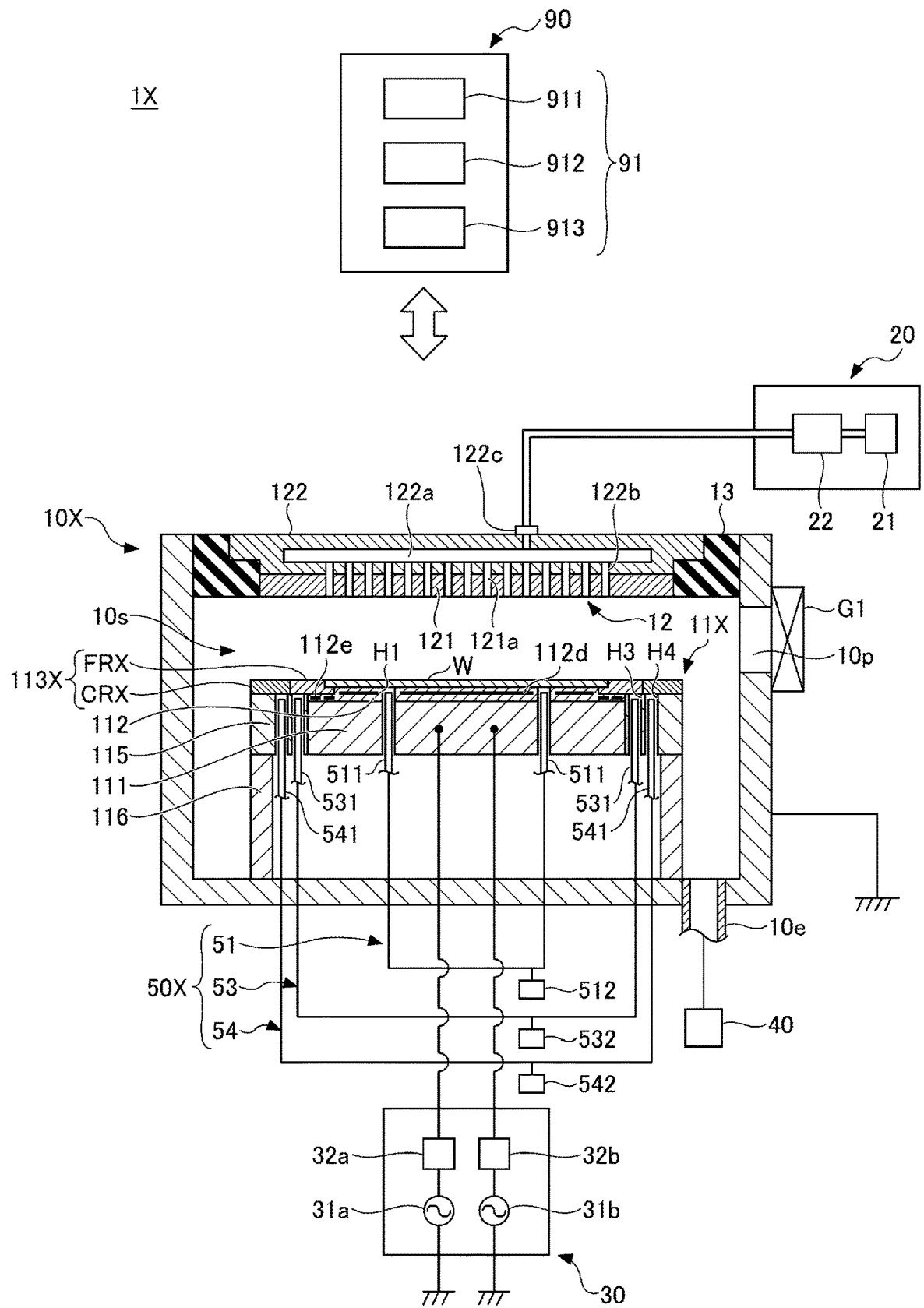
FIG. 29 is a schematic cross-sectional view depicting a process module according to a first variant of the embodiment.

For example, the positioning mechanism depicted in FIGS. 13A and 13B can be used in a case where the inner periphery of a cover ring CR is larger than the outer periphery of an edge ring FR or the inner periphery of the cover ring CR is equal to the outer periphery of the edge ring FR in each of the process modules PM1 to PM12 that is a plasma process apparatus depicted in FIG. 29 to be described later.

As depicted in FIGS. 13A and 13B, the edge ring FR has a cutout FRa in its outer periphery, and the cover ring CR has a cutout CRa in its inner periphery. Each of the cutouts FRa and CRa has, for example, a V-shape in plan view. The opening angle of the V-shape may be 90 degrees, for example. Each of the cutouts FRa and CRa may have, for example, a curved shape such as a U-shape in plan view.

First, as depicted in FIGS. 13A and 13B, the upper fork FK21 is inserted below the edge ring FR and the cover ring CR placed on the base plate 781.

Subsequently, as depicted in FIG. 13C, the upper fork FK21 is raised. Thus, the upper fork FK21 holds the edge ring FR and the cover ring CR stored in the cassette 78 in a state where the edge ring FR and the cover ring CR have been positioned on the base plate 781, and transfers the edge ring FR and the cover ring CR to any one of the process modules PM1 to PM12.

Thus, the upper fork FK21 holds the edge ring FR and the cover ring CR stored in the cassette 78 in a state where the edge ring FR and the cover ring CR have been positioned on the base plate 781, and transfers the edge ring FR and the cover ring CR to any one of the process modules PM1 to PM12. Thus, it is possible to transfer the edge ring FR and the cover ring CR to any one of the process modules PM1 to PM12 in a state where the edge ring FR and the cover ring CR have been precisely positioned without providing a special apparatus such as an aligner for positioning the edge ring FR and the cover ring CR. As a result, it is possible to reduce downtime otherwise caused by transferring the edge ring FR and the cover ring CR to the aligner. In addition, the cost for introducing the special apparatus can be reduced. Further, space efficiency is improved. However, an aligner may be specially provided, and the edge ring FR and the cover ring CR may be more precisely aligned by the aligner and transferred.

In the example of FIGS. 13A to 13C, an edge ring FR has one cutout FRa in its outer periphery, and a cover ring CR has one cutout CRa in its inner periphery. However, the numbers of the cutouts FRa and CRa are not limited thereto. For example, an edge ring FR may have a plurality of cutouts FRa spaced apart from each other in the circumferential direction in its outer periphery, and a cover ring CR may have a plurality of cutouts CRa spaced apart from each other in the circumferential direction in its inner periphery. In this case, it is preferable that a guide pin 782 is provided corresponding to each of the plurality of cutouts FRa and CRa. Thus, the angular error can be reduced.

Further, in the example of FIGS. 13A to 13C, the case where the upper fork FK21 is used is illustrated, but the lower fork FK22 may be used instead.

Further, in the example of FIGS. 13A to 13C, the case where the edge ring FR and the cover ring CR are positioned using their outer periphery and inner periphery, respectively, has been described, but an embodiment is not limited thereto. For example, each of an edge ring FR and a cover ring CR may be positioned by providing a recess (or a protrusion) for positioning on their back surfaces (their sides to be placed on the placement surface 781*a*).

In addition, in the example of FIGS. 13A to 13C, the case has been described in which the outer peripheral portion of the edge ring FR and the inner peripheral portion of the cover ring CR do not overlap each other. However, there is no limitation thereto, and the outer peripheral portion of an edge ring FR and the inner peripheral portion of a cover ring CR may overlap each other. In this case, the edge ring FR may be held in a state where the edge ring FR has been positioned with respect to the cover ring CR; and, for example, a positioning portion may be provided at the outer periphery of the cover ring CR to position the cover ring CR, thereby indirectly positioning the edge ring FR at the same time accordingly. In another example, in the case where the outer peripheral portion of an edge ring FR and the inner peripheral portion of a cover ring CR overlap each other, recesses (or protrusions) for positioning may be provided in respective regions of the edge ring FR and the cover ring CR where the edge ring FR and the cover ring CR do not overlap each other. In this case, guide pins 782 may be provided at positions where they engage with the recesses. Thus, the edge ring FR and the cover ring CR can be positioned.

Thus, the case where the transfer robot TR2 transfers the edge ring FR and/or the cover ring CR out from the cassette 78 using the upper fork FK21 has been described with reference to FIGS. 11A to 13C.

When an edge ring FR and/or a cover ring CR is to be transferred into the cassette 78, the upper fork FK21 of the transfer robot TR2 may be used to place the edge ring FR and/or the cover ring CR on the base plate 781 of the cassette 78. When the storage module SM is not in operation, for example, the operator may open the door 80 provided on the side of the storage module SM facing the gate valve G4 and place the edge ring FR and/or the cover ring CR on the base plate 781 of the cassette 78. Alternatively, another robot may be used for implementing the placement.

Figure 14:
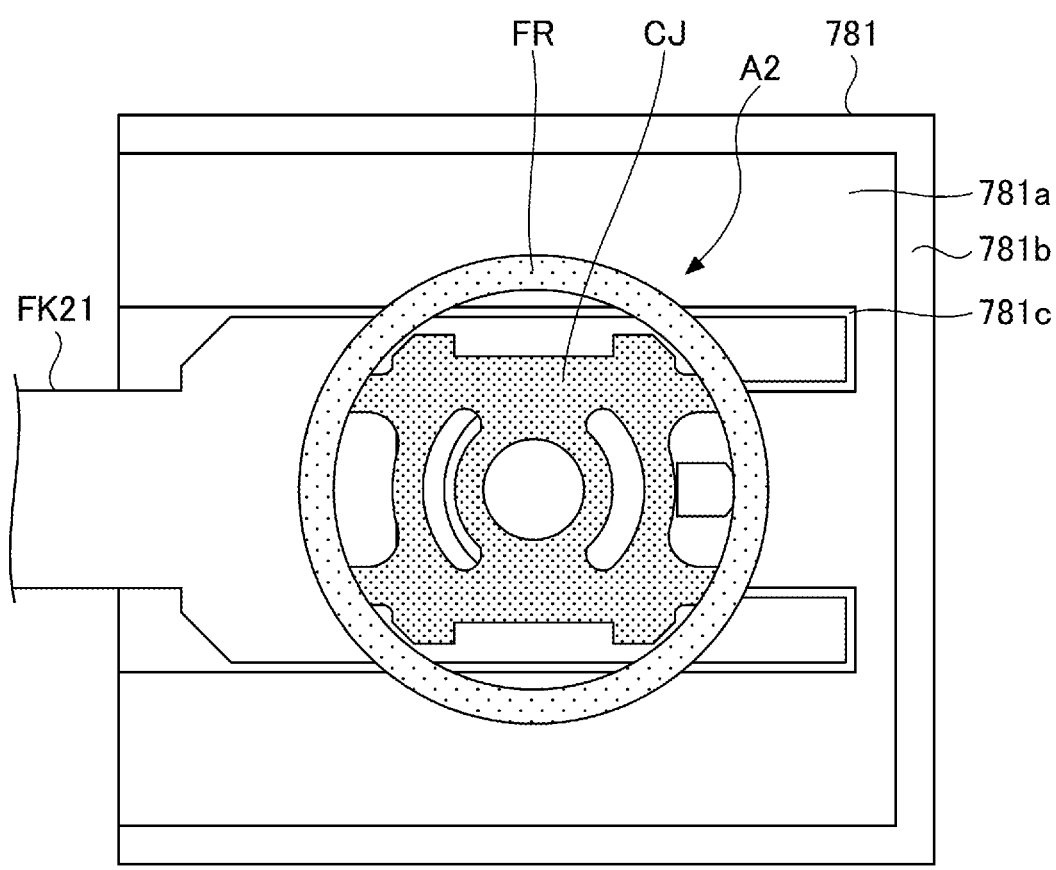
FIG. 14 is a schematic plan view depicting an example of a second assembly stored in the cassette.

With reference to FIG. 14, a case will be described in which the second assembly A2 (the transfer jig CJ and an edge ring FR) positioned and placed in the storage module SM is transferred out from the cassette 78 by the upper fork FK21. The operation that will be described with reference to FIG. 14 is performed, for example, in a case where the outer peripheral portion of the edge ring FR and the inner peripheral portion of a cover ring CR overlap each other when the edge ring FR and the cover ring CR are placed on the electrostatic chuck 112 of the plasma process apparatus 1, and the controller CU selects and executes the sole transfer mode to be described later. FIG. 14 is a schematic plan view illustrating an example of the second assembly A2 stored in the cassette 78.

First, as depicted in FIG. 14, the upper fork FK21 is inserted below the second assembly A2 placed on the base plate 781. Subsequently, the upper fork FK21 is raised. Thus, the upper fork FK21 holds the second assembly A2 stored in the cassette 78 and transfers the second assembly A2 to any one of the process modules PM1 to PM12.

Thus, the transfer robot TR2 holds the second assembly A2 (the transfer jig CJ and the edge rings FR) stored in the cassette 78 using the upper fork FK21, and simultaneously transfers the transfer jig CJ and the edge rings FR together to any one of the process modules PM1 to PM12.

Although the upper fork FK21 is used in the example depicted in FIG. 14, the lower fork FK22 may be used instead.

Figure 15:
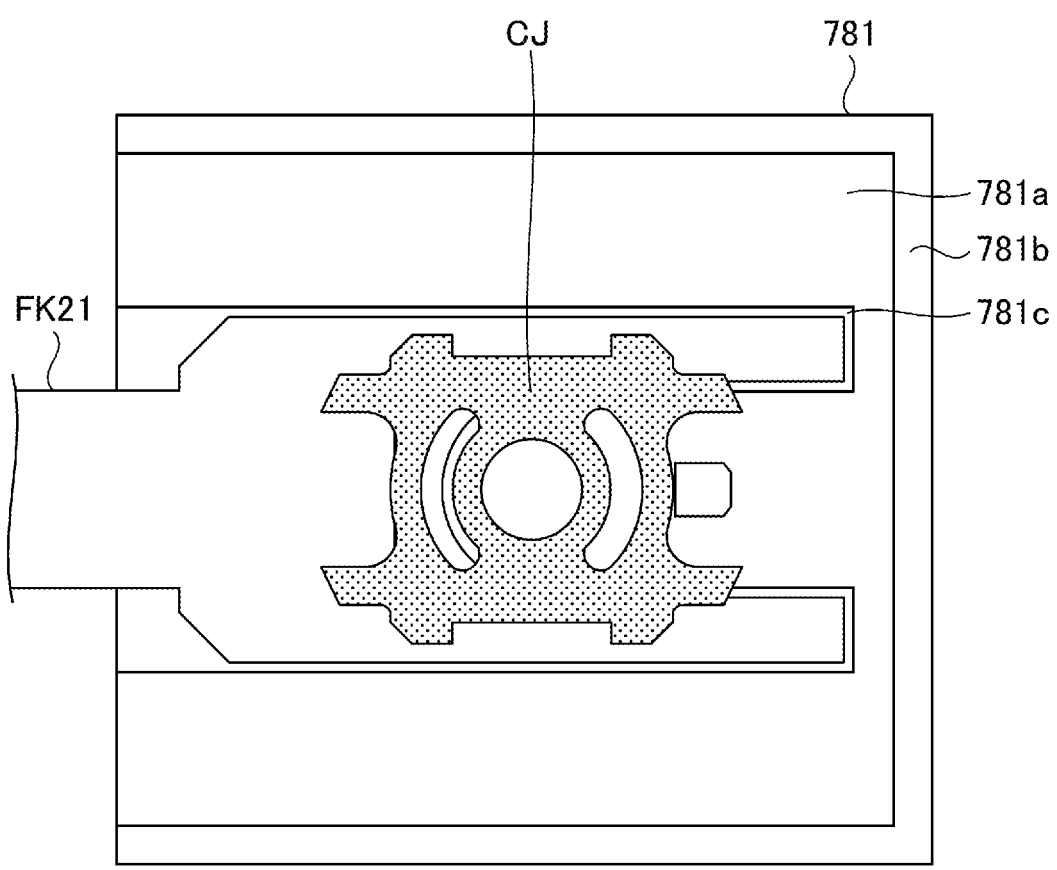
FIG. 15 is a schematic plan view depicting an example of a transfer jig stored in the cassette.

Referring to FIG. 15, a case will be described in which the transfer jig CJ positioned and placed in the storage module SM by the upper fork FK21 is transferred out from the cassette 78. The operation that will now be described with reference to FIG. 15 is performed, for example, in a case where the outer peripheral portion of an edge ring FR and the inner peripheral portion of a cover ring CR overlap each other when the edge ring FR and the cover ring CR are placed on the electrostatic chuck 112 of the plasma process apparatus 1 and the controller CU selects and executes the sole transfer mode to be described later. FIG. 15 is a schematic plan view depicting an example of the transfer jig CJ stored in the cassette 78.

First, as depicted in FIG. 15, the upper fork FK21 is inserted below the transfer jig CJ placed on the base plate 781. Subsequently, the upper fork FK21 is raised. Thus, the upper fork FK21 holds the transfer jig CJ stored in the cassette 78 and transfers the transfer jig CJ to any one of the process modules PM1 to PM12.

Thus, the transfer robot TR2 holds the transfer jig CJ stored in the cassette 78 using the upper fork FK21 and transfers the transfer jig CJ alone to any one of the process modules PM1 to PM12.

Although the upper fork FK21 is used in the example depicted in FIG. 15, a lower fork FK22 may be used instead.

Figure 16:
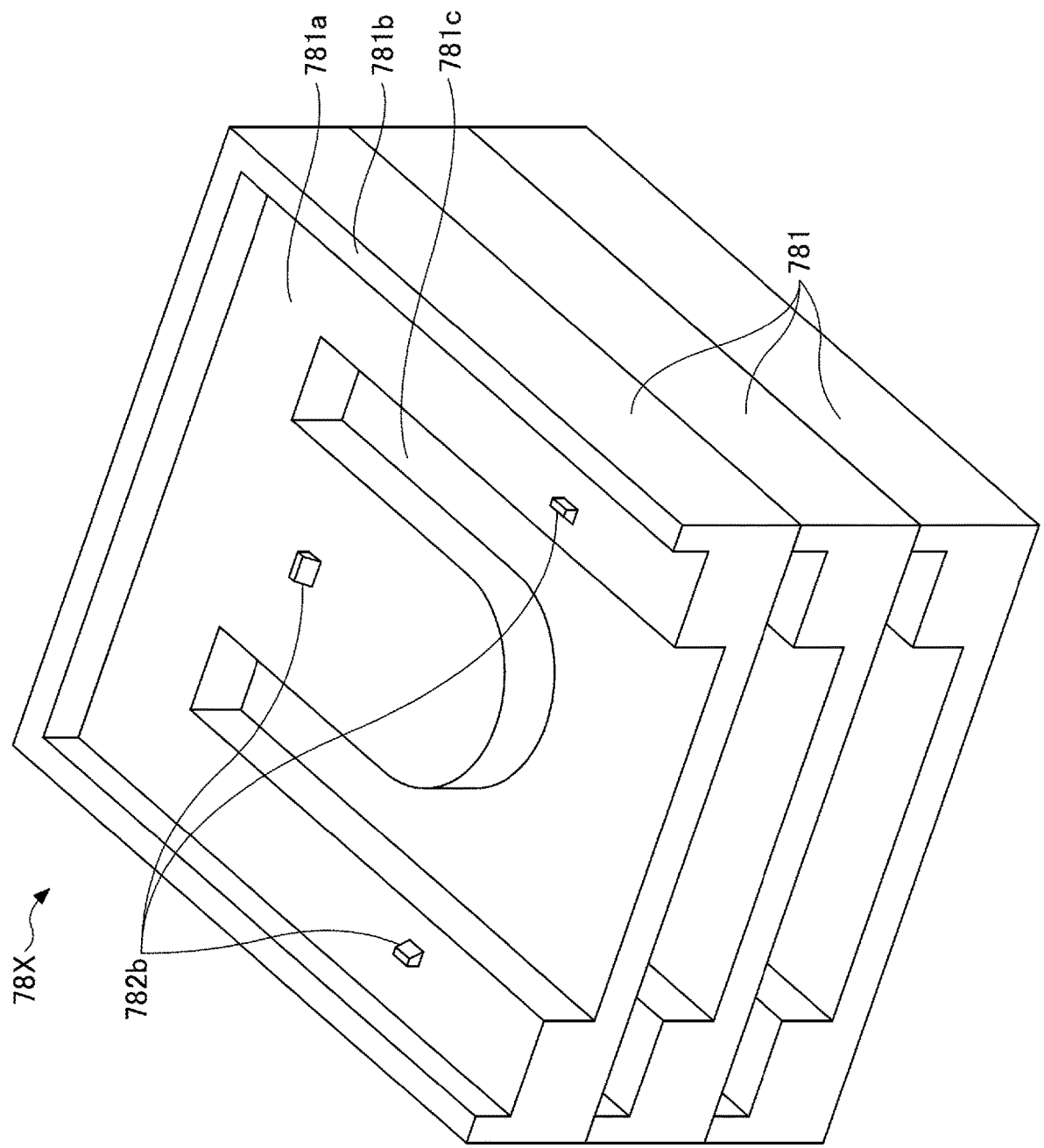
FIG. 16 is a schematic perspective view depicting another example of the cassette in the storage module.

Another example of the cassette 78 included in the storage module SM depicted in FIGS. 4 and 5 will now be described with reference to FIG. 16. FIG. 16 is a schematic perspective view illustrating another example of the cassette 78 included in the storage module SM, and illustrates a cassette 78X that stores edge rings FR as an example of consumable members.

The cassette 78X depicted in FIG. 16 differs from the cassette 78 depicted in FIG. 10 in that the cassette 78X has, instead of the plurality of guide pins 782, inclined blocks 782*b* having inclined surfaces that come into contact with the outer peripheral portion of an edge ring FR to hold the edge ring FR at a given position. The other configurations may be the same as those of the cassette 78 depicted in FIG. 10.

As still another example, the cassette 78 may have inclined blocks (not depicted) having inclined surfaces that contact the inner peripheral portion of a cover ring CR to hold the cover ring CR at a given position. As still another example, the cassette 78 may have inclined blocks (not depicted) having inclined surfaces that contact the outer peripheral portion of an edge ring FR and the inner peripheral portion of a cover ring CR to hold the edge ring FR and the cover ring CR at given positions. In addition, the inclined blocks may be configured to come into contact with the inner peripheral portion of an edge ring FR to hold the edge ring FR at a given position. Further, the inclined blocks may be configured to come into contact with the outer peripheral portion of a cover ring CR to hold the cover ring CR.

[Method of Transferring Consumable Member]

Figure 17A:
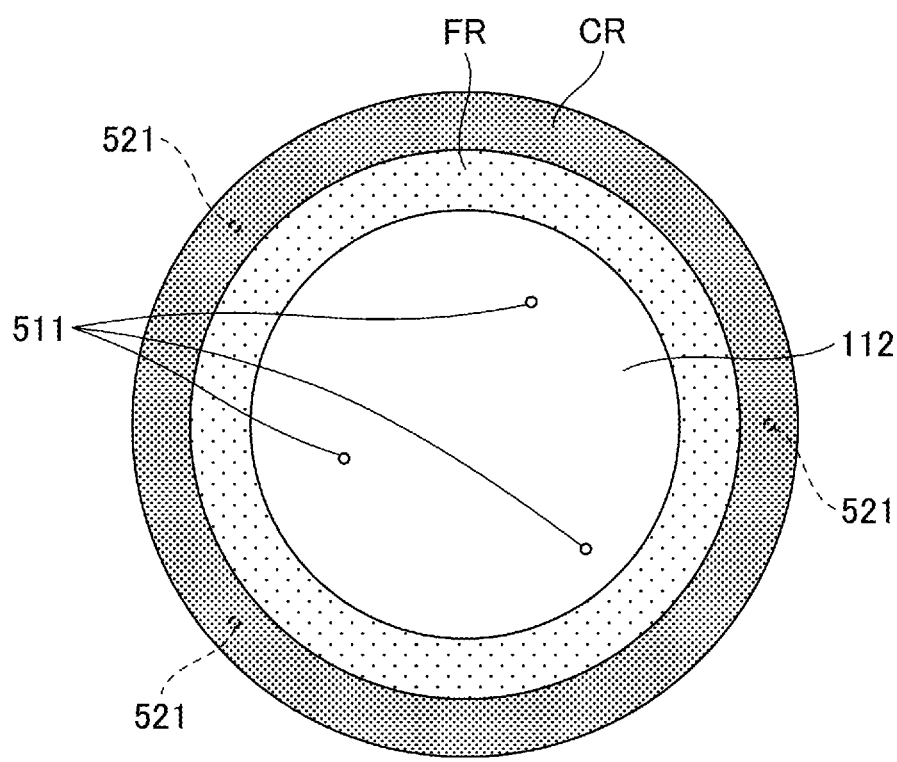
FIGS. 17A-17B are schematic views depicting an electrostatic chuck with an edge ring and a cover ring placed thereon.
Figure 17B:
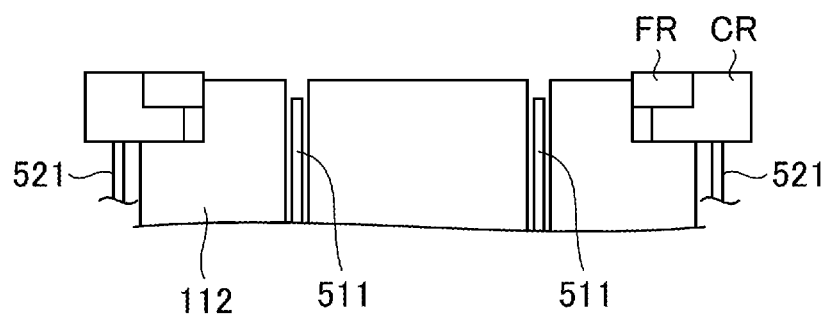

A case where the controller CU selects and executes the simultaneous transfer mode in which the transfer robot TR2 simultaneously transfers an edge ring FR and a cover ring CR will be described as an example of a method of transferring consumable members in the processing system PS according to the embodiment with reference to FIGS. 17A to 19D. In the following description, it is assumed that the controller 90 is included in the controller CU and the controller CU controls the transfer robot TR2 and the lifter 50. However, the controller 90 may be provided separately from the controller CU, the controller CU may control the transfer robot TR2, and the controller 90 may control the lifter 50. It is assumed that the outer peripheral portion of an edge ring FR and the inner peripheral portion of a cover ring CR overlap each other in plan view. In addition, it is assumed that the edge ring FR and the cover ring CR are placed on the electrostatic chuck 112 in an initial state as illustrated in FIGS. 17A and 17B.

Figure 18A:
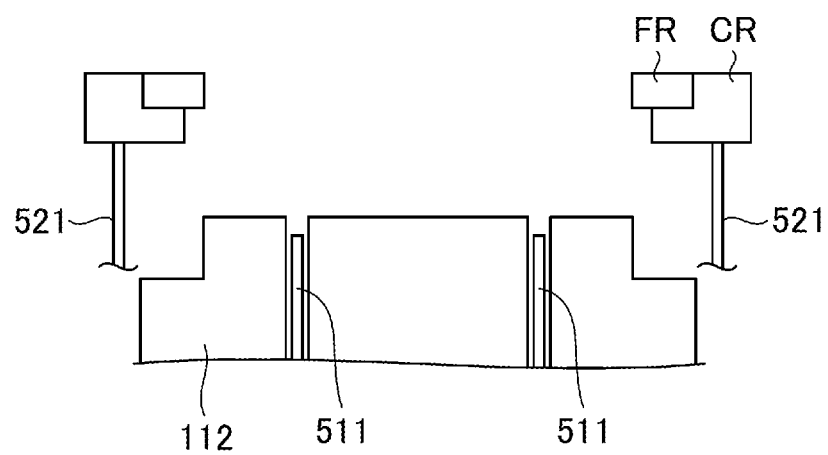
FIGS. 18A-18D are diagrams depicting an example of a simultaneous transfer mode.

First, as depicted in FIG. 18A, the controller CU raises the plurality of support pins 521 from standby positions to support positions. Thus, the upper ends of the plurality of support pins 521 come into contact with the lower surface of the cover ring CR, the cover ring CR is thus raised by the plurality of support pins 521, and the cover ring CR is removed from the electrostatic chuck 112 accordingly. At this time, the outer periphery (outer annular portion) of the edge ring FR is placed on the inner peripheral portion of the cover ring CR. Therefore, when the cover ring CR is thus raised by the plurality of support pins 521, the edge ring FR is also raised together with the cover ring CR. That is, the edge ring FR and the cover ring CR are integrally removed from the electrostatic chuck 112.

Figure 18B:
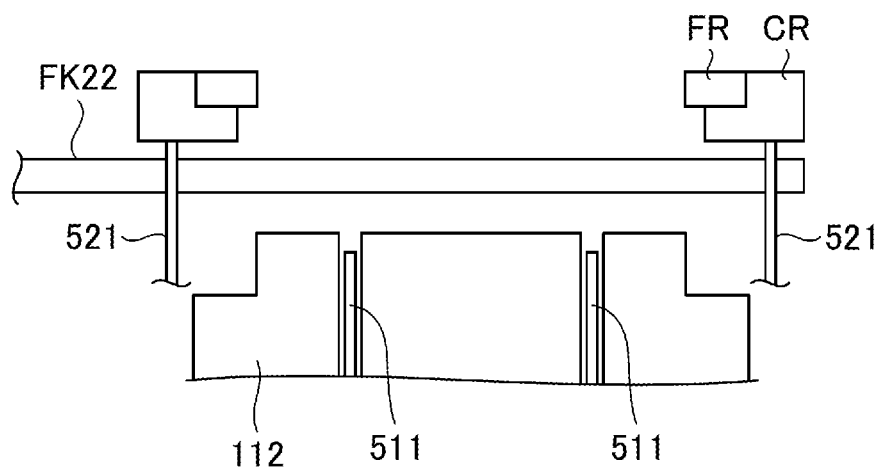

Subsequently, as depicted in FIG. 18B, the controller CU inserts the lower fork FK22, which does not hold a transfer object, between the electrostatic chuck 112 and a set of the edge ring FR and the cover ring CR supported by the plurality of support pins 521.

Figure 18C:
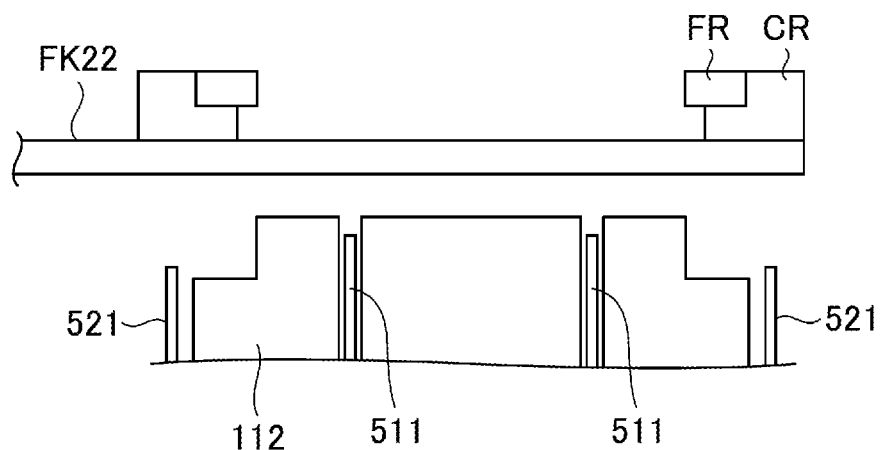

Subsequently, as depicted in FIG. 18C, the controller CU lowers the plurality of support pins 521 from the support positions to the standby position. As a result, the edge ring FR and the cover ring CR supported by the plurality of support pins 521 are placed on the lower fork FK22.

Figure 18D:
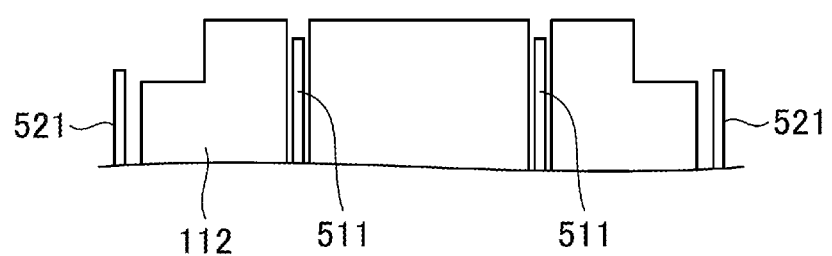

Subsequently, as depicted in FIG. 18D, the controller CU withdraws the lower fork FK22 holding the edge ring FR and the cover ring CR.

Figure 19A:
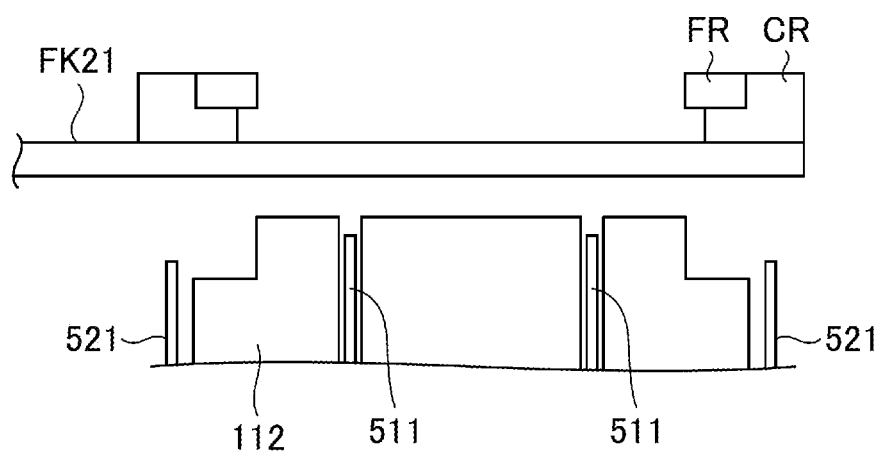
FIGS. 19A-19D are diagrams depicting an example of the simultaneous transfer mode.

Subsequently, as depicted in FIG. 19A, the controller CU inserts the upper fork FK21 that holds an edge ring FR and a cover ring CR for replacement above the electrostatic chuck 112. The edge ring FR for replacement may be a new (unused) edge ring or may be an edge ring that has been used, but has not been consumed so much. The cover ring CR for replacement may be a new (unused) cover ring or may be a cover ring that has been used, but has not been consumed so much.

Figure 19B:
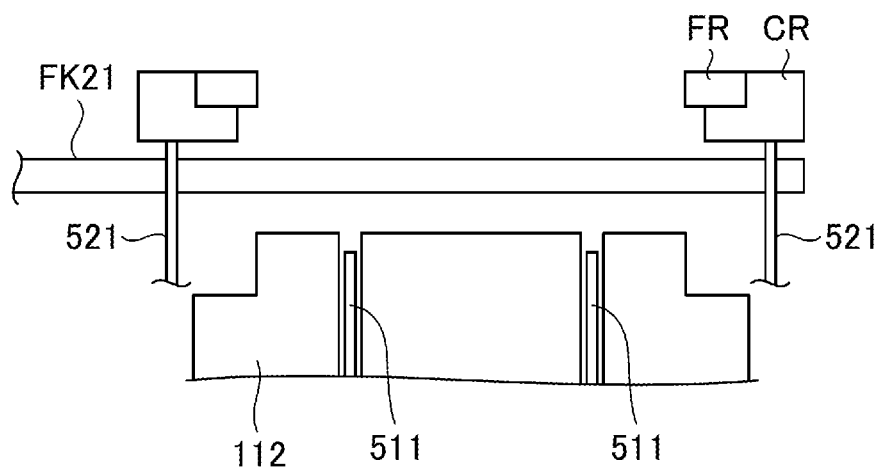

Subsequently, as depicted in FIG. 19B, the controller CU raises the plurality of support pins 521 from the standby positions to the support position. As a result, the upper ends of the plurality of support pins 521 come into contact with the lower surface of the cover ring CR held by the upper fork FK21, the cover ring CR is thus raised by the plurality of support pins 521, and the cover ring CR is removed from the upper fork FK21. At this time, the outer peripheral portion of the edge ring FR has been placed on the inner peripheral portion of the cover ring CR. Therefore, the edge ring FR and the cover ring CR are together raised by the plurality of support pins 521. That is, the edge ring FR and the cover ring CR are integrally removed from the upper fork FK21.

Figure 19C:
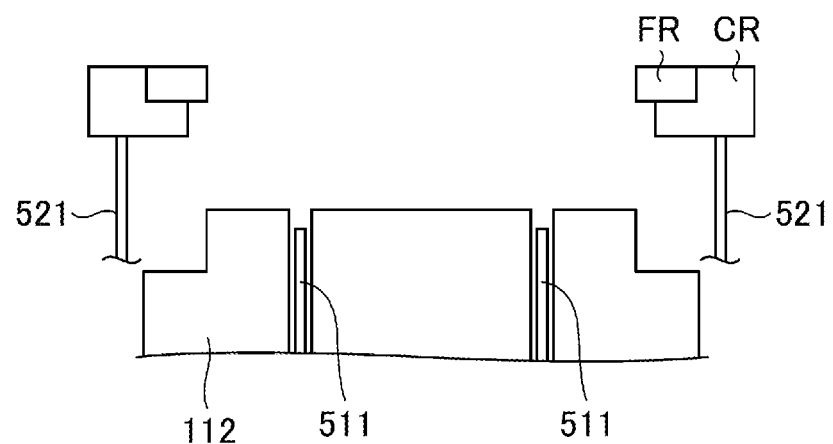

Subsequently, as depicted in FIG. 19C, the controller CU withdraws the upper fork FK21 that does not hold a transfer object.

Figure 19D:
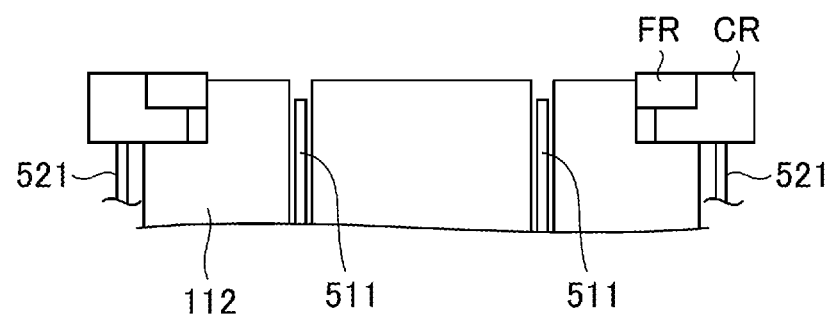

Subsequently, as depicted in FIG. 19D, the controller CU lowers the plurality of support pins 521 from the support positions to the standby position. Thus, the edge ring FR and the cover ring CR supported by the plurality of support pins 521 are placed on the electrostatic chuck 112. Thus, as depicted in FIGS. 17A and 17B, the edge ring FR and the cover ring CR are simultaneously transferred into the plasma process chamber and placed on the electrostatic chuck 112.

Thus, when the edge ring FR and the cover ring CR placed on the electrostatic chuck 112 are transferred out from the plasma process chamber 10, the controller CU performs an operation opposite to the above-described operation of transferring the edge ring FR and the cover ring CR into the plasma process chamber 10.

Thus, according to the processing system PS of the embodiment, the edge ring FR and the cover ring CR can be simultaneously transferred.

With reference to FIGS. 20A to 23D, as another example of a consumable member transfer method in the processing system PS of the embodiment, a case where the controller CU selects and executes the sole transfer mode in which the transfer robot TR2 transfers only an edge ring FR will be described. In the following description, it is assumed that the controller 90 is included in the controller CU and the controller CU controls the transfer robot TR2 and the lifter 50. However, the controller 90 may be provided separately from the controller CU, the controller CU may control the transfer robot TR2, and the controller 90 may control the lifter 50. It is assumed that the outer peripheral portion of an edge ring FR and the inner peripheral portion of a cover ring CR overlap each other in plan view. In addition, it is assumed that the edge ring FR and the cover ring CR are placed on the electrostatic chuck 112 in an initial state as illustrated in FIGS. 17A and 17B.

Figure 20A:
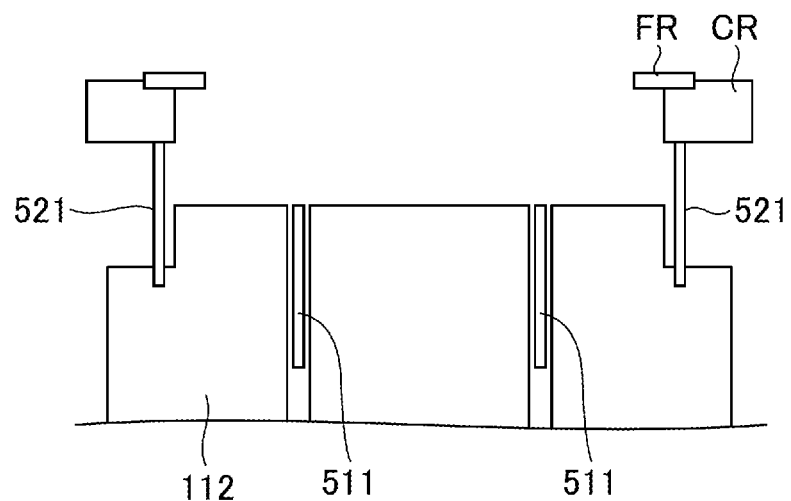
FIGS. 20A-20D are diagrams depicting an example of a sole transfer mode.

First, as depicted in FIG. 20A, the controller CU raises the plurality of support pins 521 from the standby positions to the support position. Thus, the upper ends of the plurality of support pins 521 come into contact with the lower surface of the cover ring CR, the cover ring CR is raised by the plurality of support pins 521, and the cover ring CR is removed from the electrostatic chuck 112. At this time, the outer peripheral portion of the edge ring FR has been placed on the inner peripheral portion of the cover ring CR. Therefore, when the cover ring CR is thus raised by the plurality of support pins 521, the edge ring FR is also raised together with the cover ring CR. That is, the edge ring FR and the cover ring CR are integrally removed from the electrostatic chuck 112.

Figure 20B:
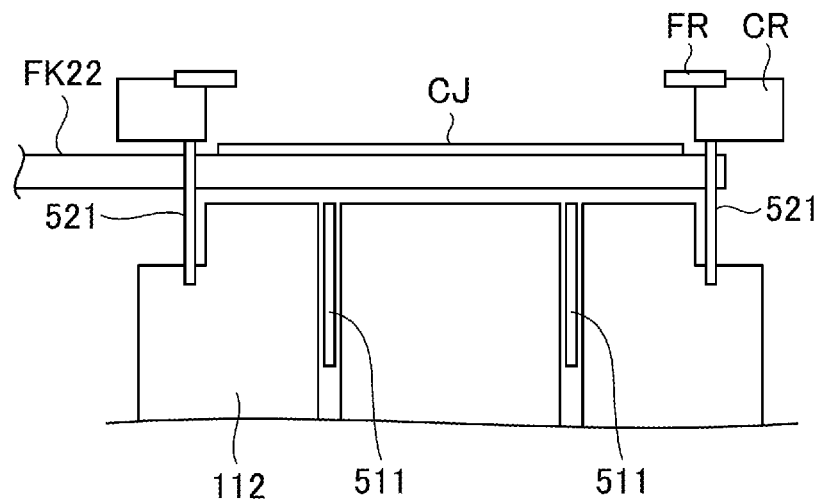

Subsequently, as depicted in FIG. 20B, the controller CU inserts the lower fork FK22, holding the transfer jig CJ, between the electrostatic chuck 112 and a set of the edge ring FR and the cover ring CR supported by the plurality of support pins 521.

Figure 20C:
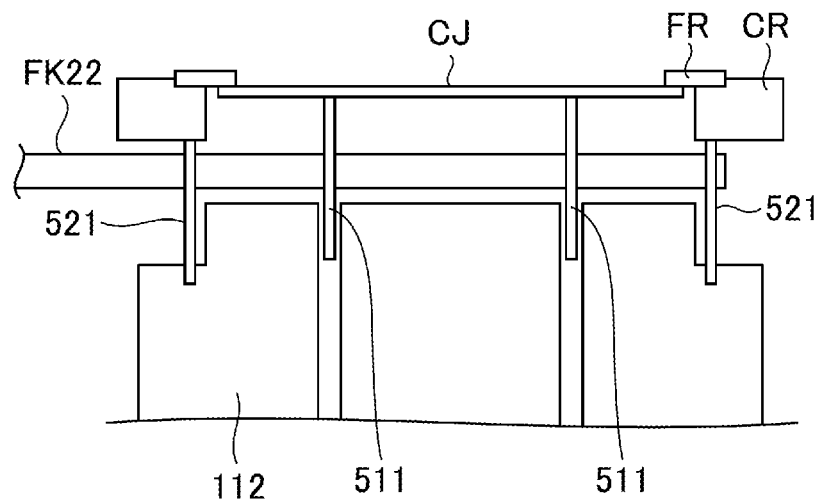

Subsequently, as depicted in FIG. 20C, the controller CU raises the plurality of support pins 511 from the standby positions to the support position. As a result, the upper ends of the plurality of support pins 511 come into contact with the lower surface of the transfer jig CJ, the transfer jig CJ is raised by the plurality of support pins 511, and the transfer jig CJ is removed from the lower fork FK22.

Figure 20D:
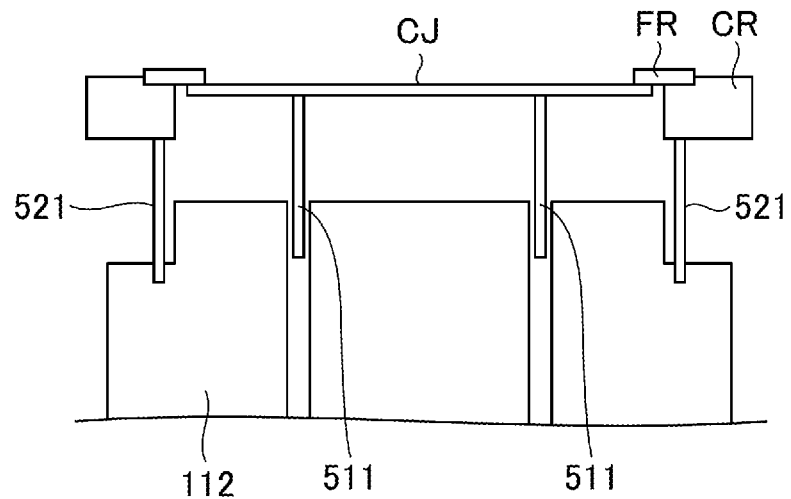

Subsequently, as depicted in FIG. 20D, the controller CU withdraws the lower fork FK22 that does not hold a transfer object.

Figure 21A:
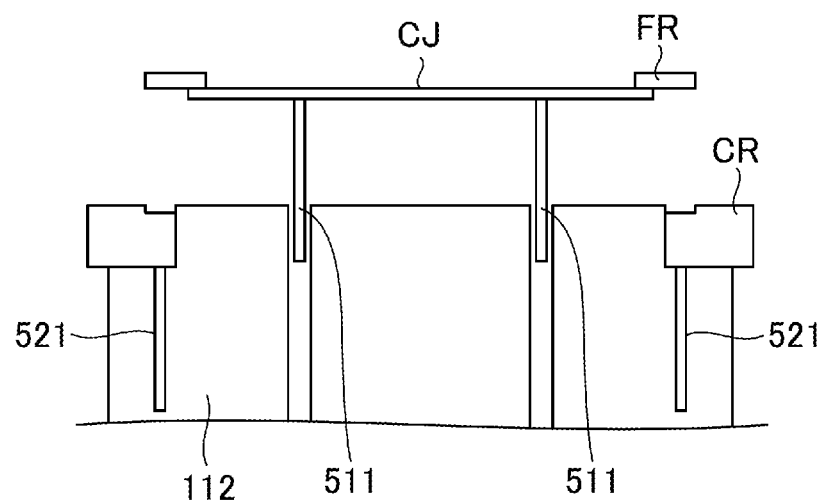
FIGS. 21A-21D are diagrams depicting an example of the sole transfer mode.

Subsequently, as depicted in FIG. 21A, the controller CU lowers the plurality of support pins 521 from the support positions to the standby position. At this time, because the inner periphery (inner annular portion) of the edge ring FR is supported by the transfer jig CJ, only the cover ring CR supported by the plurality of support pins 521 is placed on the electrostatic chuck 112.

Figure 21B:
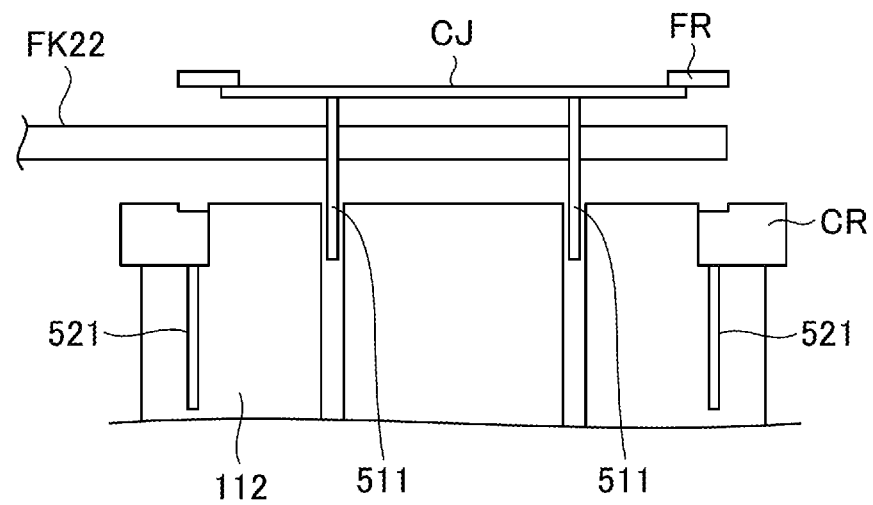

Subsequently, as depicted in FIG. 21B, the controller CU inserts the lower fork FK22, which does not hold a transfer object, between the electrostatic chuck 112 and a set of the transfer jig CJ and the edge ring FR supported by the plurality of support pins 511.

Figure 21C:
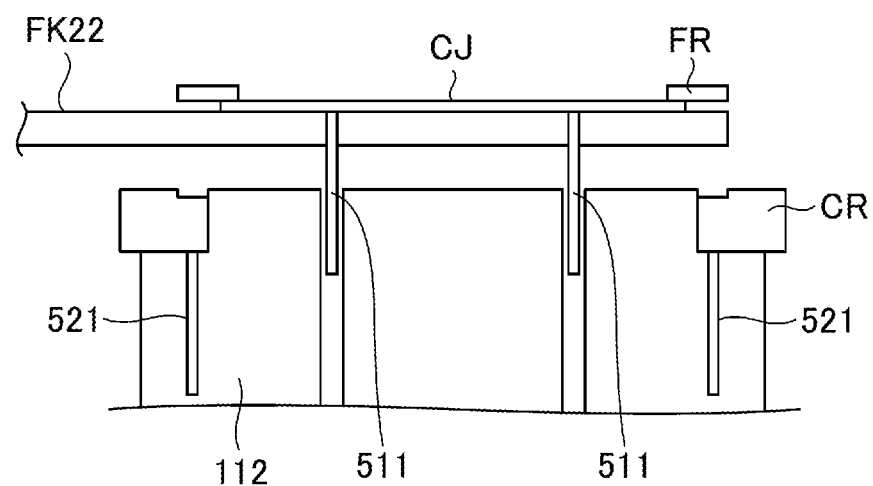

Subsequently, as depicted in FIG. 21C, the controller CU lowers the plurality of support pins 511 from the support positions to the standby position. Thus, the transfer jig CJ and the edge ring FR supported by the plurality of support pins 511 are placed on the lower fork FK22.

Figure 21D:
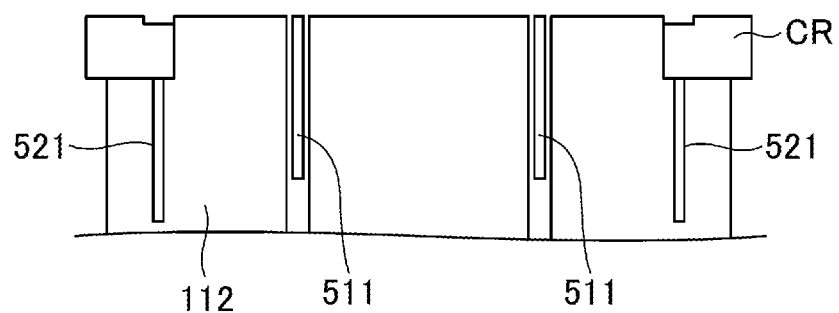

Subsequently, as depicted in FIG. 21D, the controller CU withdraws the lower fork FK22 holding the transfer jig CJ and the edge ring FR.

Figure 22A:
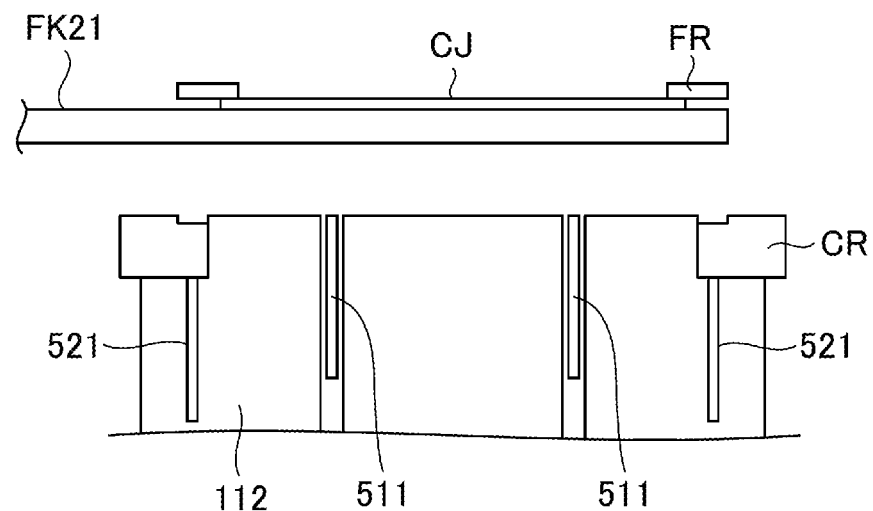
FIGS. 22A-22D are diagrams depicting an example of the sole transfer mode.

Subsequently, as illustrated in FIG. 22A, the controller CU inserts the upper fork FK21 holding the transfer jig CJ that holds an edge ring FR for replacement into above the electrostatic chuck 112.

Figure 22B:
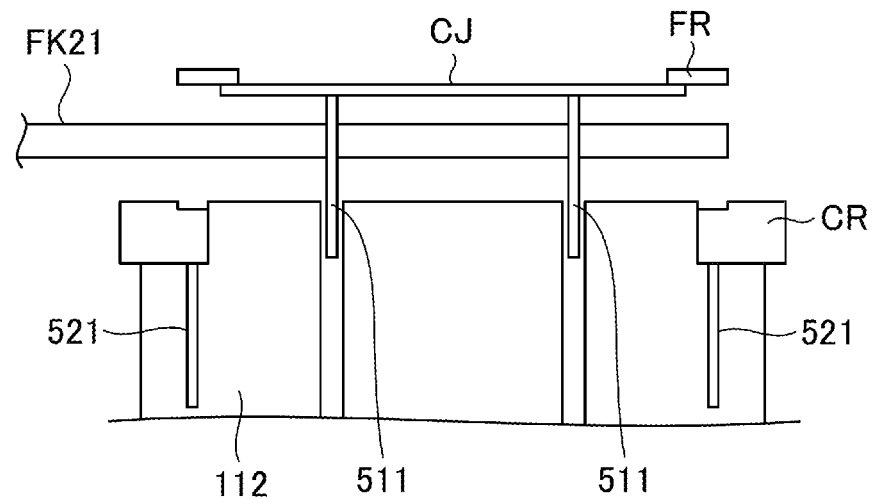

Subsequently, as depicted in FIG. 22B, the controller CU controls the plurality of support pins 511 to move up from the standby positions to the support position. As a result, the upper ends of the plurality of support pins 511 come into contact with the lower surface of the transfer jig CJ that is held by the upper fork FK21, the transfer jig CJ is raised by the plurality of support pins 511, and the transfer jig CJ is removed from the upper fork FK21. At this time, the inner peripheral portion of the edge ring FR is placed on the transfer jig CJ. Therefore, when the transfer jig CJ is raised by the plurality of support pins 511, the edge ring FR is also raised together with the transfer jig CJ accordingly. That is, the transfer jig CJ and the edge ring FR are integrally removed from the upper fork FK21.

Figure 22C:
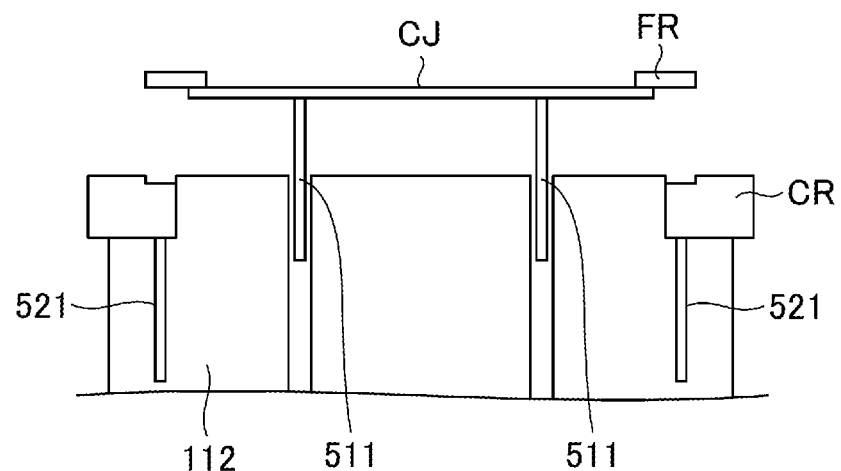

Subsequently, as depicted in FIG. 22C, the controller CU withdraws the upper fork FK21 that does not hold a transfer object.

Figure 22D:
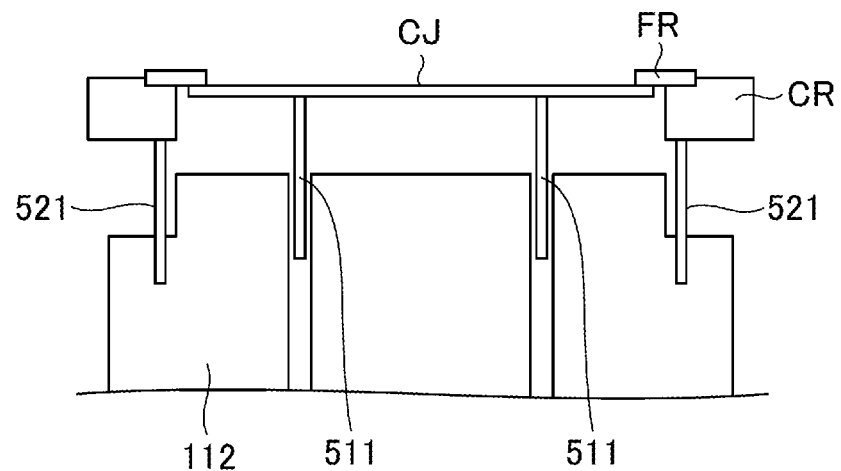

Subsequently, as depicted in FIG. 22D, the controller CU raises the plurality of support pins 521 from the standby positions to the support position. Thus, the upper ends of the plurality of support pins 521 come into contact with the lower surface of the cover ring CR placed on the electrostatic chuck 112, the cover ring CR is raised by the plurality of support pins 521, and the cover ring CR is removed from the electrostatic chuck 112. Further, the outer peripheral portion of the edge ring FR placed on the transfer jig CJ is placed on the inner peripheral portion of the cover ring CR.

Figure 23A:
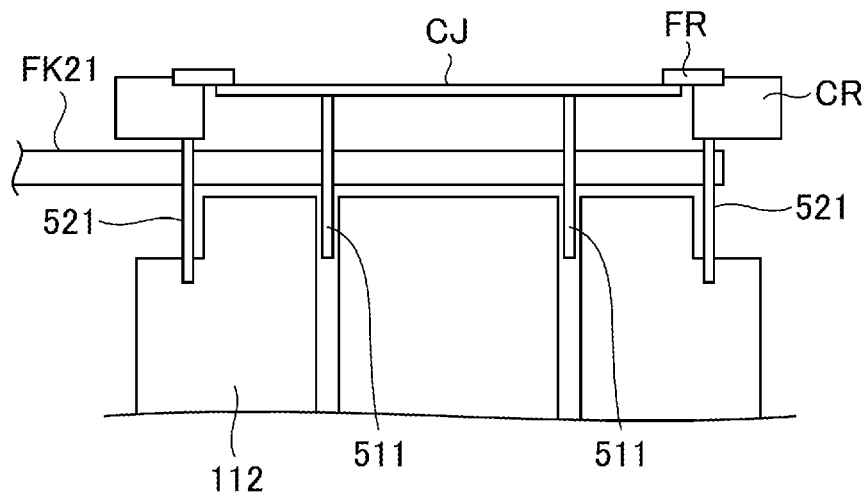
FIGS. 23A-23D are diagrams depicting an example of the sole transfer mode.

Subsequently, as depicted in FIG. 23A, the controller CU inserts the upper fork FK21, which does not hold a transfer object, between the electrostatic chuck 112 and a set of the transfer jig CJ, the edge ring FR, and the cover ring CR.

Figure 23B:
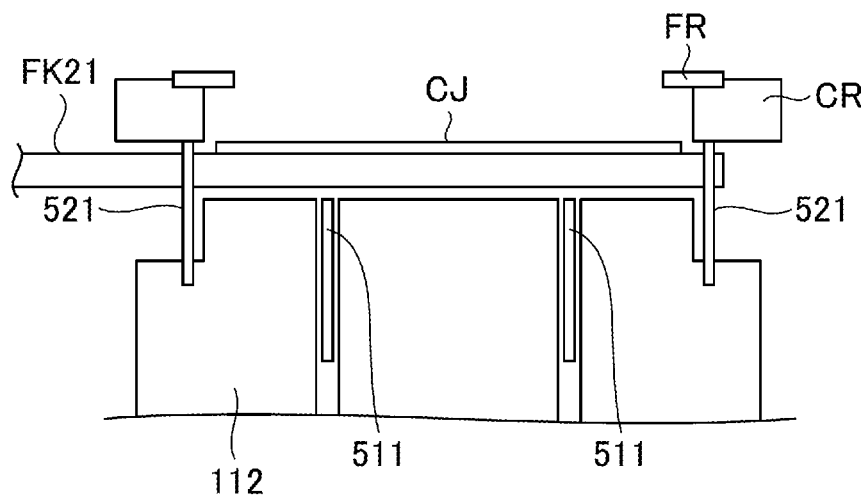

Subsequently, as depicted in FIG. 23B, the controller CU lowers the plurality of support pins 511 from the support positions to the standby position. At this time, because the outer peripheral portion of the edge ring FR is placed on the inner peripheral portion of the cover ring CR, only the transfer jig CJ supported by the plurality of support pins 511 is placed on the upper fork FK21.

Figure 23C:
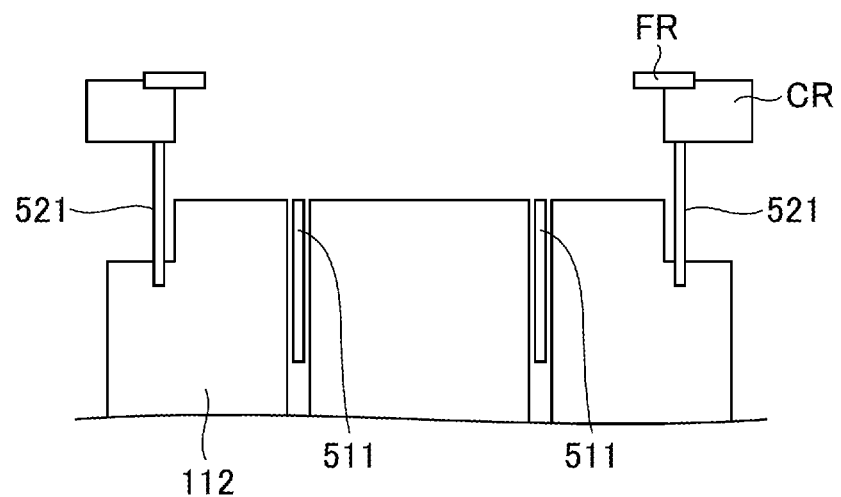

Subsequently, as depicted in FIG. 23C, the controller CU withdraws the upper fork FK21 holding the transfer jig CJ.

Figure 23D:
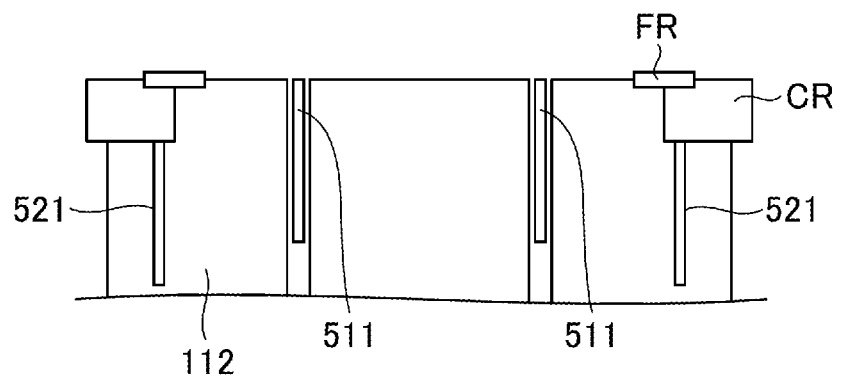

Subsequently, as depicted in FIG. 23D, the controller CU lowers the plurality of support pins 521 from the support positions to the standby position. Thus, the edge ring FR and the cover ring CR supported by the plurality of support pins 521 are placed on the electrostatic chuck 112.

As described above, according to the processing system PS of the embodiment, only an edge ring FR can be independently transferred without replacing a cover ring CR. Thus, only an edge ring FR is transferred to the plasma process chamber 10 and is placed on the electrostatic chuck 112 on which a cover ring CR has been placed.

Thus, when only an edge ring FR from among the edge ring FR and a cover ring CR placed on the electrostatic chuck 112 is to be transferred from the plasma process chamber 10, the controller CU performs an operation reverse to the above-described transfer of the edge ring FR into the plasma process chamber 10.

[Method of Replacing Consumable Member]

Figure 24:
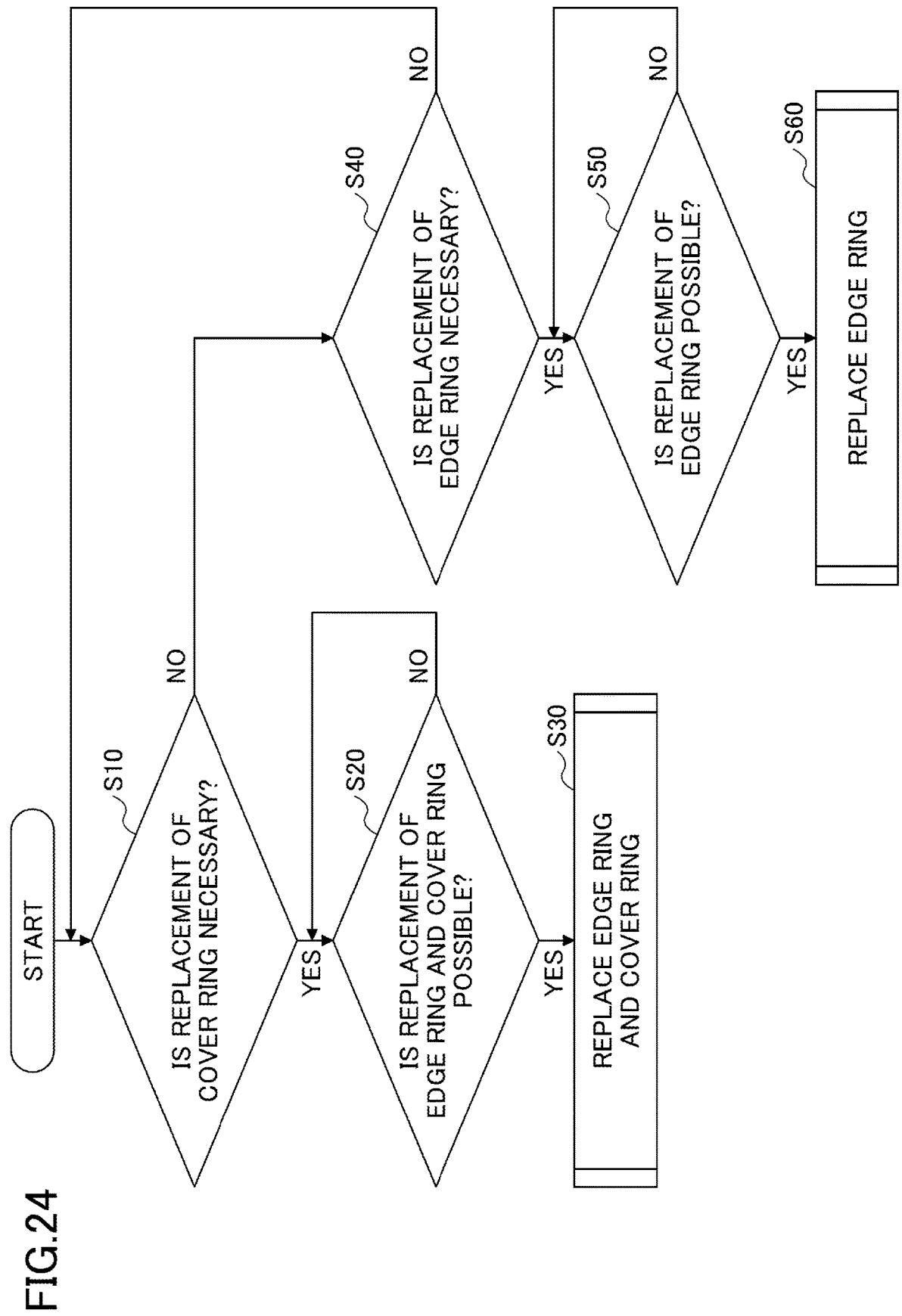
FIG. 24 is a flowchart depicting an example of a method of replacing a consumable member according to an embodiment.

Referring to FIG. 24, an example of a method of replacing a consumable member according to the embodiment will now be described. FIG. 24 is a flowchart illustrating an example of a method of replacing a consumable member according to the embodiment. Hereinafter, a case where a consumable member in the process module PM12 is replaced will be described as an example. The method of replacing a consumable member according to the embodiment illustrated in FIG. 24 is performed as a result of the controller CU controlling each unit of the processing system PS.

In step S10, the controller CU determines whether or not replacement of a cover ring CR is necessary. In the present embodiment, the controller CU determines whether or not replacement of a cover ring CR is necessary based on, for example, RF integrated time, RF integrated power, and an integrated value of a specific step of the recipe. The RF integrated time, the RF integrated power, and the integrated value of a specific step of a recipe will be described later. In addition, the controller CU may determine whether or not replacement of a cover ring CR is necessary by detecting the height position of the cover ring CR using, for example, an optical device or the like. In another example, the controller CU may count the number of times of replacement of an edge ring FR, and replace a cover ring CR when the number of times of replacement of an edge ring FR reaches a given value. For example, when an edge ring FR has been replaced three times, a cover ring CR may be replaced once. At this time, when an edge ring FR has been replaced for the third time, a cover ring CR is also replaced at the same time. In another example, the controller CU may replace an edge ring FR and a cover ring CR at the same time in a replacement cycle of a cover ring CR. The flowchart of FIG. 24 depicts an example in which an edge ring FR and a cover ring CR are simultaneously replaced in a replacement cycle of a cover ring CR.

If it is determined in step S10 that replacement of a cover ring CR is necessary, the controller CU advances the process to step S20. On the other hand, if it is determined in step S10 that replacement of the cover ring CR is not necessary, the controller CU advances the process to step S40.

In step S20, the controller CU determines whether or not replacement of the edge ring FR and the cover ring CR is possible. The determination of whether or not replacement of the edge ring FR and the cover ring CR is possible can use, for example, the same determination method as the determination of whether or not replacement of an edge ring FR is possible, which will be described later. However, a different determination method may be used. If it is determined in step S20 that replacement of the edge ring FR and the cover ring CR is possible, the controller CU advances the process to step S30. On the other hand, if it is determined in step S20 that replacement of the edge ring FR and the cover ring CR is not possible, the controller CU performs step S20 again.

In step S30, the controller CU selects the simultaneous transfer mode and causes the transfer robot TR2 to simultaneously transfer the edge ring FR and the cover ring CR. Details of step S30 will be described later.

In step S40, the controller CU determines whether replacement of an edge ring FR is necessary. In the present embodiment, the controller CU determines whether or not replacement of the edge ring FR is necessary based on, for example, RF integrated time, RF integrated power, and an integrated value of a specific step of a recipe.

The RF integrated time is an integrated value of a time during which high-frequency power is supplied in the process module PM12 during a given plasma process. The RF-integrated power is an integrated value of the high-frequency power supplied in the process module PM12 during the given plasma process. The integrated value of a specific step of a recipe is an integrated value of a time during which the high-frequency power is supplied or an integrated value of the high-frequency power in a step in which the edge ring FR is removed from among steps performed in the process module PM12. Note that the RF integrated time, the RF integrated power, and the integrated value of a specific step of a recipe are values, the calculation of which starts from a time point at which the edge ring FR was replaced, such as a time point at which the apparatus was introduced or a time point at which maintenance was performed.

If it is determined whether or not replacement of the edge ring FR is necessary based on the RF integrated time, the controller CU determines that replacement of the edge ring FR is necessary when the RF integrated time reaches a threshold value. On the other hand, when the RF integrated time does not reach the threshold value, the controller CU determines that it is not necessary to replace the edge ring FR. Note that the threshold value is a value determined by a preliminary experiment or the like in accordance with a type of the material of the edge ring FR or the like.

If it is determined whether or not replacement of the edge ring FR is necessary based on the RF integrated power, the controller CU determines that replacement of the edge ring FR is necessary when the RF integrated power reaches a threshold value. On the other hand, when the RF integrated power does not reach the threshold value, the controller CU determines that it is not necessary to replace the edge ring FR. Note that the threshold value is a value determined by a preliminary experiment or the like in accordance with a type of the material of the edge ring FR or the like.

If it is determined whether or not replacement of the edge ring FR is necessary based on the integrated value of a specific step of a recipe, the controller CU determines that replacement of the edge ring FR is necessary when the RF integrated time or the RF integrated power in the specific step reaches a threshold value. On the other hand, when the RF integrated time or the RF integrated power in the specific step does not reach the threshold value, the controller CU determines that replacement of an edge ring FR is not necessary. In the case where it is determined whether or not replacement of the edge ring FR is necessary based on the integrated value of the specific step of the recipe, the timing at which the edge ring FR is to be replaced can be calculated based on the step at which the high-frequency power is applied and the edge ring FR is reduced in size. Therefore, the timing at which the edge ring FR is to be replaced can be calculated with particularly high accuracy. Note that the threshold value is a value determined by a preliminary experiment or the like in accordance with a type of the material of the edge ring FR or the like.

The controller CU may determine whether or not replacement of the edge ring FR is necessary by detecting the height position of the edge ring FR using, for example, an optical device.

If it is determined in step S40 that replacement of the edge ring FR is necessary, the controller CU advances the process to step S50. On the other hand, if it is determined that the replacement of the edge ring FR is not necessary, the controller CU returns the process to step S10.

In step S50, the controller CU determines whether or not replacement of the edge ring FR is possible. In the present embodiment, the controller CU determines that replacement of the edge ring FR is possible, for example, when the substrate W is not being processed in the process module PM12 in which replacement of the edge ring FR will be performed. On the other hand, when the substrate W is being processed in the process module PM12, the controller CU determines that replacement of the edge ring FR is not possible. The controller CU may determine that replacement of the edge ring FR is possible, for example, when processing of substrates W of the same lot as the substrate W that is being processed, in the process module PM12 for which replacement of the edge ring FR is to be performed, has been completed. In this case, the controller CU determines that replacement of the edge ring FR is not possible until processing of the substrates W of the same lot as the substrate W that is being processed in the process module PM12 has been completed.

In step S50, if it is determined that replacement of the edge ring FR is possible, the controller CU advances the process to step S60. On the other hand, if it is determined that replacement of the edge ring FR is not possible, the controller CU performs step S50 again.

In step S60, the controller CU selects the sole transfer mode and causes the transfer robot TR2 to transfer only the edge ring FR. Details of step S60 will be described later.

Figure 25:
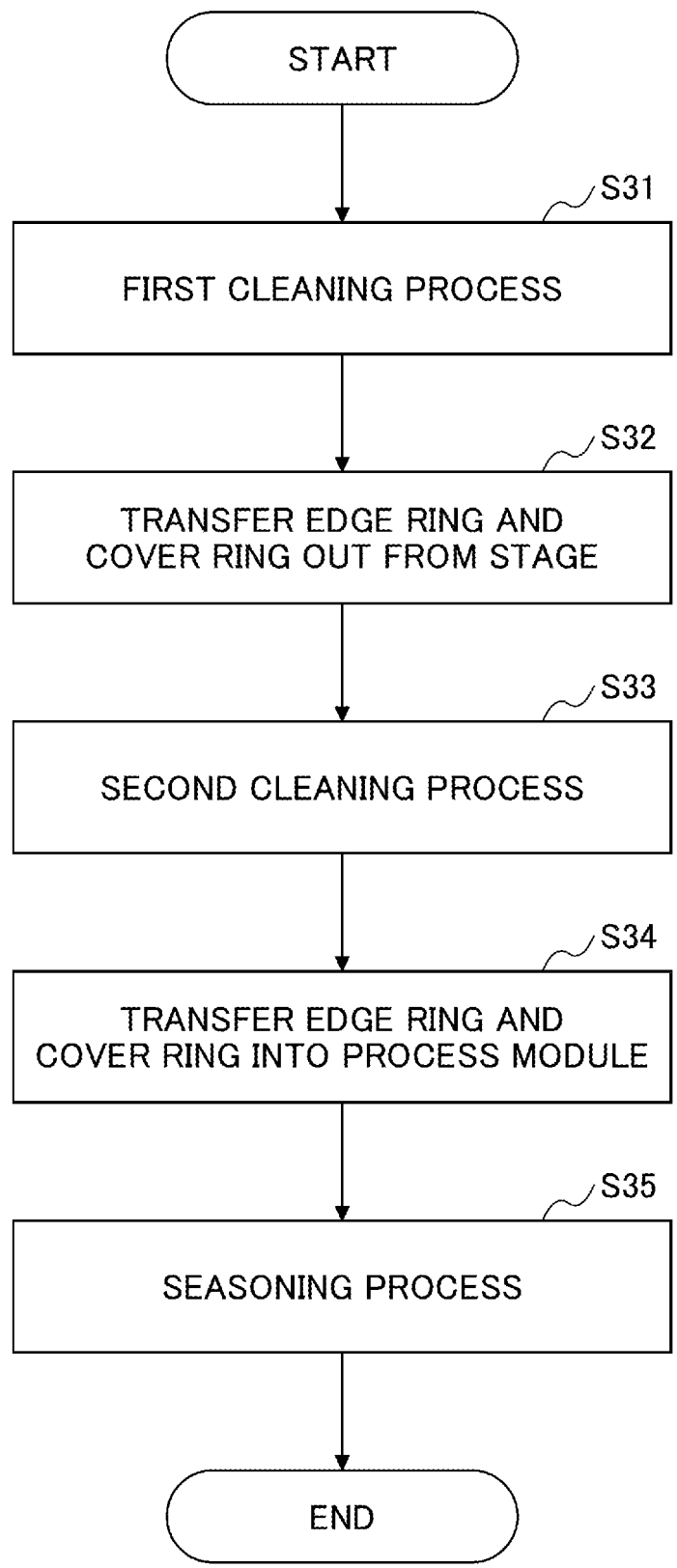
FIG. 25 is a flowchart depicting an example of the simultaneous transfer mode.

Next, the details of step S30 will be described with reference to FIG. 25. Step S30 includes a first cleaning step S31, a transfer-out step S32, a second cleaning step S33, a transfer-into step S34, and a seasoning step S35. Hereinafter, each step will be described.

The first cleaning step S31 is a step of performing a cleaning process on the process module PM12. In the first cleaning step S31, the controller CU performs a cleaning process on the process module PM12 by controlling a gas introduction system, an exhaust system, a power introduction system, and the like. The cleaning process is a process of removing deposits generated through plasma process in the process module PM12 by plasma of a process gas or the like and stabilizing the process module PM12 in a clean state. By performing the first cleaning step S31, it is possible to reduce upward swirling of the deposits in the process module PM12 in step S32. As the process gas, it may be possible to use, for example, an oxygen ($O_2$) gas, a carbon fluoride (CF)-based gas, a nitrogen ($N_2$) gas, an argon (Ar) gas, a helium (He) gas, or a mixture gas of two or more thereof. When the cleaning process is performed on the process module PM12, depending on the process conditions, the cleaning process may be performed in a state where a substrate W such as a dummy wafer is placed on the upper surface of the electrostatic chuck 112 in order to protect the electrostatic chuck 112 of the stage. In a case where there is no possibility of deposits swirling upwards, for example, there are no deposits in the process module PM12, the first cleaning step S31 may be omitted. When the edge ring FR and the cover ring CR have been attracted to the stage by the electrostatic chuck 112, a static electricity removal process is performed until the next transfer-out step S32 starts. During the first cleaning step S31, the edge ring FR and the cover ring CR may be raised away from the electrostatic chuck 112 and the insulator 115 in order to remove the deposits from the back surfaces of the edge ring FR and the cover ring CR. During the first cleaning step S31, a state may be changed between a state where the edge ring FR and the cover ring CR have been raised (have been lifted up) and a state where the edge ring FR and the cover ring CR have not been raised (have not been lifted up). As described above, in the first cleaning step S31, the cleaning process may be performed in a state where the edge ring FR and the cover ring CR have been lifted up and/or in a state where the edge ring FR and the cover ring CR have not been lifted up.

The transfer-out step S32 is a step of transferring the edge ring FR and the cover ring CR from the inside of the process module PM12 without opening the process module PM12 to the atmosphere. In the transfer-out step S32, the controller CU controls each unit of the processing system PS so as to transfer the edge ring FR and the cover ring CR from the process module PM12 without opening the process module PM12 to the atmosphere. Specifically, the gate valve G1 is opened, and the edge ring FR and the cover ring CR placed on the stage inside the process module PM12 are transferred out from the process module PM12 by the transfer robot TR2. For example, the controller CU controls each unit of the processing system PS to transfer out from the process module PM12 the edge ring FR and the cover ring CR placed on the stage in the process module PM12. Subsequently, the gate valve G4 is opened, and the edge ring FR and the cover ring CR transferred out from the process module PM12 are stored in the storage module SM by the transfer robot TR2. For example, the controller CU controls each unit of the processing system PS to transfer the edge ring FR and the cover ring CR out from the inside of the process module PM2 and store them in the storage module SM by the transfer method illustrated in FIGS. 18A to 18D.

The second cleaning step S33 is a step of cleaning the surface of the stage of the process module PM12 on which an edge ring FR and a cover ring CR are to be placed. In the second cleaning step S33, the controller CU controls the gas introduction system, the exhaust system, the power introduction system, and the like to perform a cleaning process on the surface of the stage of the process module PM12 on which an edge ring FR and a cover ring CR are to be placed. The cleaning process in the second cleaning step S33 can be performed by, for example, the same method as that in the first cleaning step S31. That is, as the process gas, for example, an $O_2$ gas, a CF-based gas, a $N_2$ gas, an Ar gas, a He gas, or a mixture gas of two or more thereof may be used. When the cleaning process is performed on the process module PM12, depending on the process conditions, the cleaning process may be performed in a state where a substrate W such as a dummy wafer is placed on the upper surface of the electrostatic chuck 112 in order to protect the electrostatic chuck 112 of the stage. The second cleaning step S33 may be omitted.

The transfer-into step S34 is a step of transferring an edge ring FR and a cover ring CR into the process module PM12 and placing them on the stage without opening the process module PM12 to the atmosphere. In the transfer-into step S34, the controller CU controls each unit of the processing system PS so that an edge ring FR and a cover ring CR are transferred into the process module PM12 without opening the process module PM12 to the atmosphere. Specifically, the gate valve G4 is opened, and an edge ring FR and a cover ring CR for replacement stored in the storage module SM are transferred out therefrom by the transfer robot TR2. Subsequently, the gate valve G1 is opened, and the edge ring FR and the cover ring CR for replacement are transferred into the process module PM12 by the transfer robot TR2 and placed on the stage. For example, the controller CU controls each unit of the processing system PS to place the edge ring FR and the cover ring CR stored in the storage module SM on the stage in the process module PM12 by the transfer method illustrated in FIGS. 19A to 19D.

In the seasoning step S35, the process module PM12 is seasoned. In the seasoning step S35, the controller CU controls the gas introduction system, the exhaust system, the power introduction system, and the like to perform a seasoning process on the process module PM12. The seasoning process is a process for stabilizing the temperature in the process module PM12 by performing a given plasma process. In the seasoning step S35, after the seasoning process of the process module PM12, a wafer for quality control may be transferred into the process module PM12 and a given process may be performed on the wafer for quality control. Thus, it is possible to confirm whether or not the state of the process module PM12 is normal. The seasoning step S35 may be omitted.

As described above, according to the processing system PS of the embodiment, an edge ring FR and a cover ring CR are transferred out from the process module PM12 by the transfer robot TR2 without opening the process module PM12 to the atmosphere. Thereafter, the inside of the process module PM12 is cleaned, and then, an edge ring FR and a cover ring CR are transferred into the process module PM12 by the transfer robot TR2. Thus, replacement of an edge ring FR and a cover ring CR together at the same time is possible without an operator manually replacing the edge ring FR and the cover ring CR. Therefore, the time required for replacing the edge ring FR and the cover ring CR can be shortened, and the productivity is improved. In addition, because the surface on which an edge ring FR and a cover ring CR will be placed is cleaned before the edge ring FR and the cover ring CR are transferred thereto, it is possible to reduce deposits present between the edge ring FR and the cover ring CR and the surface on which the edge ring FR and the cover ring CR are placed. As a result, the temperature controllability of the edge ring FR and the cover ring CR can be satisfactorily maintained because the contact therebetween becomes satisfactory.

Figure 26:
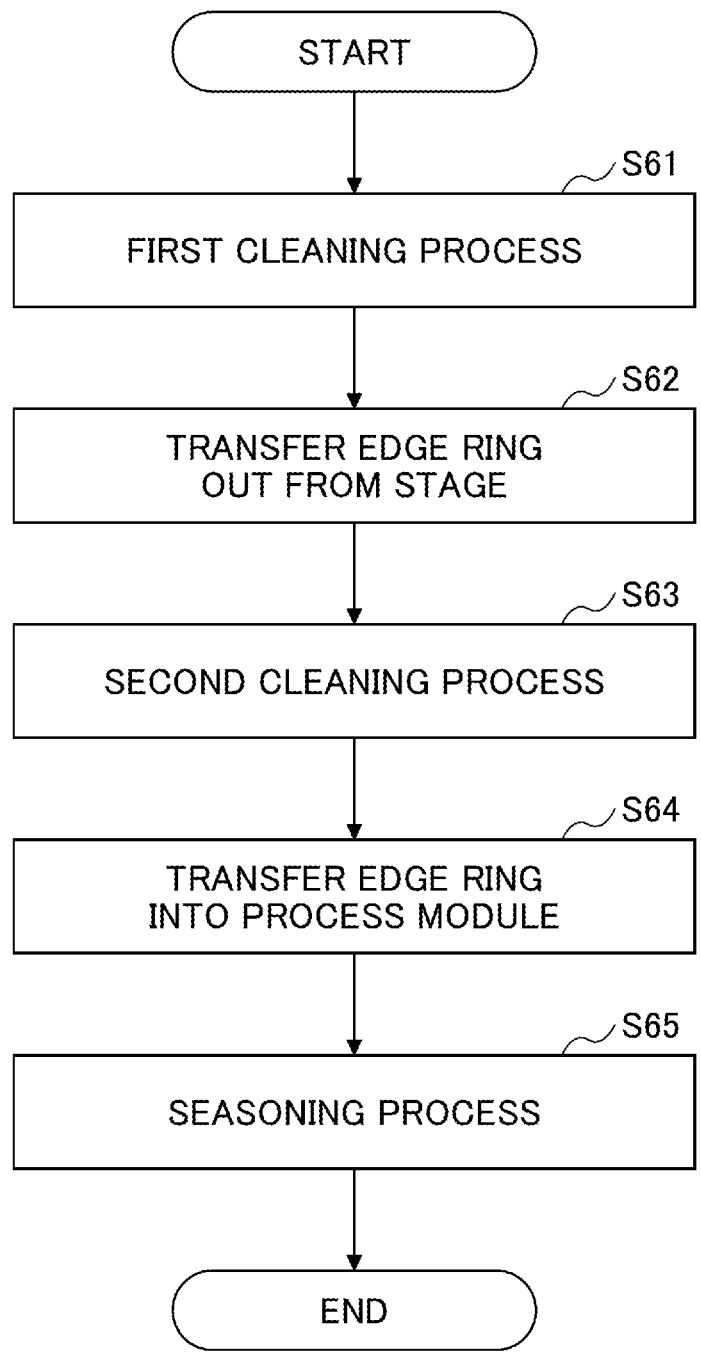
FIG. 26 is a flowchart depicting an example of the sole transfer mode.

Next, the details of step S60 will be described with reference to FIG. 26. Step S60 includes a first cleaning step S61, a transfer-out step S62, a second cleaning step S63, a transfer-into step S64, and a seasoning step S65. Hereinafter, each step will be described.

The first cleaning step S61 is a step of performing a cleaning process on the process module PM12. In the first cleaning step S61, the controller CU performs the cleaning process of the process module PM12 by controlling the gas introduction system, the exhaust system, the power introduction system, and the like. The cleaning process is a process of removing, by plasma of a process gas or the like, deposits generated through plasma process in the process module PM12 and stabilizing the process module PM12 in a clean state. By performing the first cleaning step S61, it is possible to reduce upward swirling of deposits in the process module PM12 occurring when an edge ring FR is transferred out from the stage in the transfer-out step S62. As the process gas, it may be possible to use, for example, an $O_2$ gas, a CF-based gas, a $N_2$ gas, an Ar gas, a He gas, or a mixture gas of two or more thereof. When the cleaning process is performed on the process module PM12, depending on the process conditions, the cleaning process may be performed in a state where a substrate W such as a dummy wafer is placed on the upper surface of the electrostatic chuck 112 in order to protect the electrostatic chuck 112 of the stage. In a case where there is no possibility of deposits swirling upwards, i.e., for example, there are no deposits in the process module PM12, the first cleaning step S61 may be omitted. When the edge ring FR has been attracted to the stage by the electrostatic chuck 112, a static electricity removal process is performed until the next transfer-out step S62 starts. During the first cleaning step S61, the edge ring FR and/or the cover ring CR may be raised away from the electrostatic chuck 112 and the insulators 115 in order to remove deposits from the back side of the edge ring FR and/or the cover ring CR. During the first cleaning step S61, a state may be changed between a state where the edge ring FR and the cover ring CR have been lifted up and a state where the edge ring FR and the cover ring CR have not been lifted up. Thus, in the first cleaning step S61, the cleaning process may be performed in a state where the edge ring FR and the cover ring CR have been lifted up and/or in a state where the edge ring FR and the cover ring CR have not been lifted up.

The transfer-out step S62 is a step of transferring the edge ring FR out from the process module PM12 without opening the process module PM12 to the atmosphere. In the transfer-out step S62, the controller CU controls each unit of the processing system PS so as to transfer the edge ring FR out from the process module PM12 without opening the process module PM12 to the atmosphere. Specifically, the gate valve G1 is opened, and the edge ring FR placed on the stage inside the process module PM12 is transferred out from the process module PM12 by the transfer robot TR2. For example, the controller CU controls each unit of the processing system PS to transfer the edge ring FR placed on the stage in the process module PM12 out from the process module PM12. Subsequently, the gate valve G4 is opened, and the edge ring FR transferred out from the process module PM12 is stored in the storage module SM by the transfer robot TR2. For example, the controller CU controls each unit of the processing system PS to transfer out the edge ring FR from the inside of the process module PM2 and store the edge ring FR in the storage module SM through the transfer method illustrated in FIGS. 20A to 21D.

The second cleaning step S63 is a step of cleaning the surface of the stage of the process module PM12 on which the edge ring FR is to be placed. In the second cleaning step S63, the controller CU controls the gas introduction system, the exhaust system, the power introduction system, and the like to perform a cleaning process on the surface of the stage of the process module PM12 on which the edge ring FR is to be placed. The cleaning process in the second cleaning step S63 can be performed by, for example, the same method as that in the first cleaning step S61. That is, as a process gas, for example, a $O_2$ gas, a CF-based gas, a $N_2$ gas, an Ar gas, a He gas, or a mixture gas of two or more thereof may be used. When the cleaning process is performed on the process module PM12, depending on the process conditions, the cleaning process may be performed in a state where a substrate W such as a dummy wafer is placed on the upper surface of the electrostatic chuck 112 in order to protect the electrostatic chuck 112 of the stage. Note that the second cleaning step S63 may be omitted.

The transfer-into step S64 is a step of transferring an edge ring FR into the process module PM12 without opening the process module PM12 to the atmosphere and placing the edge ring FR on the stage. In the transfer-into step S64, the controller CU controls each unit of the processing system PS so that the edge ring FR is transferred into the process module PM12 without opening the process module PM12 to the atmosphere. Specifically, the gate valve G4 is opened, and the edge ring FR for replacement stored in the storage module SM is transferred out therefrom by the transfer robot TR2. Subsequently, the gate valve G1 is opened, and an edge ring FR for replacement is transferred into the process module PM12 by the transfer robot TR2 and placed on the stage. For example, the controller CU controls each unit of the processing system PS to place the edge ring FR having been stored in the storage module SM on the stage in the process module PM12 by the transfer method illustrated in FIGS. 22A to 23D.

In the seasoning step S65, the process module PM12 is seasoned. In the seasoning step S65, the controller CU controls the gas introduction system, the exhaust system, the power introduction system, and the like to perform the seasoning process on the process module PM12. The seasoning process is a process for stabilizing the temperature in the process module PM12 by performing a given plasma process. With regard to the seasoning step S65, after the seasoning process of the process module PM12, a wafer for quality control may be transferred into the process module PM12 and a given process may be performed on the wafer for quality control. Thus, it is possible to confirm whether or not the state of the process module PM12 is normal. Note that the seasoning step S65 may be omitted.

Thus, according to the processing system PS of the embodiment, an edge ring FR is transferred out from the process module PM12 by the transfer robot TR2 without opening the process module PM12 to the atmosphere. Thereafter, the inside of the process module PM12 is cleaned, and then, an edge ring FR is transferred into the process module PM12 by the transfer robot TR2. Thus, only an edge ring FR can be solely replaced without manually replacing the edge ring FR by an operator. Therefore, the time required for replacing an edge ring FR can be shortened, and the productivity is improved. In addition, because the surface on which an edge ring FR is to be placed is cleaned before the edge ring FR is transferred thereto, it is possible to reduce deposition of deposits between the edge ring FR and the surface on which the edge ring FR is placed. As a result, the temperature controllability of the edge ring FR can be satisfactorily maintained because the contact therebetween becomes satisfactory.

Figure 27:
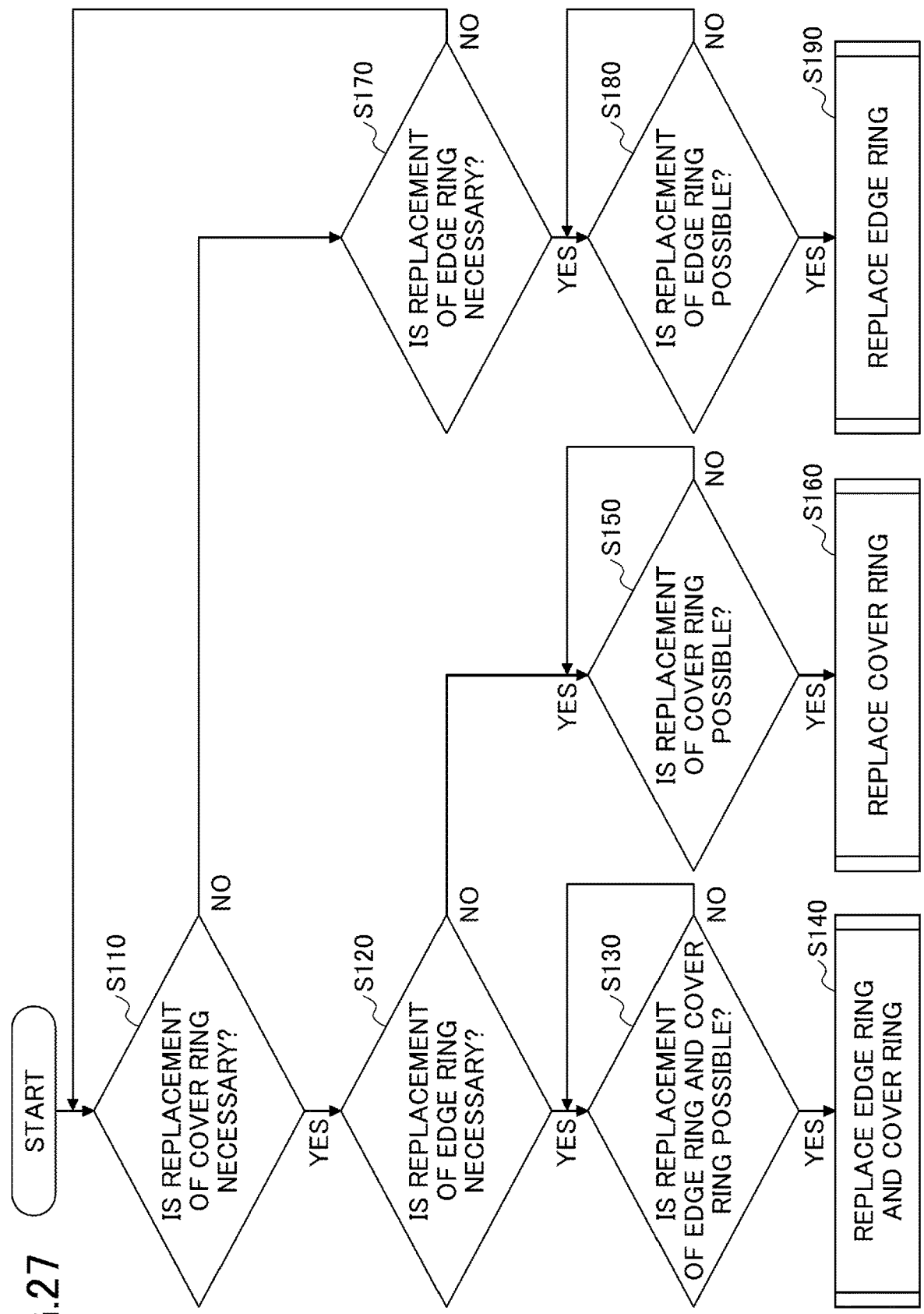
FIG. 27 is a flowchart depicting another example of the method of replacing a consumable member according to the embodiment.

Another example of the method of replacing a consumable member according to the embodiment will now be described with reference to FIG. 27. FIG. 27 is a flowchart illustrating another example of the method of replacing a consumable member according to the embodiment. Hereinafter, a case where a consumable member in the process module PM12 is replaced will be described as an example. The consumable member replacement method according to the embodiment illustrated in FIG. 27 is performed by the controller CU controlling each unit of the processing system PS.

In step S110, the controller CU determines whether or not replacement of a cover ring CR is necessary. In step S110, for example, a determination method similar to that of step S10 described above can be used.

If it is determined in step S110 that replacement of a cover ring CR is necessary, the controller CU advances the process to step S120. On the other hand, if it is determined in step S110 that replacement of the cover ring CR is not necessary, the controller CU advances the process to step S170.

In step S120, the controller CU determines whether or not replacement of an edge ring FR is necessary. In the present embodiment, the controller CU determines whether or not replacement of an edge ring FR is necessary based on, for example, the RF integrated time, the RF integrated power, and the integrated value of the specific step of the recipe described above. The controller CU may determine whether or not replacement of an edge ring FR is necessary by detecting the height position of the edge ring FR using, for example, an optical device.

If it is determined in step S120 that replacement of an edge ring FR is necessary, the controller CU advances the process to step S130. On the other hand, if it is determined in step S120 that replacement of an edge ring FR is not necessary, the controller CU advances the process to step S150.

In step S130, the controller CU determines whether or not replacement of the edge ring FR and the cover ring CR is possible. In step S130, for example, a determination method similar to that of step S20 described above can be used.

If it is determined in step S130 that replacement of the edge ring FR and the cover ring CR is possible, the controller CU advances the process to step S140. On the other hand, if it is determined in step S130 that replacement of the edge ring FR and the cover ring CR together at the same time is not possible, the controller CU performs step S130 again.

In step S140, the controller CU selects the simultaneous transfer mode and causes the transfer robot TR2 to simultaneously transfer the edge ring FR and the cover ring CR. In step S140, for example, the same transfer method as that of step S30 described above can be used.

In step S150, the controller CU determines whether or not replacement of the cover ring CR is possible. In the present embodiment, the controller CU determines replacement of a cover ring CR is possible, for example, when a substrate W is not being performed in the process module PM12 for which replacement of a cover ring CR will be performed. On the other hand, when the substrate W is being processed in the process module PM12, the controller CU determines that replacement of the cover ring CR is not possible. The controller CU may determine that replacement of the cover ring CR is possible, for example, when processing of substrates W of the same lot as a substrate W that is being processed, in the process module PM12 for which replacement of the cover ring CR is to be performed, has been completed. In this case, the controller CU determines that replacement of the cover ring CR is not possible until processing of the substrates W of the same lot as the substrate W that is being processed in the process module PM12 has been completed.

If it is determined in step S150 that replacement of the cover ring CR is possible, the controller CU advances the process to step S160. On the other hand, if it is determined in step S150 that replacement of the cover ring CR is not possible, the controller CU performs step S150 again.

In step S160, the controller CU causes the transfer robot TR2 to perform an operation of replacing only the cover ring CR. Details of step S160 will be described later.

In step S170, the controller CU determines whether or not replacement of an edge ring FR is necessary. In the present embodiment, the controller CU determines whether or not replacement of an edge ring FR is necessary based on, for example, the RF integrated time, the RF integrated power, and the integrated value of the specific step of the recipe described above. The controller CU may determine whether or not replacement of an edge ring FR is necessary by detecting the height position of the edge ring FR using, for example, an optical device.

If it is determined in step S170 that replacement of an edge ring FR is necessary, the controller CU advances the process to step S180. On the other hand, if it is determined that replacement of an edge ring FR is not necessary, the controller CU returns the process to step S110.

In step S180, the controller CU determines whether or not replacement of the edge ring FR is possible. In step S180, for example, a determination method similar to that of step S50 described above can be used.

In step S180, if it is determined that replacement of the edge ring FR is possible, the controller CU advances the process to step S190. On the other hand, if it is determined in step S180 that replacement of the edge ring FR is not possible, the controller CU performs step S180 again.

In step S190, the controller CU selects the sole transfer mode and causes the transfer robot TR2 to transfer only the edge ring FR. In step S190, for example, the same transfer method as that of step S60 described above can be used.

Figure 28:
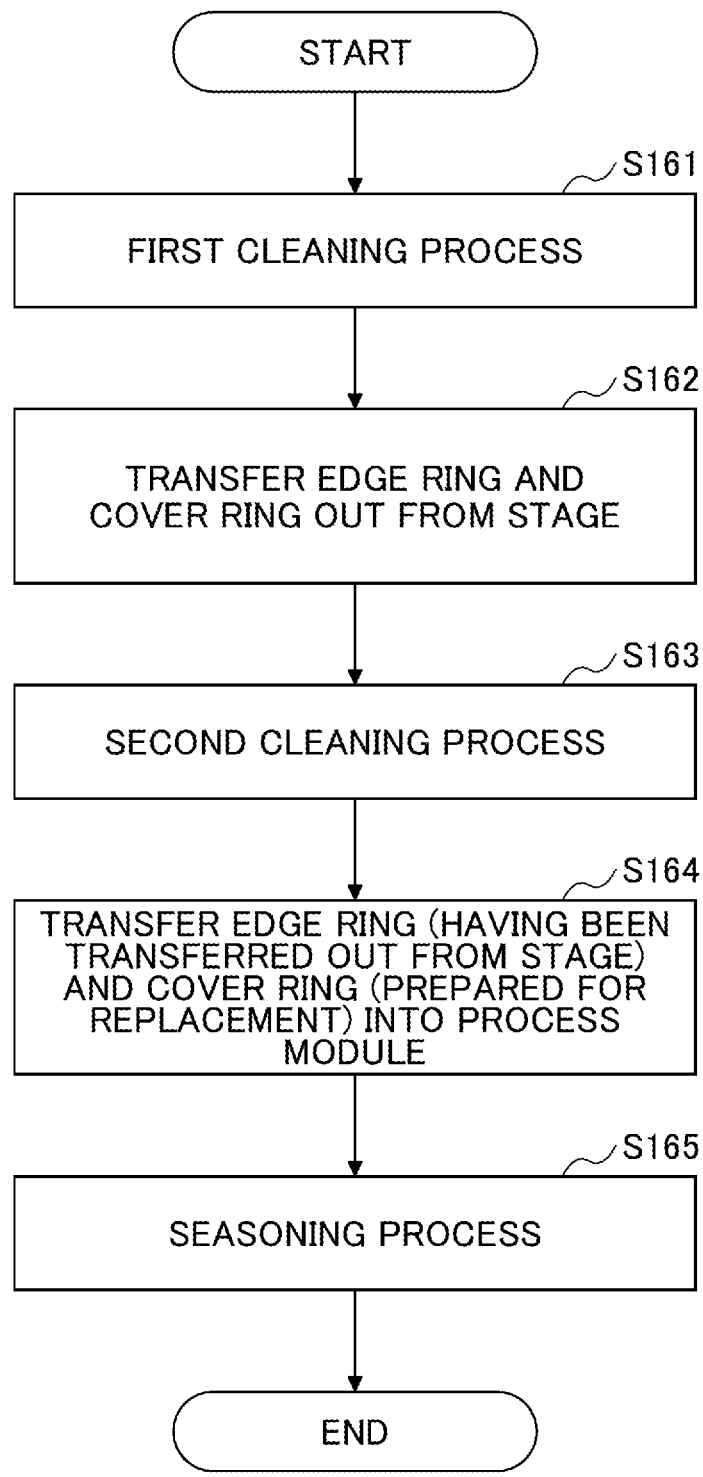
FIG. 28 is a flowchart depicting another example of the sole transfer mode.

Next, details of step S160 will now be described with reference to FIG. 28. The step S160 includes a first cleaning step S161, a transfer-out step S162, a second cleaning step S163, a transfer-into step S164, and a seasoning step S165. Hereinafter, each step will be described.

The first cleaning step S161 is a step of performing cleaning on the process module PM12. In the first cleaning step S161, the controller CU performs a cleaning process on the process module PM12 by controlling the gas introduction system, the exhaust system, the power introduction system, and the like. The cleaning process is a process of removing, by plasma of a process gas or the like, deposits generated by plasma process in the process module PM12 and stabilizing the process module PM12 in a clean state. By performing the first cleaning step S161, when an edge ring FR and a cover ring CR are transferred out from the stage in the transfer-out step S162, it is possible to reduce upward swirling of deposits that are present in the process module PM12. As the process gas, it may be possible to use, for example, a $O_2$ gas, a CF-based gas, a $N_2$ gas, an Ar gas, a He gas, or a mixture gas of two or more thereof. When the cleaning process is performed on the process module PM12, depending on the process conditions, the cleaning process may be performed in a state where a substrate W such as a dummy wafer is placed on the upper surface of the electrostatic chuck 112 in order to protect the electrostatic chuck 112 of the stage. In a case where there is no possibility of deposits swirling upwards, i.e., for example, when deposits do not exist in the process module PM12, the first cleaning step S161 may be omitted. When an edge ring FR is attracted to the stage by the function of the electrostatic chuck 112, a static electricity removal process is performed until the next transfer-out step S162 starts. During the first cleaning step S161, an edge ring FR and/or a cover ring CR may be raised away from the electrostatic chuck 112 and the insulator 115 in order to remove deposits from the back sides of the edge ring FR and/or the cover ring CR. During the first cleaning step S161, the state may be changed between a state where an edge ring FR and a cover ring CR have been lifted up and a state where the edge ring FR and the cover ring CR have not been lifted up. Thus, in the first cleaning step S161, the cleaning process may be performed in a state where an edge ring FR and a cover ring CR have been lifted up and/or in a state where the edge ring FR and the cover ring CR have not been lifted up.

The transfer-out step S162 is a step of transferring an edge ring FR and a cover ring CR out from the inside of the process module PM12 without opening the process module PM12 to the atmosphere. In the transfer-out step S162, the controller CU controls each unit of the processing system PS so as to transfer an edge ring FR and a cover ring CR out from the process module PM12 without opening the process module PM12 to the atmosphere. Specifically, the gate valve G1 is opened, and the edge ring FR and the cover ring CR placed on the stage inside the process module PM12 are simultaneously transferred out from the process module PM12 by the transfer robot TR2. For example, the controller CU controls each unit of the processing system PS to simultaneously transfer the edge ring FR and the cover ring CR placed on the stage in the process module PM12 out therefrom. Subsequently, the gate valve G4 is opened, and the edge ring FR and the cover ring CR transferred out from the process module PM12 are simultaneously stored in the storage module SM by the transfer robot TR2. For example, the controller CU controls each unit of the processing system PS to transfer the edge ring FR and the cover ring CR out from the inside of the process module PM12 and store them in the storage module SM by the transfer method illustrated in FIGS. 18A to 18D.

In the transfer-out step S162, the edge ring FR and the cover ring CR may be separately transferred out from the process module PM12. For example, the controller CU may control each unit of the processing system PS to transfer the edge ring FR placed on the stage in the process module PM12 out therefrom and then transfer the cover ring CR placed on the stage in the process module PM12 out therefrom.

The second cleaning step S163 is a step of cleaning the surface of the stage of the process module PM12 on which an edge ring FR and a cover ring CR are to be placed. In the second cleaning step S163, the controller CU controls the gas introduction system, the exhaust system, the power introduction system, and the like to perform the cleaning process on the surface of the stage of the process module PM12 on which the edge ring FR and the cover ring CR are to be placed. The cleaning process in the second cleaning step S163 can be performed by, for example, the same method as that in the first cleaning step S161. That is, the process gas, for example, an $O_2$ gas, a CF-based gas, a $N_2$ gas, an Ar gas, a He gas, or a mixture gas of two or more thereof may be used. When the cleaning process is performed on the process module PM12, depending on the process conditions, the cleaning process may be performed in a state where a substrate W such as a dummy wafer is placed on the upper surface of the electrostatic chuck 112 in order to protect the electrostatic chuck 112 of the stage. The second cleaning step S163 may be omitted.

The transfer-into step S164 is a step of transferring the edge ring FR having been transferred out from the process module PM in the transfer-out step S162 and a cover ring CR for replacement into the process module PM12 without opening the process module PM12 to the atmosphere, and placing the edge ring FR and the cover ring CR on the stage. In the transfer-into step S164, the controller CU controls each unit of the processing system PS so that the edge ring FR that has been transferred out from the process module PM in the transfer-out step S162 and the cover ring CR for replacement are transferred into the process module PM12 without opening the process module PM12 to the atmosphere. Specifically, the gate valve G4 is opened, and the used edge ring FR once transferred out from the process module PM12 and stored in the storage module SM in the transfer-out step S162 and the cover ring CR for replacement stored in the storage module SM are transferred out therefrom by the transfer robot TR2. Subsequently, the gate valve G1 is opened, and the used edge ring FR and the cover ring CR for replacement are transferred into the process module PM12 by the transfer robot TR2 and are placed on the stage. For example, the controller CU controls each unit of the processing system PS to place on the stage in the process module PM12 the used edge ring FR and the cover ring CR for replacement having been stored in the storage module SM, through the transfer method illustrated in FIGS. 19A to 19D.

In the transfer-into step S164, the edge ring FR and the cover ring CR may be separately transferred into the process module PM12. For example, the controller CU may control each unit of the processing system PS to place the cover ring CR on the stage inside the process module PM12 and then place the edge ring FR on the stage inside the process module PM12.

In the seasoning step S165, the process module PM12 is seasoned. In the seasoning step S165, the controller CU controls the gas introduction system, the exhaust system, the power introduction system, and the like to perform the seasoning process of the process module PM12. The seasoning process is a process for stabilizing the temperature in the process module PM12 by performing a given plasma process. Further, with regard to the seasoning step S165, after the seasoning process of the process module PM12, a wafer for quality control may be transferred into the process module PM12 and a given process may be performed on the wafer for quality control. Thus, it is possible to confirm whether or not the state of the process module PM12 is normal. The seasoning step S165 may be omitted.

[First Modification]

Figure 30:
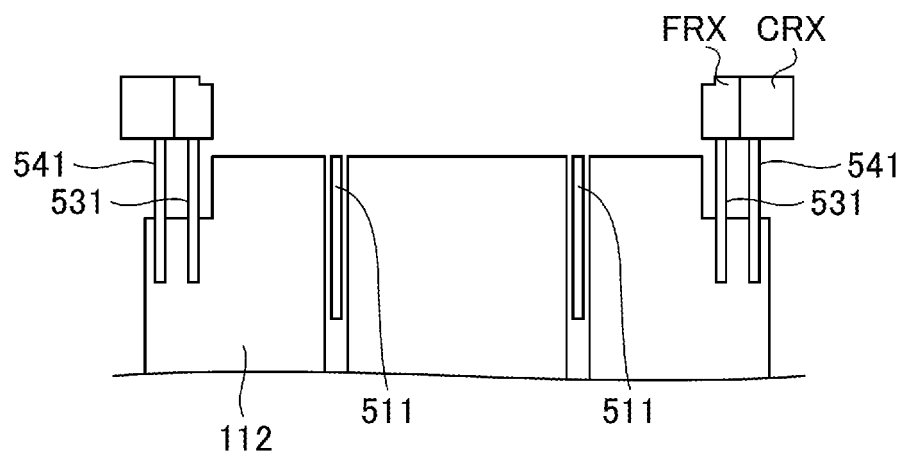
FIG. 30 is a view depicting a state of a lifter in the simultaneous transfer mode according to a first variant.
Figure 31:
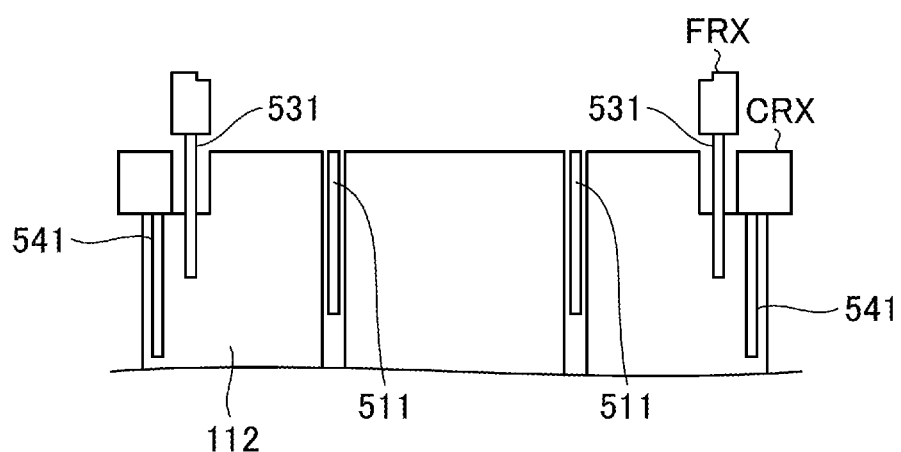
FIG. 31 is a view depicting a state of the lifter in the sole transfer mode according to the first variant.

Another example of the plasma process apparatus used as each of the process modules PM1 to PM12 included in the processing system PS of FIG. 1 will be described with reference to FIGS. 29 to 31.

The plasma process apparatus 1X includes a plasma process chamber 10X and a lifter 50X instead of the plasma process chamber 10 and the lifter 50 of the plasma process apparatus 1. Other configurations may be the same as those of the plasma process apparatus 1.

The plasma process chamber 10X includes a substrate support 11X and an upper electrode 12. The substrate support 11X is disposed in a lower region of the plasma process space 10s within the plasma process chamber 10X. The upper electrode 12 may be disposed above the substrate support 11X and may act as a part of a top plate of the plasma process chamber 10X.

The substrate support 11X supports a substrate W in the plasma process space 10s. The substrate support 11X may include a lower electrode 111, an electrostatic chuck 112, a ring assembly 113X, an insulator 115, and a base 116. The electrostatic chuck 112 is disposed on the lower electrode 111. The electrostatic chuck 112 supports the substrate W on an upper surface thereof. The ring assembly 113X includes an edge ring FRX and a cover ring CRX. The edge ring FRX has an annular shape and is placed around the substrate W on the upper surface of the peripheral portion of the lower electrode 111. The edge ring FRX improves, for example, the uniformity of plasma process. The cover ring CRX has an annular shape and is placed on the outer peripheral portion of the edge ring FRX. The cover ring CRX protects the upper surface of the insulator 115 from, for example, plasma. In the example of FIG. 29, the outer diameter of the edge ring FRX is smaller than or equal to the inner diameter of the cover ring CRX. That is, the edge ring FRX and the cover ring CRX do not overlap with each other in plan view. As a result, the edge ring FRX and the cover ring CRX move up and down independently. The insulator 115 is disposed on the base 116 to surround the lower electrode 111. The base 116 is secured to the bottom of the plasma process chamber 10X and supports the lower electrode 111 and the insulator 115.

The lifter 50X raises and lowers the substrate W, the edge ring FRX, and the cover ring CRX. The lifter 50X includes a first lifter 51, a third lifter 53, and a fourth lifter 54.

The first lifter 51 includes a plurality of support pins 511 and an actuator 512. The plurality of support pins 511 are inserted into through-holes H1 formed in the lower electrode 111 and the electrostatic chuck 112 so as to protrude into and retreat from the upper surface of the electrostatic chuck 112. The plurality of support pins 511 protrude and retreat with respect to the upper surface of the electrostatic chuck 112 so as to support the substrate W with the upper ends thereof in contact with the lower surface of the substrate W. The actuator 512 raises and lowers the plurality of support pins 511. As the actuator 512, a motor such as a DC motor, a stepper motor, or a linear motor, an air driving mechanism such as an air cylinder, a piezoelectric actuator, or the like can be used. For example, when the substrate W is transferred between the transfer robots TR1 and TR2 and the substrate support 11, the first lifter 51 raises and lowers the plurality of support pins 511.

The third lifter 53 includes a plurality of support pins 531 and an actuator 532. The plurality of support pins 531 are inserted into through-holes H3 formed in the insulator 115 so as to protrude into and retreat from the upper surface of the insulator 115. The plurality of support pins 531 support an edge ring FRX by protruding from the upper surface of the insulator 115 and causing the upper ends thereof to come into contact with the lower surface of the edge ring FRX. The actuator 532 raises and lowers the plurality of support pins 531. As the actuator 532, for example, an actuator similar to the actuator 512 can be used.

The fourth lifter 54 includes a plurality of support pins 541 and an actuator 542. The plurality of support pins 541 are inserted into through-holes H4 formed in the insulator 115 so as to protrude into and retreat from the upper surface of the insulator 115. The plurality of support pins 541 support a cover ring CRX by protruding from the upper surface of the insulator 115 and causing the upper ends thereof to come into contact with the lower surface of the cover ring CRX. The actuator 542 raises and lowers the plurality of support pins 541. As the actuator 542, for example, an actuator similar to the actuator 512 can be used.

When transferring an edge ring FRX and a cover ring CRX between the transfer robots TR1 and TR2 and the substrate support 11, the lifter 50X raises and lowers the plurality of support pins 531 and 541. For example, when an edge ring FRX and a cover ring CRX placed on the electrostatic chuck 112 are to be transferred out from the electrostatic chuck 112 by the transfer robots TR1 and TR2, the plurality of support pins 531 and 541 are raised as illustrated in FIG. 30. Thus, the edge ring FRX is raised by the plurality of support pins 531, the cover ring CRX is raised by the plurality of support pins 541, and the edge ring FRX and the cover ring CRX can be thus simultaneously transferred out from the electrostatic chuck 112 by the transfer robots TR1 and TR2.

With regard to the lifter 50X, when only an edge ring FRX is transferred between the transfer robots TR1 and TR2 and the substrate support 11, the plurality of support pins 531 are raised and lowered. For example, when only an edge ring FRX placed on the electrostatic chuck 112 is to be transferred out from the electrostatic chuck 112 by the transfer robots TR1 and TR2, the plurality of support pins 531 are raised as illustrated in FIG. 31. Thus, only the edge ring FRX is raised by the plurality of support pins 531, and the edge ring FRX can be solely transferred out from the electrostatic chuck 112 by the transfer robots TR1 and TR2.

[Second Variant]
(Configuration)

Still another example of the plasma process apparatus used as each of the process modules PM1 to PM12 included in the processing system PS of FIG. 1 will now be described with reference to FIG. 32. Hereinafter, differences from the plasma process apparatus 1 will be mainly described.

The plasma process apparatus includes a lifter 50Y. The lifter 50Y includes a first lifter 51 and a fifth lifter 55.

The fifth lifter 55 includes a plurality of support pins 551 and an actuator (not depicted).

The support pins 551 are stepped support pins formed of columnar (solid rod-like) members. The support pins 551 include lower rod portions 552 and upper rod portions 553 in this order from the lower sides to the upper sides. The outer diameters of the lower rod portions 552 are greater than the outer diameters of the upper rod portions 553. Thus, steps are formed by the upper end surfaces 552a of the lower rod portions 552. Each of the lower rod portions 552 and the corresponding one of the upper rod portions 553 are integrally formed.

The support pins 551 are inserted through through-holes H11 formed in the lower electrode 111, through-holes H12 formed in the insulator 115, and through-holes H13 formed in a cover ring CR so as to protrude from and retract into the upper surface of the insulator 115 and the upper surface of the cover ring CR. The inner diameters of the through-holes H11 and H12 are slightly greater than the outer diameters of the lower rod portion 552. The inner diameters of the through-holes H13 are slightly larger than the outer diameters of the upper rod portions 553 and smaller than the outer diameters of the lower rod portions 552.

The support pins 551 can be changed in their positions between standby positions, first support positions, and second support positions.

The standby positions are positions at which the upper end surfaces 553a of the upper rod portions 553 are lower than the lower surfaces of an edge ring FR. When the support pins 551 are located at the standby positions, an edge ring FR and a cover ring CR are supported on the electrostatic chuck 112 and the insulator 115, respectively, without being raised by the support pins 551.

The first support positions are positions above the standby positions. The first support positions are positions at which the upper end surfaces 553a of the upper rod portions 553 protrude to above the upper surface of a cover ring CR, and the upper end surfaces 552a of the lower rod portions 552 are below the lower surfaces of the cover ring CR. When the support pins 551 move to the first support positions, the upper end surfaces 553a of the upper rod portions 553 come into contact with a recess FRr formed on the lower surface of an edge ring FR to support the edge ring FR.

The second support positions are positions above the first support positions. The second support positions are positions at which the upper end surfaces 552a of the lower rod portions 552 protrude to above the upper surface of the insulator 115. When the support pins 551 move to the second support positions, the upper end surfaces 553a of the upper rod portions 553 come into contact with the recess FRr to support an edge ring FR, and the upper end surfaces 552a of the lower rod portions 552 come into contact with the lower surface of a cover ring CR to support the cover ring CR.

The actuator raises and lowers the plurality of support pins 551. As the actuator, for example, a motor such as a DC motor, a stepper motor, or a linear motor, an air driving mechanism such as an air cylinder, or a piezoelectric actuator can be used.

When transferring an edge ring FR between the transfer robots TR1 and TR2 and the substrate support 11, the fifth lifter 55 moves the plurality of support pins 551 to the first support positions to raise the edge ring FR. When transferring an edge ring FR and a cover ring CR between the transfer robots TR1 and TR2 and the substrate support 11, the fifth lifter 55 moves the plurality of support pins 551 to the second support positions to raise the cover ring CR and the edge ring FR.

(Consumable Member Transfer Method: Simultaneous Transfer Mode)

With reference to FIGS. 33A to 36C, as another example of the consumable member transfer method in the processing system PS of the embodiment, a case where the controller CU selects and executes the simultaneous transfer mode in which the transfer robot TR2 simultaneously transfers an edge ring FR and a cover ring CR together will now be described. Specifically, a case where an edge ring FR and a cover ring CR are simultaneously transferred out from the plasma process apparatus depicted in FIG. 32 and then the edge ring FR and the cover ring CR for replacement are simultaneously transferred into the plasma process apparatus will be described.

In the following description, it is assumed that the controller 90 is included in the controller CU and the controller CU controls the transfer robot TR2 and the lifter 50Y. However, the controller 90 may be provided separately from the controller CU, the controller CU may control the transfer robot TR2, and the controller 90 may control the lifter 50Y. It is assumed that the outer peripheral portion of an edge ring FR and the inner peripheral portion of a cover ring CR overlap each other in plan view.

Figure 33A:
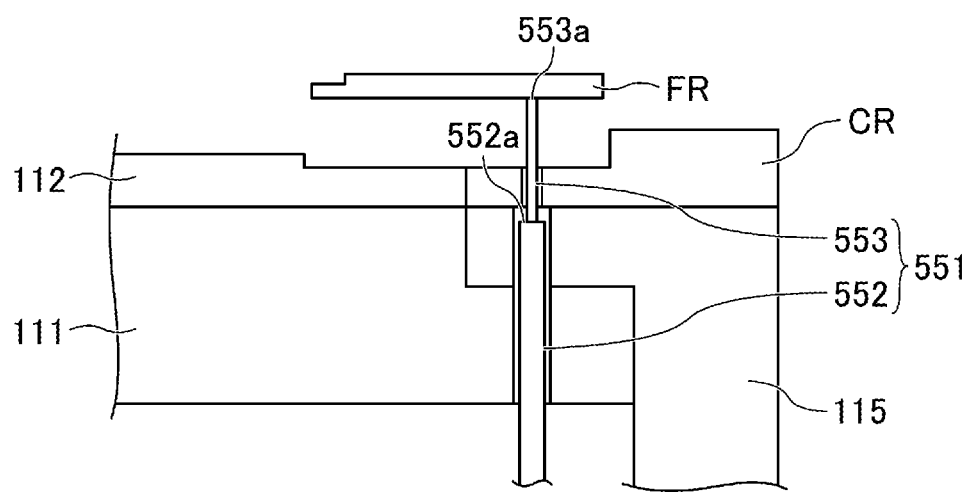
FIGS. 33A-33C are schematic cross-sectional views depicting an example of the simultaneous transfer mode according to the second variant.

First, as depicted in FIG. 33A, the controller CU raises the plurality of support pins 551 from the standby positions. As a result, the upper end surfaces 553a of the upper rod portions 553 come into contact with the lower surface of an edge ring FR, the edge ring FR is raised by the plurality of support pins 551, and the edge ring FR is removed from the electrostatic chuck 112.

Figure 33B:
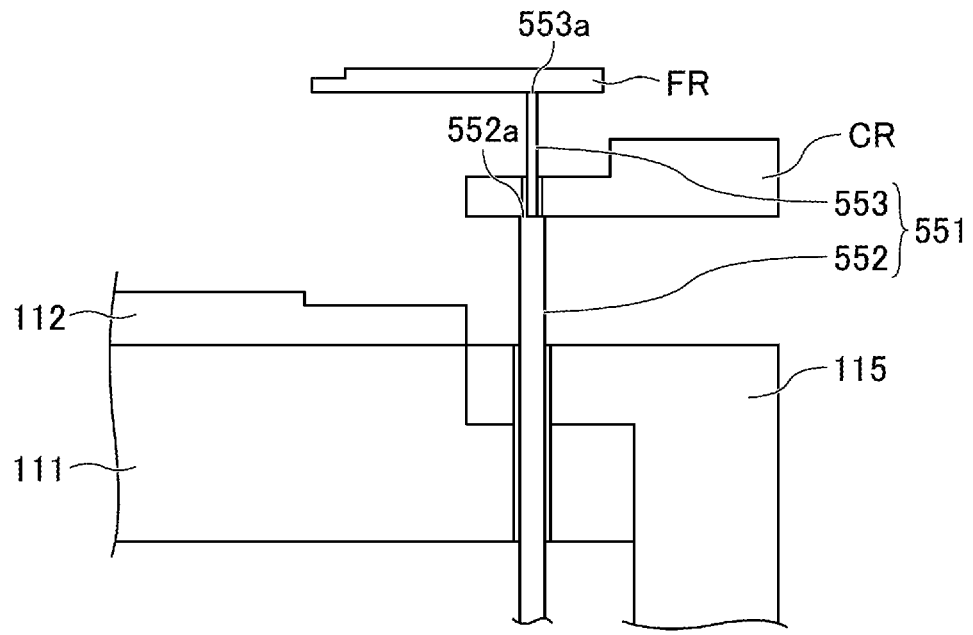

Subsequently, as depicted in FIG. 33B, the controller CU further raises the plurality of support pins 551 to the second support positions. As a result, the upper end surfaces 552a of the lower rod portions 552 come into contact with the lower surface of a cover ring CR, the cover ring CR is raised by the plurality of support pins 551, and the cover ring CR is removed from the insulator 115. Thus, when the plurality of support pins 551 are raised from the standby positions to the second support positions, the edge ring FR and the cover ring CR are raised and supported by the plurality of support pins 551 in a state where the edge ring FR and the cover ring CR are apart from each other.

Figure 33C:
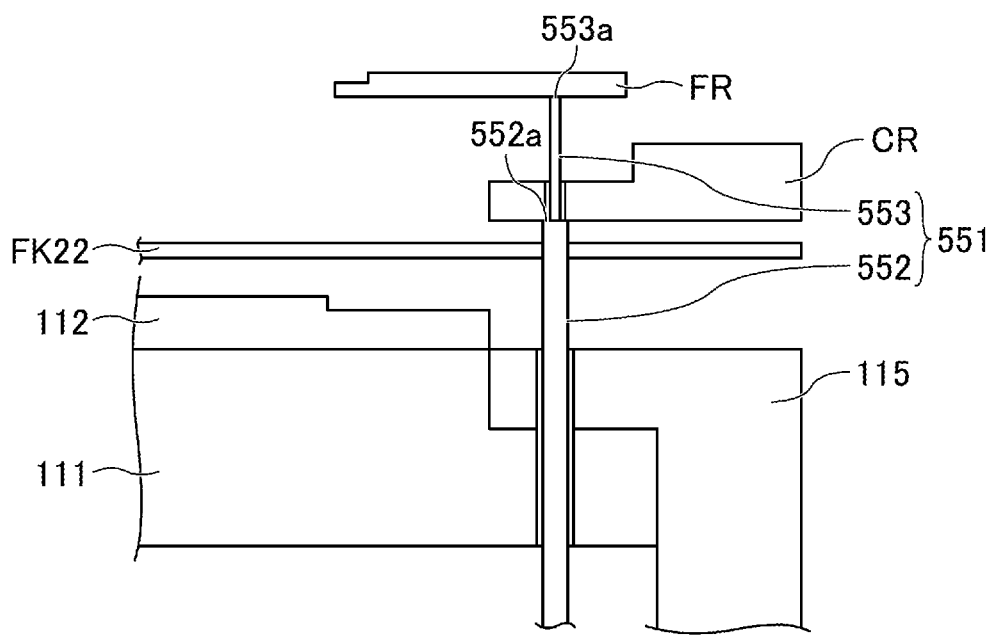

Subsequently, as depicted in FIG. 33C, the controller CU inserts the lower fork FK22, which does not hold a transfer object, between the electrostatic chuck 112 and the edge ring FR and the cover ring CR supported by the plurality of support pins 551.

Figure 34A:
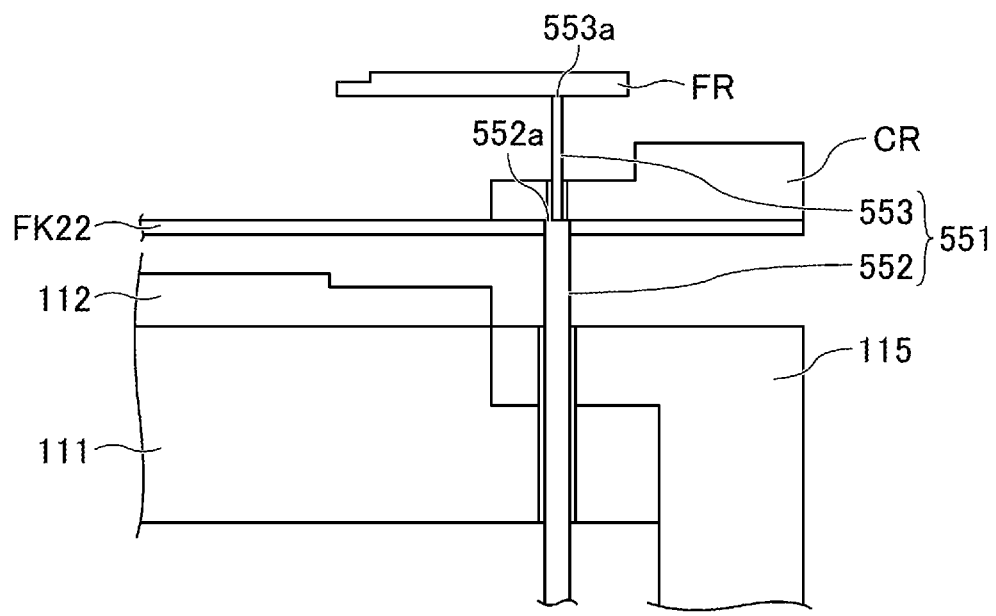
FIGS. 34A-34C are schematic cross-sectional views depicting an example of the simultaneous transfer mode according to the second variant.

Subsequently, as depicted in FIG. 34A, the controller CU lowers the plurality of support pins 551 from the second support positions. Thus, the cover ring CR supported by the plurality of support pins 551 is placed on the lower fork FK22.

Figure 34B:
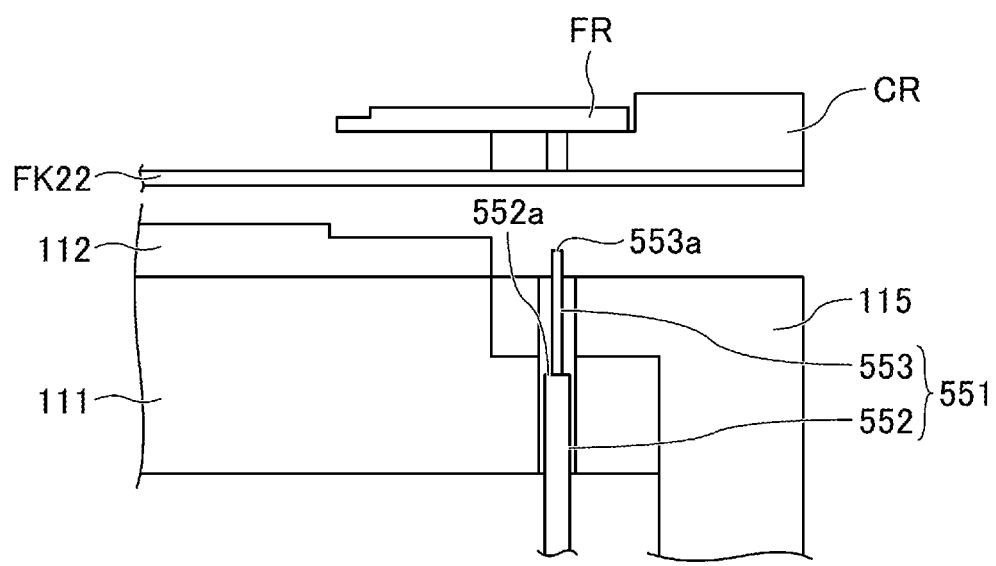

Subsequently, as depicted in FIG. 34B, the controller CU further lowers the plurality of support pins 551 to the standby positions. Thus, the edge ring FR having been supported by the plurality of support pins 551 is placed on the cover ring CR. Thus, when the plurality of support pins 551 are lowered from the second support positions to the standby positions, the edge ring FR and the cover ring CR are placed on the lower fork FK22.

Figure 34C:
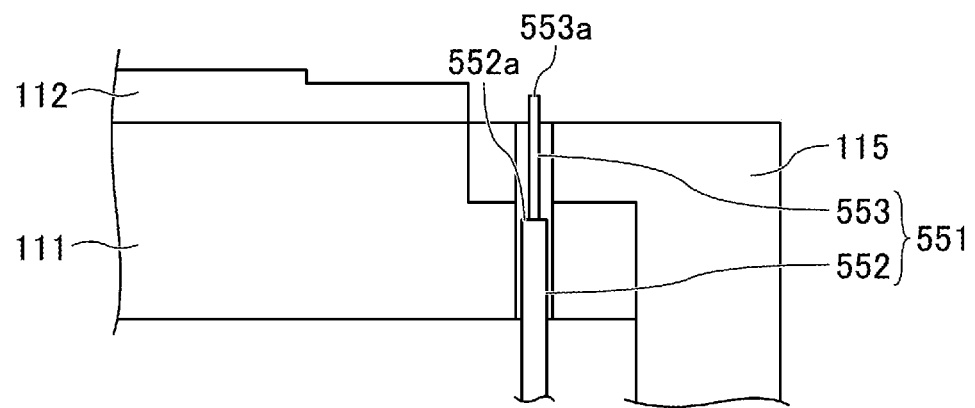

Subsequently, as depicted in FIG. 34C, the controller CU withdraws the lower fork FK22 that holds the edge ring FR and the cover ring CR.

Figure 35A:
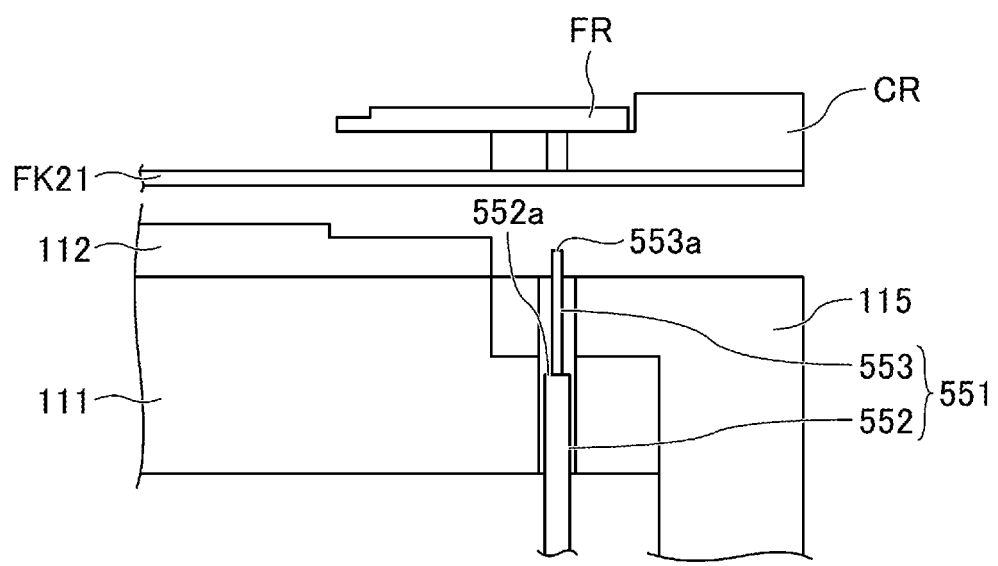
FIGS. 35A-35C are schematic cross-sectional views depicting an example of the simultaneous transfer mode according to the second variant.

Subsequently, as depicted in FIG. 35A, the controller CU inserts the upper fork FK21 that holds an edge ring FR for replacement and a cover ring CR replacement to above the electrostatic chuck 112.

Figure 35B:
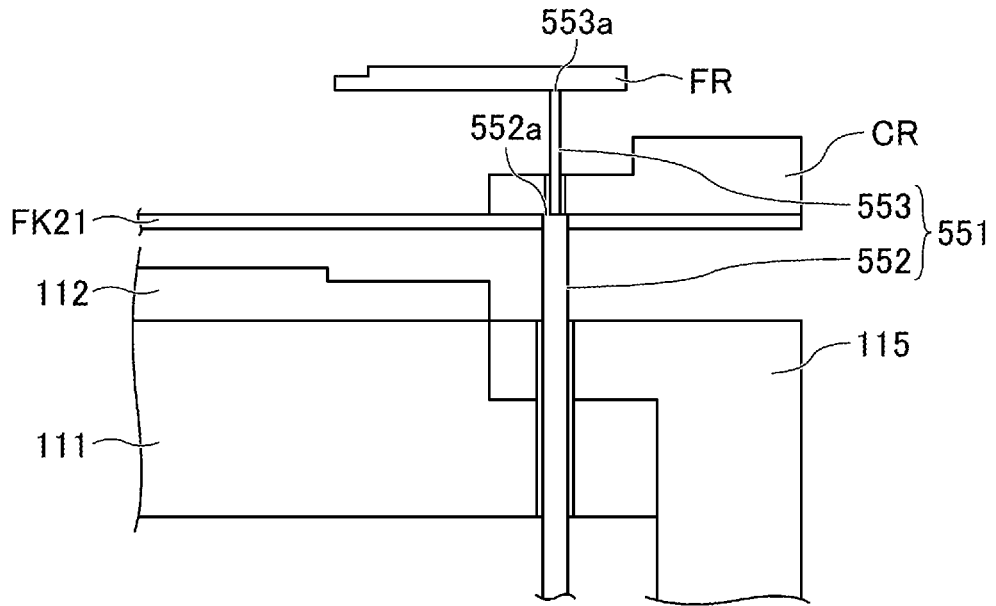

Subsequently, as depicted in FIG. 35B, the controller CU raises the plurality of support pins 551 from the standby positions. Thus, the upper end surfaces 553a of the upper rod portions 553 come into contact with the lower surface of the edge ring FR held by the upper fork FK21, the edge ring FR is raised by the plurality of support pins 551, and the edge ring FR is removed from the upper fork FK21.

Figure 35C:
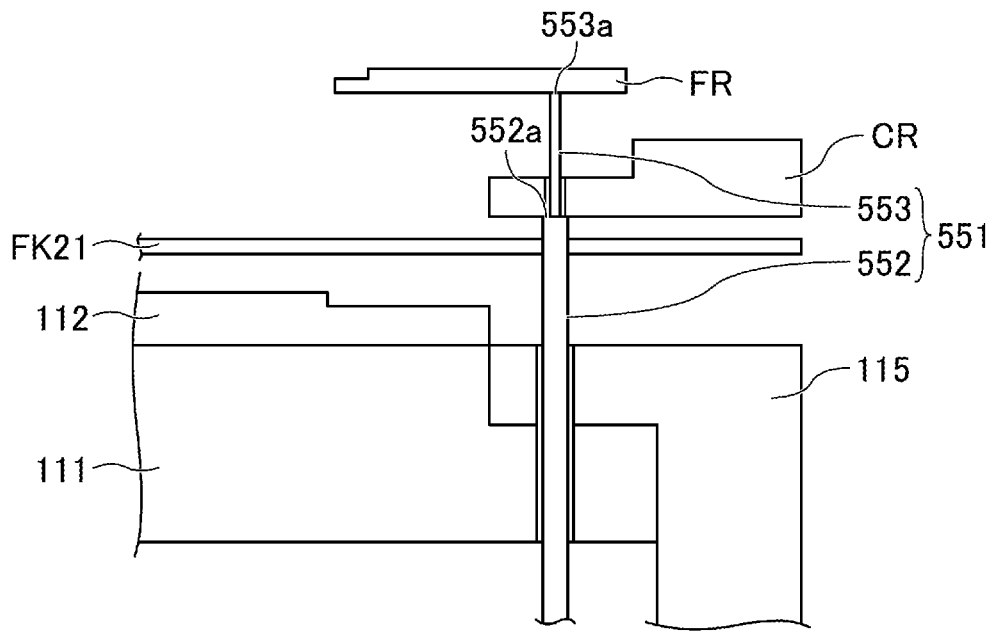

Subsequently, as depicted in FIG. 35C, the controller CU further raises the plurality of support pins 551 to the second support positions. As a result, the upper end surfaces 552a of the lower rod portions 552 come into contact with the lower surface of the cover ring CR held by the upper fork FK21, the cover ring CR is raised by the plurality of support pins 551, and the cover ring CR is removed from the upper fork FK21.

Figure 36A:
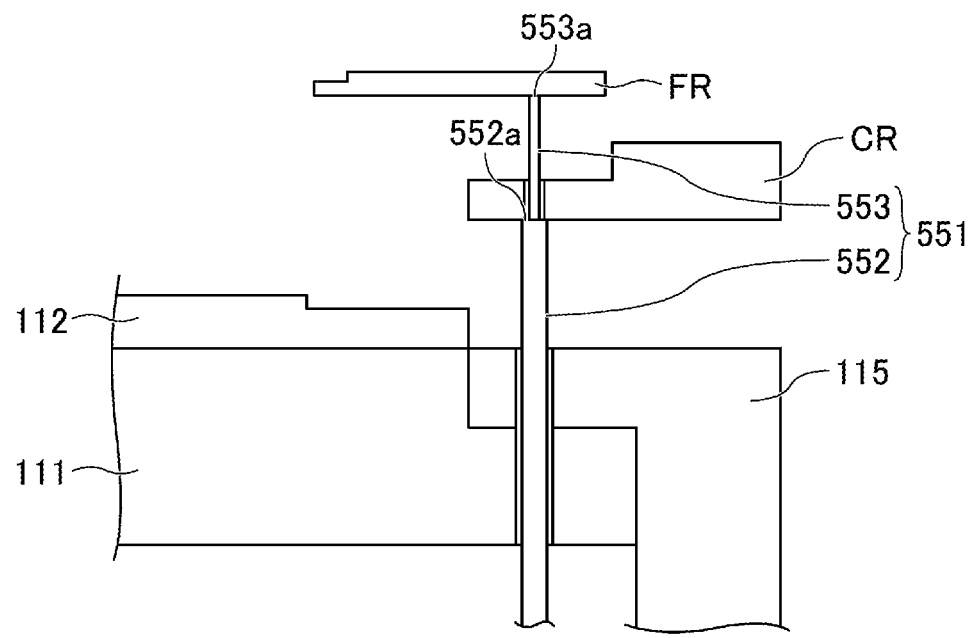
FIGS. 36A-36C are schematic cross-sectional views depicting an example of the simultaneous transfer mode according to the second variant.

Subsequently, as depicted in FIG. 36A, the controller CU causes the upper fork FK21 that does not hold a transfer object to exit.

Figure 36B:
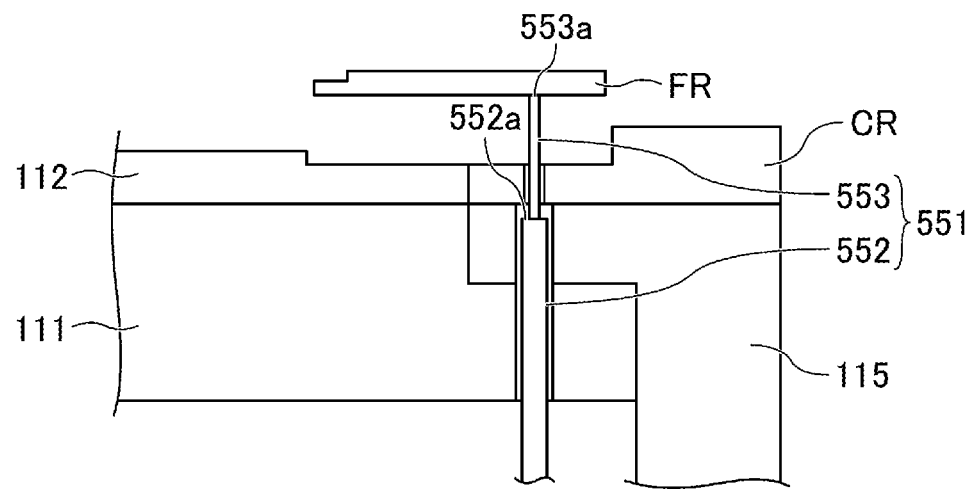

Subsequently, as depicted in FIG. 36B, the controller CU lowers the plurality of support pins 551 from the second support positions. Thus, the cover ring CR supported by the plurality of support pins 551 is placed on the insulator 115.

Figure 36C:
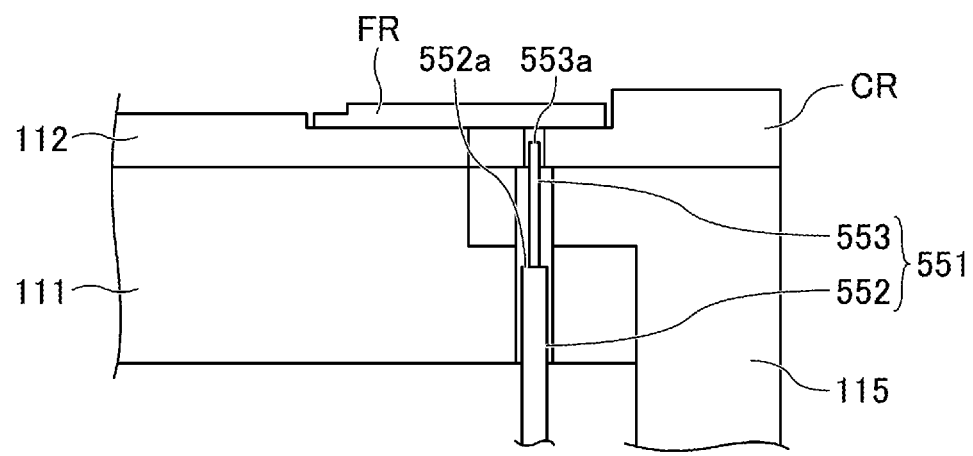

Subsequently, as depicted in FIG. 36C, the controller CU further lowers the plurality of support pins 551 to the standby positions. Thus, the edge ring FR supported by the plurality of support pins 551 is placed on the electrostatic chuck 112.

Figure 32:
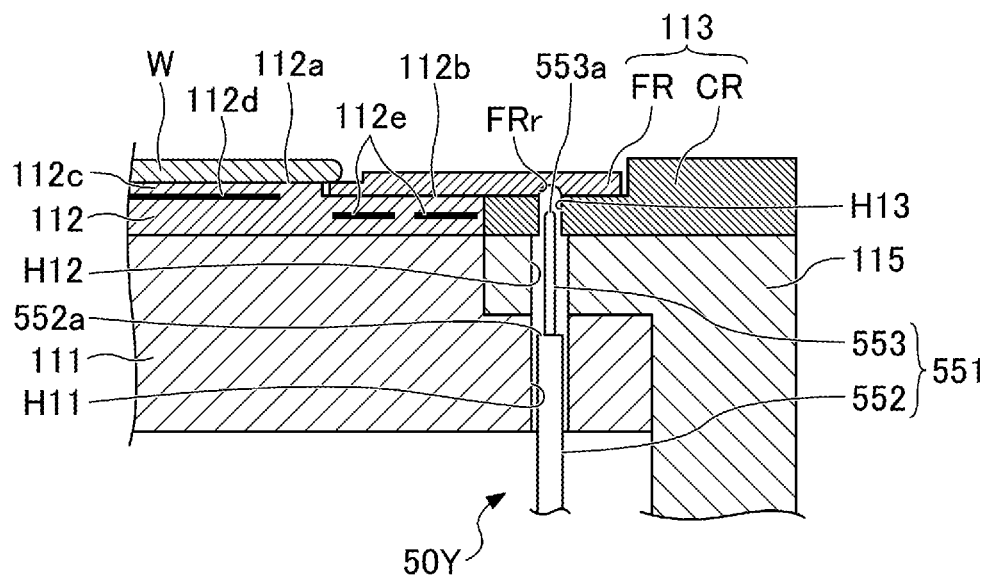
FIG. 32 is a schematic cross-sectional view depicting the process module according to a second variant of the embodiment.

Thus, also in the plasma process apparatus depicted in FIG. 32, after an edge ring FR and a cover ring CR are simultaneously transferred together out from the plasma process apparatus, an edge ring FR and a cover ring CR for replacement can be simultaneously transferred together into the plasma process apparatus.

(Consumable Member Transfer Method: Sole Transfer Mode)

With reference to FIGS. 37A to 38D, as another example of the consumable member transfer method in the processing system PS of the embodiment, a case where the controller CU selects and executes the sole transfer mode in which the transfer robot TR2 transfers only an edge ring FR will now be described. Specifically, a case where an edge ring FR is solely transferred out from the plasma process apparatus depicted in FIG. 32 and then an edge ring FR for replacement is solely transferred into the plasma process apparatus will be described.

In the following description, it is assumed that the controller 90 is included in the controller CU and the controller CU controls the transfer robot TR2 and the lifter 50Y. However, the controller 90 may be provided separately from the controller CU, the controller CU may control the transfer robot TR2, and the controller 90 may control the lifter 50Y. It is assumed that the outer peripheral portion of an edge ring FR and the inner peripheral portion of a cover ring CR overlap each other in plan view.

Figure 37A:
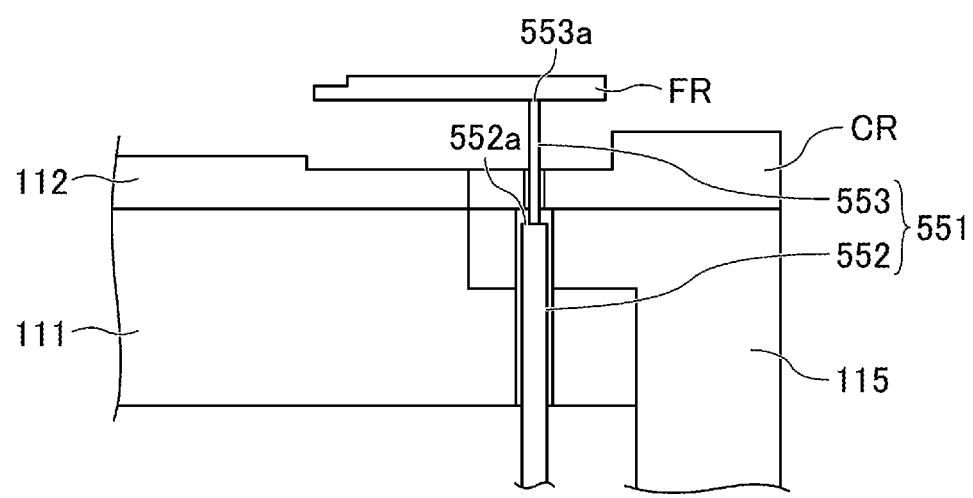
FIGS. 37A-37D are schematic cross-sectional views depicting an example of the sole transfer mode according to the second variant.

First, as depicted in FIG. 37A, the controller CU raises the plurality of support pins 551 from the standby positions to the first support positions. As a result, the upper end surfaces 553a of the upper rod portions 553 come into contact with the lower surface of an edge ring FR, the edge ring FR is raised by the plurality of support pins 551, and the edge ring FR is removed from the electrostatic chuck 112.

Figure 37B:
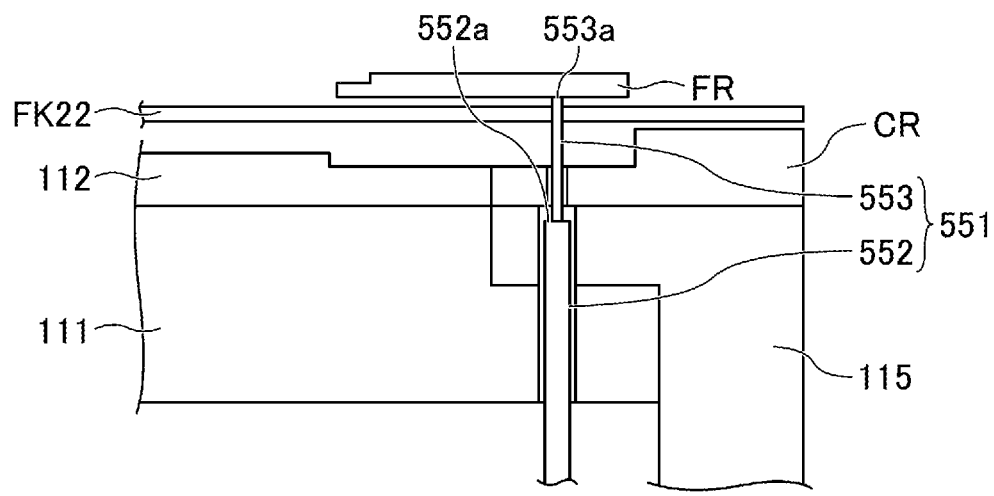

Subsequently, as depicted in FIG. 37B, the controller CU inserts the lower fork FK22, which does not hold a transfer object, between the edge ring FR supported by the plurality of support pins 551 and the electrostatic chuck 112.

Figure 37C:
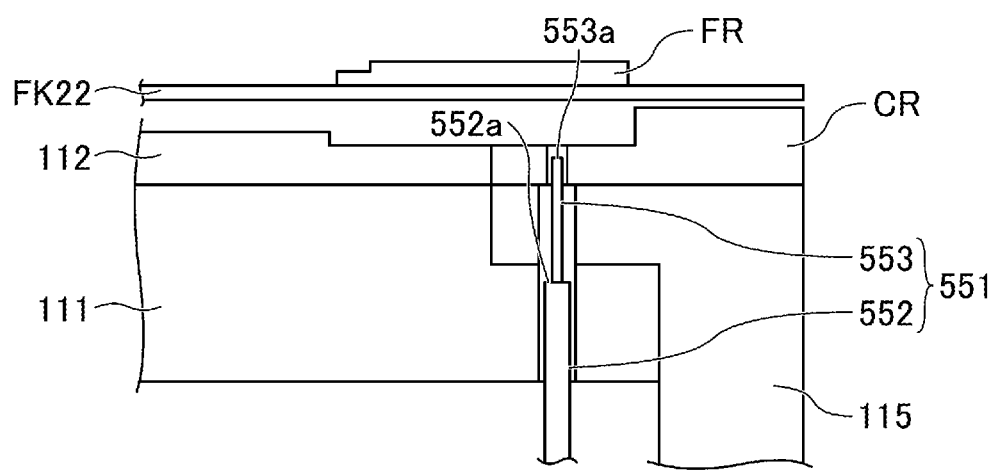

Subsequently, as depicted in FIG. 37C, the controller CU lowers the plurality of support pins 511 from the first support positions to the standby positions. As a result, the edge ring FR supported by the plurality of support pins 511 is placed on the lower fork FK22.

Figure 37D:
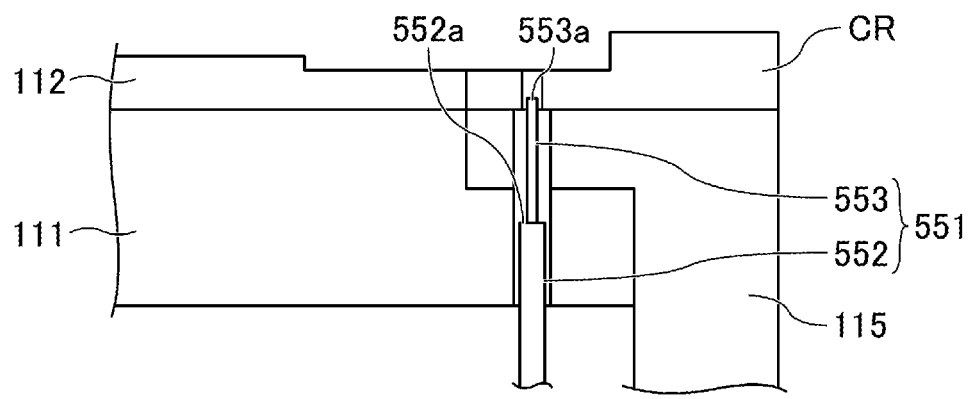

Subsequently, as depicted in FIG. 37D, the controller CU withdraws the lower fork FK22 that holds the edge ring FR.

Figure 38A:
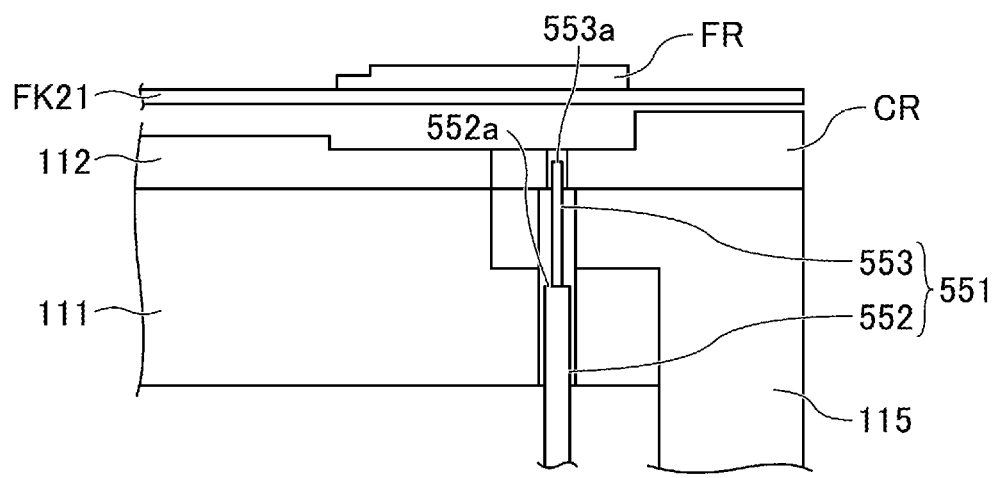
FIGS. 38A-38D are schematic cross-sectional views depicting an example of the sole transfer mode according to the second variant.

Subsequently, as illustrated in FIG. 38A, the controller CU moves the upper fork FK21 that holds an edge ring FR for replacement forward to above the electrostatic chuck 112.

Figure 38B:
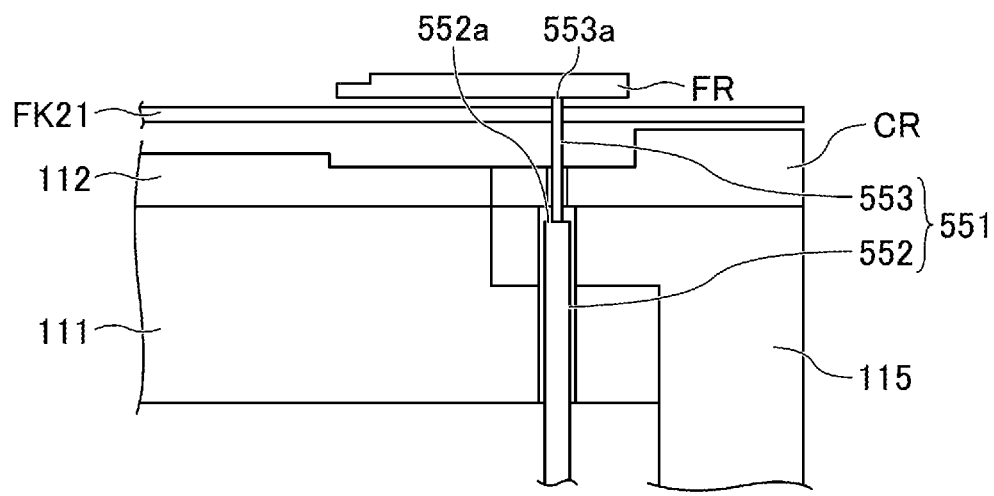

Subsequently, as depicted in FIG. 38B, the controller CU controls the plurality of support pins 511 to raise them from the standby positions to the first support positions. Thus, the upper end surfaces 553a of the upper rod portions 553 come into contact with the lower surface of the edge ring FR held by the upper fork FK21, the edge ring FR is raised by the plurality of support pins 511, and the edge ring FR is removed from the upper fork FK21.

Figure 38C:
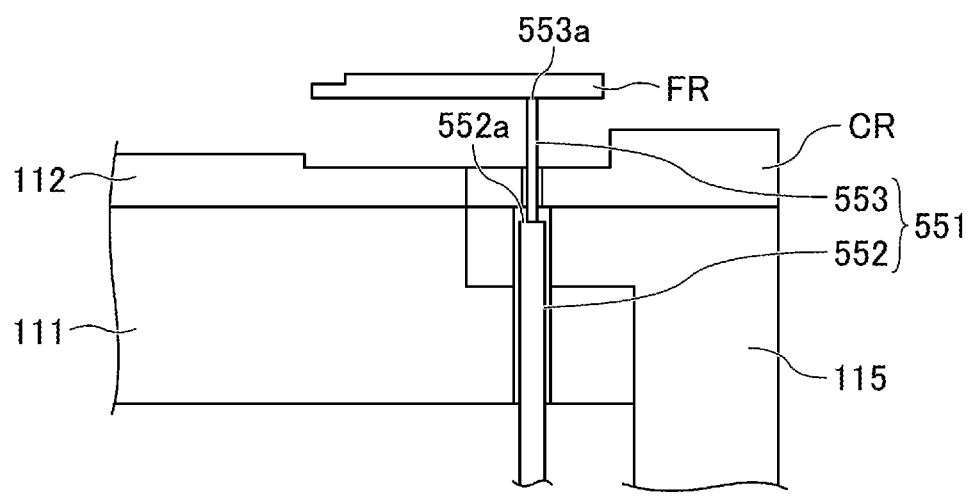

Subsequently, as depicted in FIG. 38C, the controller CU withdraws the upper fork FK21 that does not hold a transfer object.

Figure 38D:
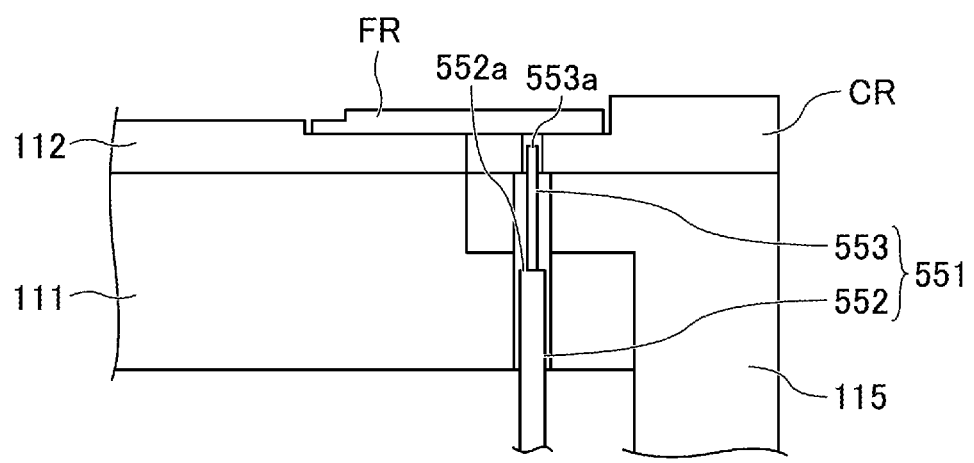

Subsequently, as depicted in FIG. 38D, the controller CU lowers the plurality of support pins 551 from the first support positions to the standby positions. Thus, the edge ring FR supported by the plurality of support pins 551 is placed on the electrostatic chuck 112.

Thus, also in the plasma process apparatus depicted in FIG. 32, after an edge ring FR is solely transferred out from the plasma process apparatus, an edge ring FR for replacement can be solely transferred into the plasma process apparatus.

[Third Variant]
(Configuration)

Still another example of the plasma process apparatus used as each of the process modules PM1 to PM12 included in the processing system PS of FIG. 1 will be described with reference to FIG. 39. Hereinafter, differences from the plasma process apparatus 1 will be mainly described.

The plasma process apparatus includes a ring assembly 113Z. The ring assembly 113Z includes an edge ring FR, a cover ring CR, and a transfer ring HR.

The edge ring FR has an annular shape and is placed around a substrate W on the upper surface of the peripheral portion of the lower electrode 111. The edge ring FR improves the uniformity of plasma process on the substrate W. The edge ring FR is made of a conductive material such as Si or SiC. A coolant flow path 117 is formed inside the lower electrode 111. A coolant such as cooling water or Galden is supplied from a chiller unit (not depicted) to the coolant flow path 117.

The cover ring CR has an annular shape and is placed around the periphery of the edge ring FR. The cover ring CR protects the upper surface of the insulator 115 from, for example, plasma. The cover ring CR is made of a conductive material such as Si or SiC.

The transfer ring HR is placed on the insulator 115. In plan view, the inner peripheral portion of the transfer ring HR overlaps the outer peripheral portion of the edge ring FR, and the outer peripheral portion of the transfer ring HR overlaps the inner peripheral portion of the cover ring CR. The edge ring FR is placed on the upper surface of the inner peripheral portion of the transfer ring HR. The cover ring CR is placed on the outer peripheral portion of the transfer ring HR. Through-holes H22 through which the upper rod portions 563 of the support pins 561, to be described later, are inserted are formed in the transfer ring HR. The transfer ring HR is made of, for example, silicon dioxide ($SiO_2$). The transfer ring HR may be made of a ceramic material such as alumina ($Al_2O_3$). The transfer ring HR may be made of a conductive material such as Si or SiC having an electric resistivity higher than that of the edge ring FR, that is, a conductive material such as Si or SiC having an impurity concentration adjusted so as to have an electric resistivity higher than that of the material constituting the edge ring FR.

The plasma process apparatus includes a lifter 50Z. The lifter 50Z includes a first lifter 51 and a sixth lifter 56. The sixth lifter 56 includes a plurality of support pins 561 and an actuator (not depicted).

The support pins 561 are stepped support pins formed of columnar (solid rod-like) members. The support pins 561 include lower rod portions 562 and upper rod portions 563 in this order from the lower sides to the upper sides. The outer diameters of the lower rod portions 562 are greater than the outer diameters of the upper rod portions 563. Thus, step portions are formed by the upper end surfaces 562a of the lower rod portions 562. Each of the lower rod portions 562 and the corresponding one of the upper rod portions 563 are integrally formed.

The support pins 561 are inserted into the through-holes H21 and H22 so as to protrude into and retreat from the upper surface of the insulator 115 and the upper surface of the transfer ring HR. The inner diameter of the through-holes H21 are slightly greater than the outer diameters of the lower rod portions 562. The inner diameters of the through-holes H22 are slightly greater than the outer diameters of the upper rod portions 563 and smaller than the outer diameters of the lower rod portions 562.

The support pins 561 can be changed in their positions between standby positions, first support positions, and second support positions.

The standby positions are positions at which the upper end surfaces 563a of the upper rod portions 563 are lower than the lower surfaces of the edge ring FR. When the support pins 561 are at the standby positions, the edge ring FR, the cover ring CR, and the transfer ring HR are supported on the electrostatic chuck 112 or the insulator 115 without being raised by the support pins 561.

The first support positions are positions above the standby positions. The first support positions are positions where the upper end surfaces 563a of the upper rod portions 563 protrude upward from the upper surface of the transfer ring HR and the upper end surfaces 562a of the lower rod portions 562 are located below the lower surface of the transfer ring HR. When the support pins 561 move to the first support positions, the upper end surfaces 563a of the upper rod portions 563 come into contact with the lower surface of the edge ring FR to support the edge ring FR.

The second support positions are positions above the first support positions. The second support positions are positions at which the upper end surfaces 562a of the lower rod portions 562 protrudes above the upper surface of the insulator 115. When the support pins 561 move to the second support positions, the upper end surfaces 563a of the upper rod portions 563 come into contact with the lower surface of the edge ring FR to support the edge ring FR, and the upper end surfaces 562a of the lower rod portions 562 come into contact with the lower surface of the transfer ring HR to support the transfer ring HR. At this time, the inner peripheral portion of the cover ring CR is placed on the upper surface of the outer peripheral portion of the transfer ring HR. Therefore, when the transfer ring HR is raised by the plurality of support pins 561, the cover ring CR is also raised together with the transfer ring HR. That is, the transfer ring HR and the cover ring CR are integrally removed from the insulator 115.

The actuator raises and lowers the plurality of support pins 561. As the actuator, for example, a motor such as a DC motor, a stepper motor, or a linear motor, an air driving mechanism such as an air cylinder, or a piezoelectric actuator can be used.

When an edge ring FR is transferred between the transfer robots TR1 and TR2 and the substrate support 11, the sixth lifter 56 moves the plurality of support pins 561 to the first support positions to raise the edge ring FR. When an edge ring FR and a cover ring CR are transferred between the transfer robots TR1 and TR2 and the substrate support 11, the sixth lifter 56 moves the plurality of support pins 561 to the second support positions to raise the cover ring CR, the edge ring FR, and the transfer ring HR.

(Consumable Member Transfer Method: Simultaneous Transfer Mode)

As another example of the consumable member transfer method in the processing system PS of the embodiment, a case where the controller CU selects and executes the simultaneous transfer mode in which an edge ring FR, a cover ring CR, and a transfer ring HR are simultaneously transferred by the transfer robot TR2 will now be described with reference to FIGS. 40A to 45B. Specifically, a case will be described in which an edge ring FR, a cover ring CR, and a transfer ring HR are simultaneously transferred out from the plasma process apparatus depicted in FIG. 39, and then an edge ring FR, a cover ring CR, and a transfer ring HR for replacement are simultaneously transferred into the plasma process apparatus.

In the following description, it is assumed that the controller 90 is included in the controller CU and the controller CU controls the transfer robot TR2 and the lifter 50Z. However, the controller 90 may be provided separately from the controller CU, the controller CU may control the transfer robot TR2, and the controller 90 may control the lifter 50Z.

Figure 40A:
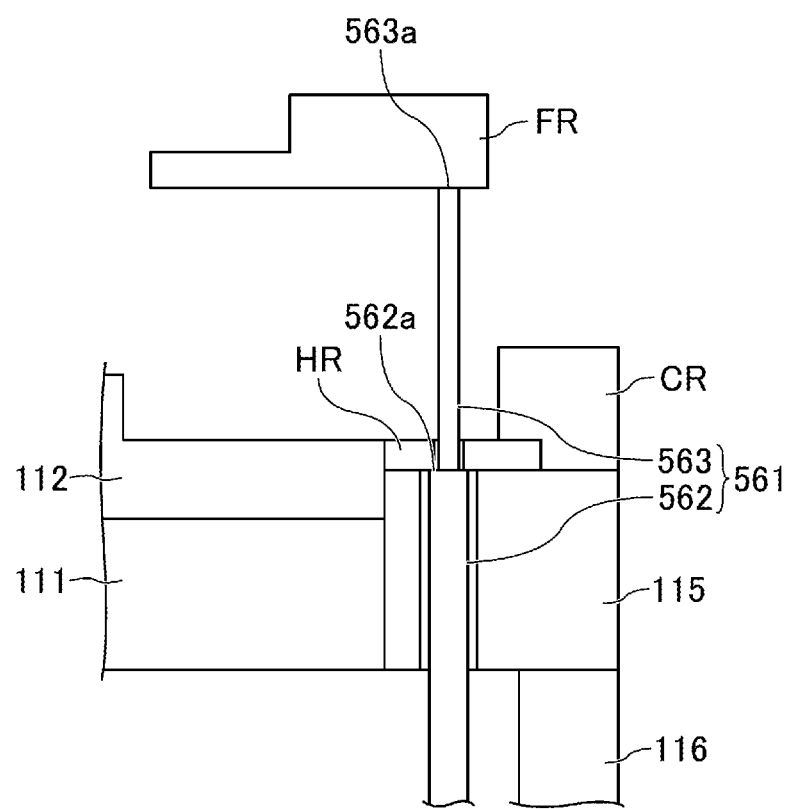

First, as depicted in FIG. 40A, the controller CU raises the plurality of support pins 561 from the standby positions. As a result, the upper end surfaces 563a of the upper rod portions 563 come into contact with the lower surface of an edge ring FR, the edge ring FR is raised by the plurality of support pins 561, and the edge ring FR is removed from the electrostatic chuck 112.

Subsequently, as depicted in FIG. 40B, the controller CU further raises the plurality of support pins 561 to the second support positions. As a result, the upper end surfaces 562a of the lower rod portions 562 come into contact with the lower surface of a transfer ring HR, the transfer ring HR is raised by the plurality of support pins 561, and the transfer ring HR is removed from the insulator 115. At this time, the outer peripheral portion of a cover ring CR is placed on the outer peripheral portion of the transfer ring HR. Therefore, when the transfer ring HR is raised by the plurality of support pins 561, the cover ring CR is also raised together with the transfer ring HR. That is, the transfer ring HR and the cover ring CR are integrally removed from the insulator 115. Thus, when the plurality of support pins 561 are raised from the standby positions to the second support positions, the edge ring FR, the transfer ring HR, and the cover ring CR are raised and supported by the plurality of support pins 561 in a state where the edge ring FR and a set of the transfer ring HR and the cover ring CR are apart from each other.

Figure 41A:
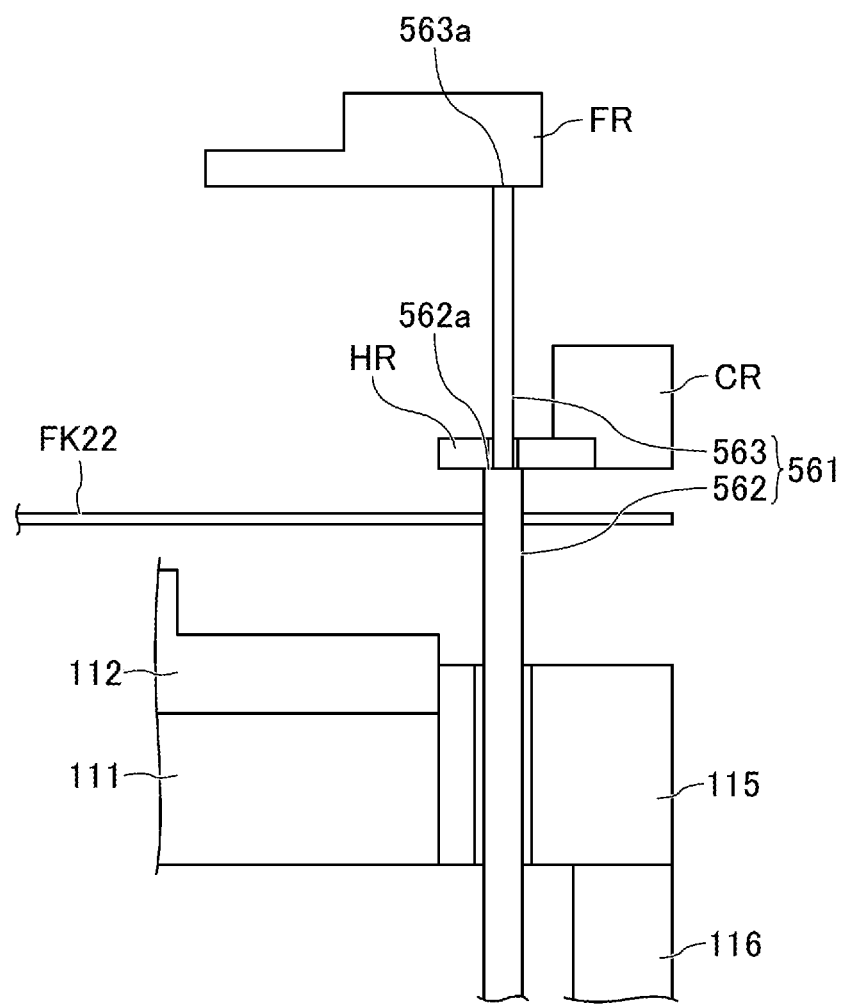
FIGS. 41A-41B are schematic cross-sectional views depicting an example of the simultaneous transfer mode according to the third variant.

Subsequently, as depicted in FIG. 41A, the controller CU inserts the lower fork FK22, which does not hold a transfer object, between the transfer ring HR supported by the plurality of support pins 561 and the electrostatic chuck 112.

Figure 41B:
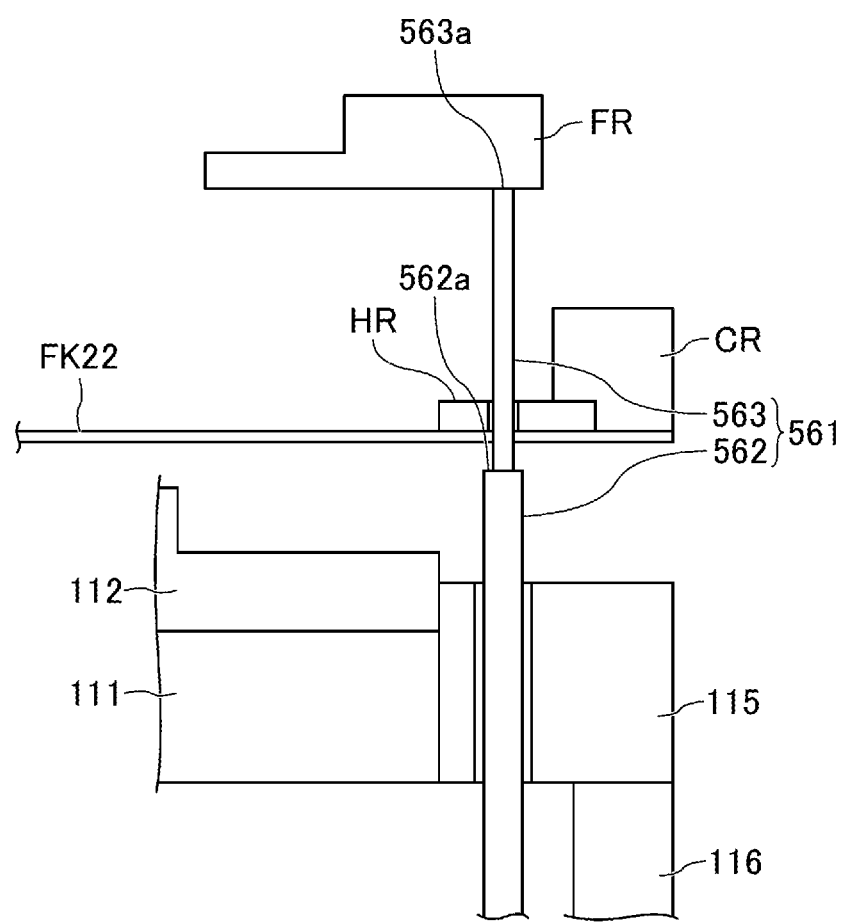

Subsequently, as depicted in FIG. 41B, the controller CU lowers the plurality of support pins 561 from the second support positions. Thus, the cover ring CR and the transfer ring HR supported by the plurality of support pins 561 are placed on the lower fork FK22.

Figure 42A:
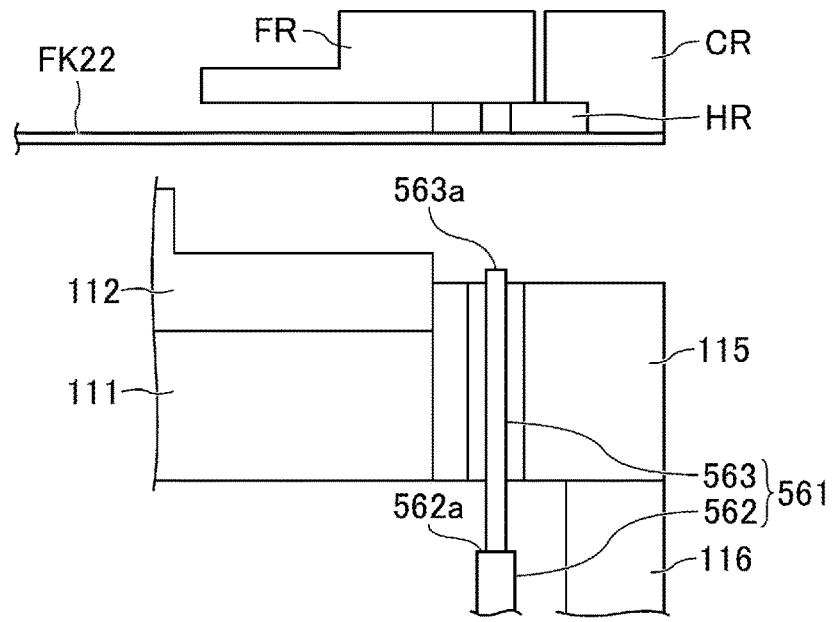
FIGS. 42A-42B are schematic cross-sectional views depicting an example of the simultaneous transfer mode according to the third variant.

Subsequently, as depicted in FIG. 42A, the controller CU further lowers the plurality of support pins 561 to the standby positions. Thus, the edge ring FR supported by the plurality of support pins 561 is placed on the transfer ring HR. Thus, when the plurality of support pins 561 are lowered from the second support positions to the standby positions, the edge ring FR, the cover ring CR, and the transfer ring HR are placed on the lower fork FK22.

Figure 42B:
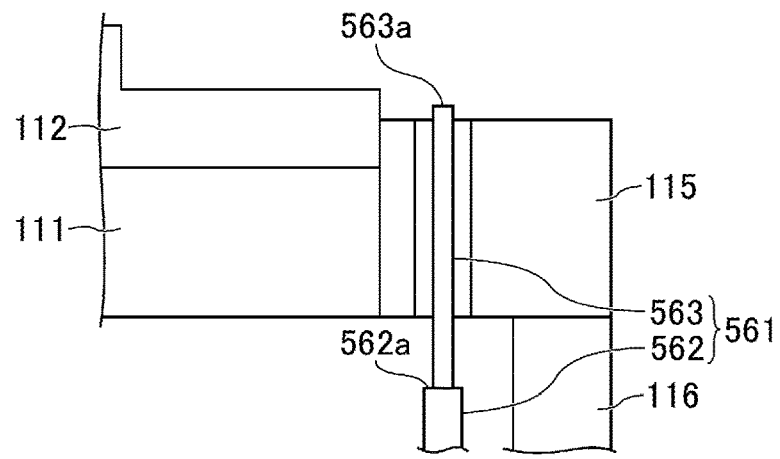

Subsequently, as depicted in FIG. 42B, the controller CU withdraws the lower fork FK22 that holds the edge ring FR, the cover ring CR, and the transfer ring HR.

Figure 43A:
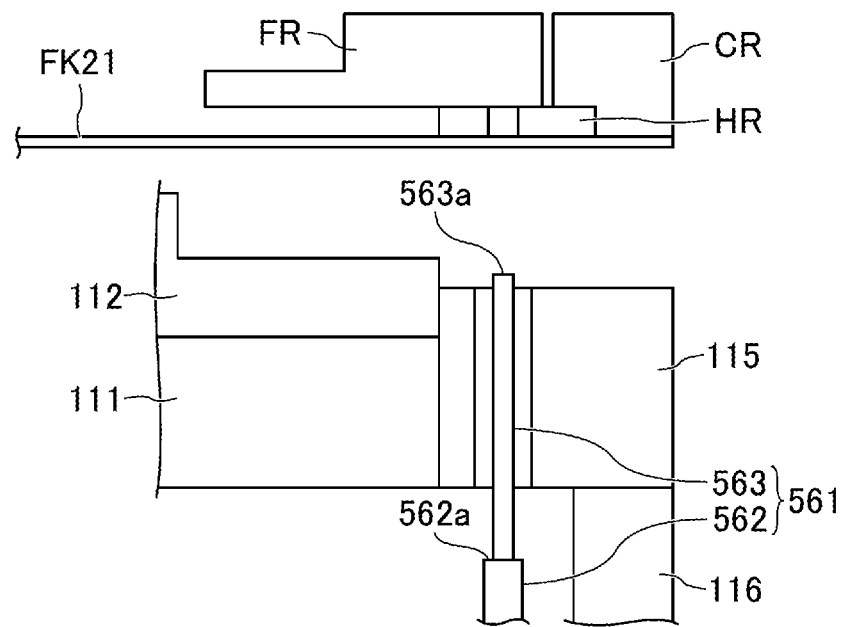
FIGS. 43A-43B are schematic cross-sectional views depicting an example of the simultaneous transfer mode according to the third variant.

Subsequently, as illustrated in FIG. 43A, the controller CU moves forward the upper fork FK21 that holds an edge ring FR for replacement, a cover ring CR for replacement, and a transfer ring HR for replacement to above the electrostatic chuck 112. Instead of the transfer ring HR for replacement, the transfer ring HR that has been once transferred out from the plasma process apparatus may be used.

Figure 43B:
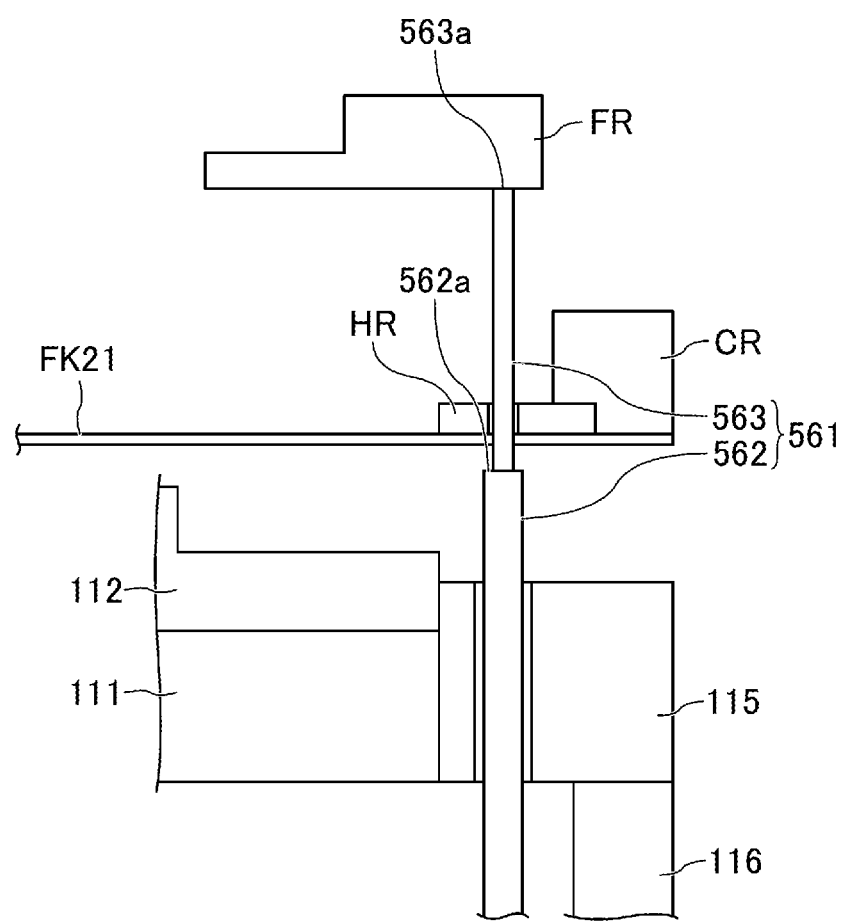

Subsequently, as depicted in FIG. 43B, the controller CU raises the plurality of support pins 561 from the standby positions. Thus, the upper end surfaces 563a of the upper rod portions 563 come into contact with the lower surface of the edge ring FR held by the upper fork FK21, the edge ring FR is raised by the plurality of support pins 561, and the edge ring FR is removed from the upper fork FK21.

Figure 44A:
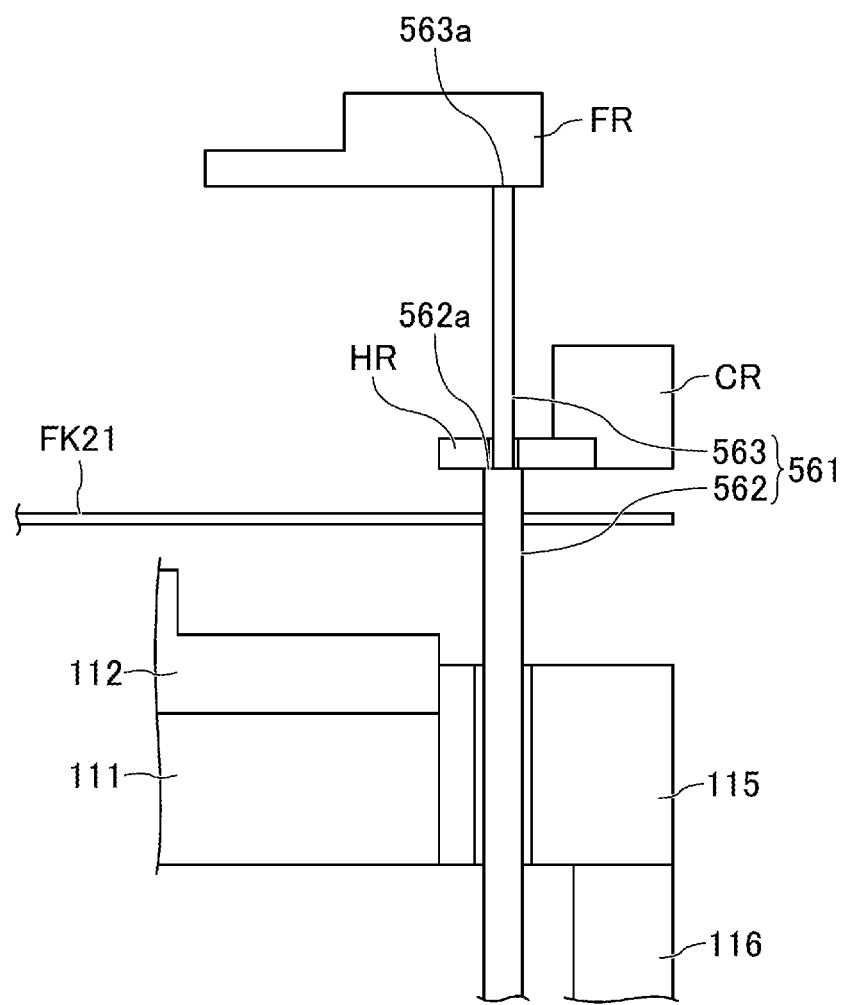
FIGS. 44A-44B are schematic cross-sectional views depicting an example of the simultaneous transfer mode according to the third variant.

Subsequently, as depicted in FIG. 44A, the controller CU further raises the plurality of support pins 561 to the second support positions. As a result, the upper end surfaces 562*a* of the lower rod portions 562 come into contact with the lower surface of the transfer ring HR held by the upper fork FK21, the transfer ring HR is raised by the plurality of support pins 561, and the transfer ring HR is removed from the upper fork FK21. At this time, the outer peripheral portion of the cover ring CR is placed on the outer peripheral portion of the transfer ring HR. Therefore, when the transfer ring HR is thus raised by the plurality of support pins 561, the cover ring CR is also raised together with the transfer ring HR. That is, the transfer ring HR and the cover ring CR are integrally raised by the plurality of support pins 561, and the transfer ring HR and the cover ring CR are removed together from the upper fork FK21. Thus, when the plurality of support pins 561 are raised from the standby positions to the second support positions, the edge ring FR, the transfer ring HR, and the cover ring CR are raised and supported by the plurality of support pins 561 in a state where the edge ring FR and a set of the transfer ring HR and the cover ring CR are apart from each other.

Figure 44B:
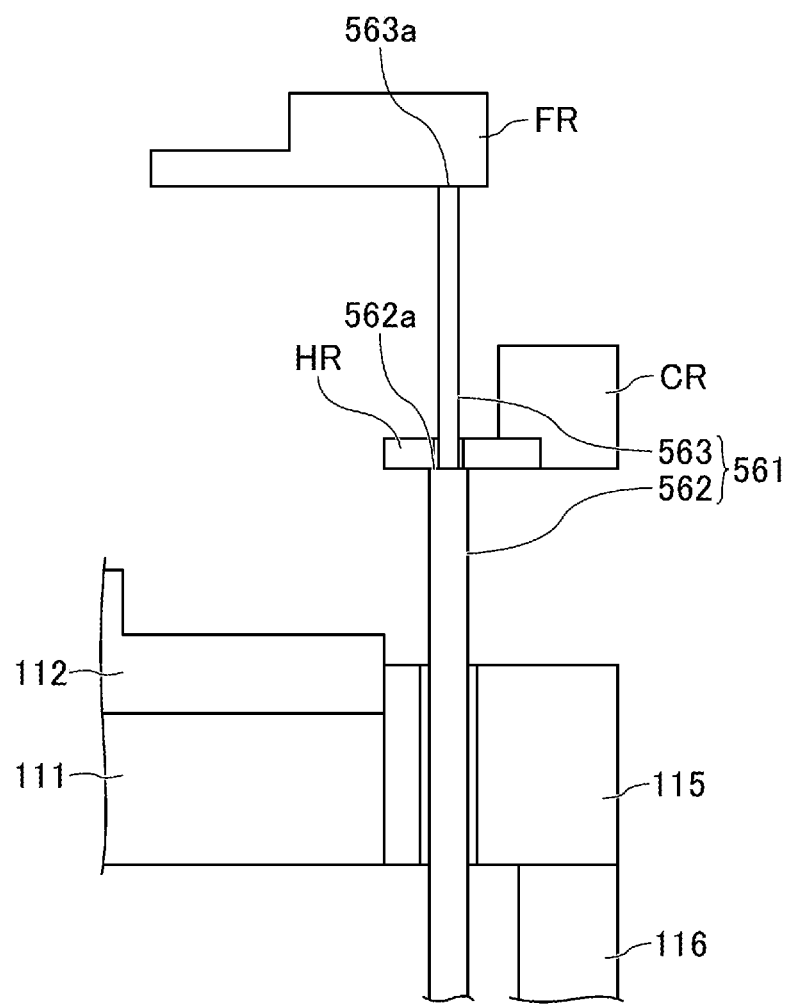

Subsequently, as depicted in FIG. 44B, the controller CU withdraws the upper fork FK21 that does not hold a transfer object.

Figure 45A:
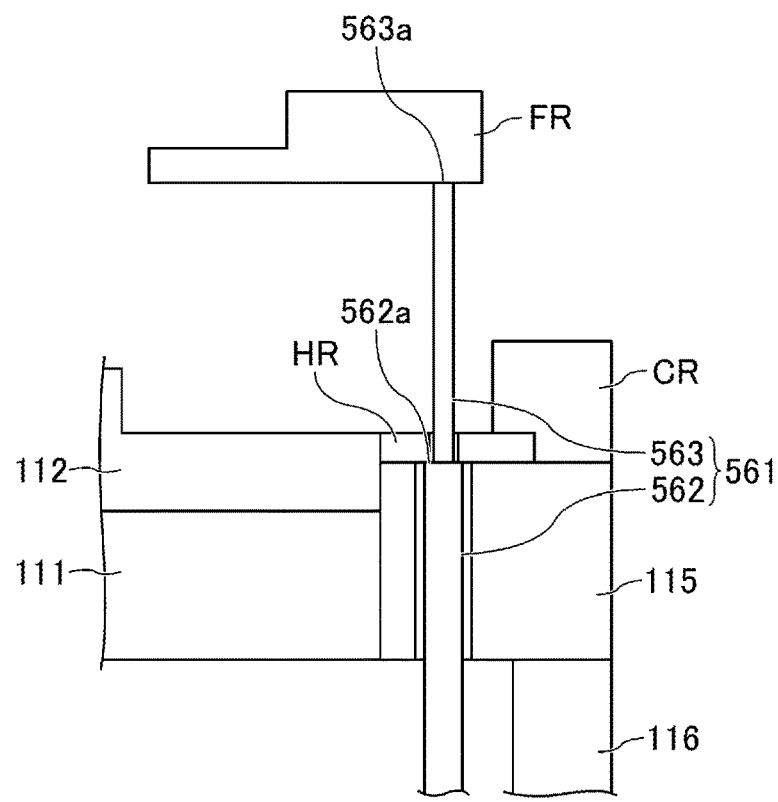
FIGS. 45A-45B are schematic cross-sectional views depicting an example of the simultaneous transfer mode according to the third variant.

Subsequently, as depicted in FIG. 45A, the controller CU lowers the plurality of support pins 561 from the second support positions. Thus, the transfer ring HR and the cover ring CR supported by the plurality of support pins 561 are placed on the insulator 115.

Figure 45B:
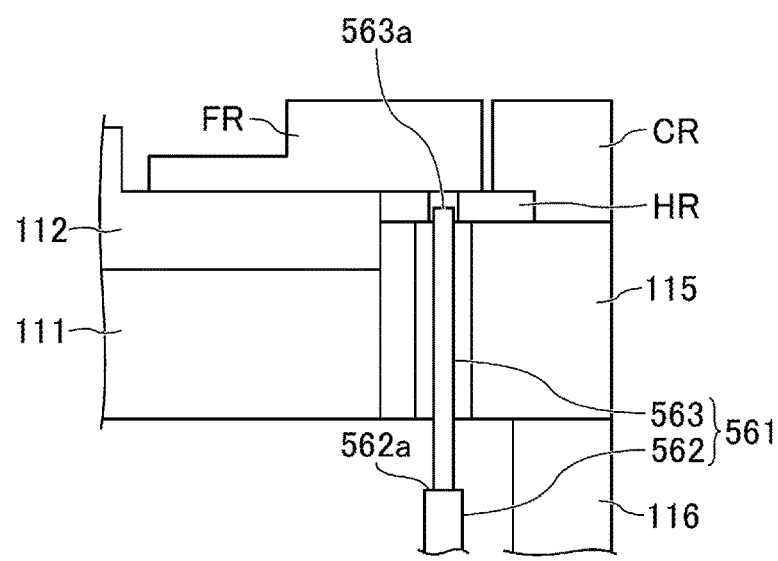

Subsequently, as depicted in FIG. 45B, the controller CU further lowers the plurality of support pins 561 to the standby positions. Thus, the edge ring FR supported by the plurality of support pins 561 is placed on the electrostatic chuck 112.

Figure 39:
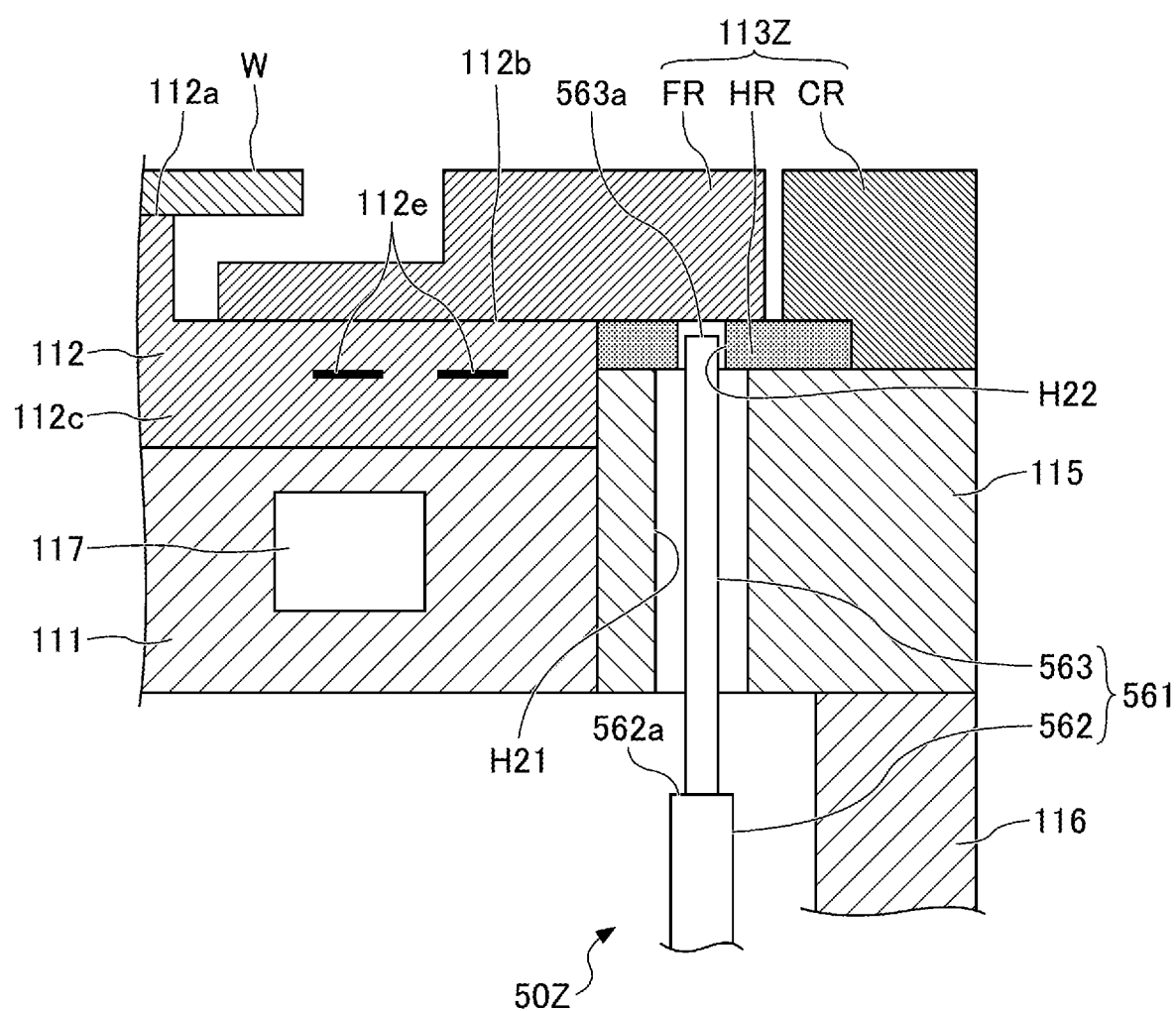
FIG. 39 is a schematic cross-sectional view depicting the process module according to a third variant of the embodiment.

Thus, also in the plasma process apparatus depicted in FIG. 39, after an edge ring FR and a cover ring CR are simultaneously transferred out from the plasma process apparatus, an edge ring FR and a cover ring CR for replacement can be simultaneously transferred into the plasma process apparatus.

(Consumable Member Transfer Method: Sole Transfer Mode)

With reference to FIGS. 46A to 49B, as another example of the consumable member transfer method in the processing system PS of the embodiment, a case where the controller CU selects and executes the sole transfer mode in which the transfer robot TR2 transfers only an edge ring FR will now be described. Specifically, a case where an edge ring FR is solely transferred out from the plasma process apparatus depicted in FIG. 39 and then an edge ring FR for replacement is solely transferred into the plasma process apparatus will be described.

In the following description, it is assumed that the controller 90 is included in the controller CU, and the controller CU controls the transfer robot TR2 and the lifter 50Z. However, the controller 90 may be provided separately from the controller CU, the controller CU may control the transfer robot TR2, and the controller 90 may control the lifter 50Z. It is assumed that the outer peripheral portion of an edge ring FR and the inner peripheral portion of a cover ring CR overlap each other in plan view.

Figure 46A:
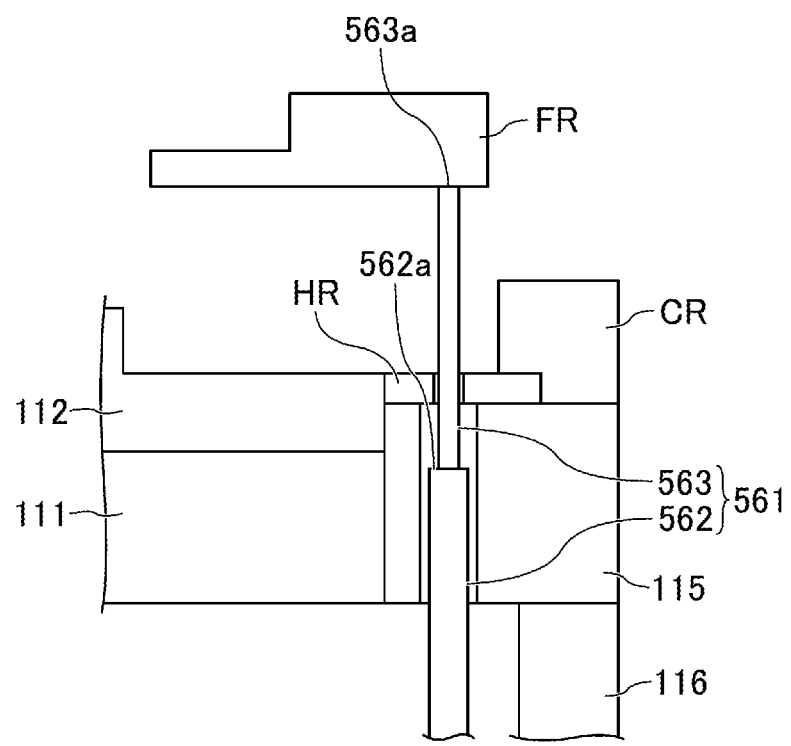
FIGS. 46A-46B are schematic cross-sectional views depicting an example of the sole transfer mode according to the third variant.

First, as depicted in FIG. 46A, the controller CU raises the plurality of support pins 561 from the standby positions to the first support positions. As a result, the upper end surfaces 563*a* of the upper rod portions 563 come into contact with the lower surface of an edge ring FR, the edge ring FR is raised by the plurality of support pins 561, and the edge ring FR is removed from the electrostatic chuck 112.

Figure 46B:
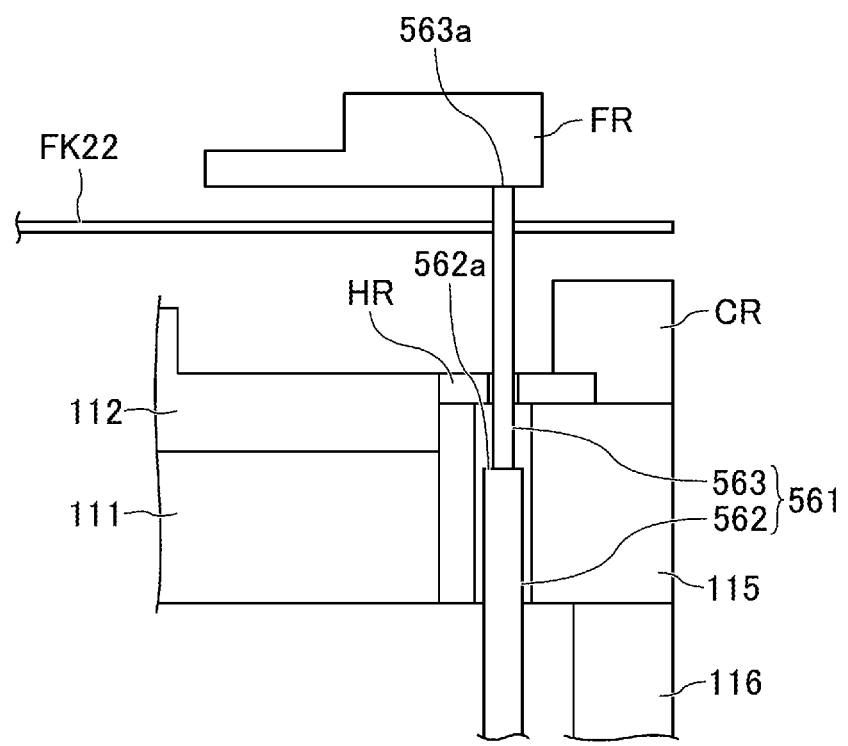

Subsequently, as depicted in FIG. 46B, the controller CU inserts the lower fork FK22, which does not hold a transfer object, between the edge ring FR supported by the plurality of support pins 561 and the electrostatic chuck 112.

Figure 47A:
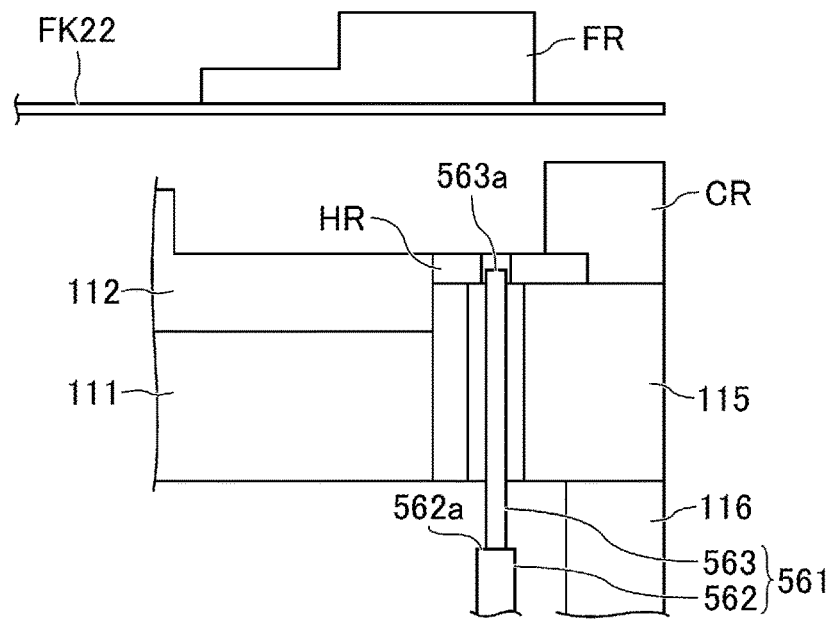
FIGS. 47A-47B are schematic cross-sectional views depicting an example of the sole transfer mode according to the third variant.

Subsequently, as depicted in FIG. 47A, the controller CU lowers the plurality of support pins 511 from the first support positions to the standby positions. As a result, the edge ring FR supported by the plurality of support pins 511 is placed on the lower fork FK22.

Figure 47B:
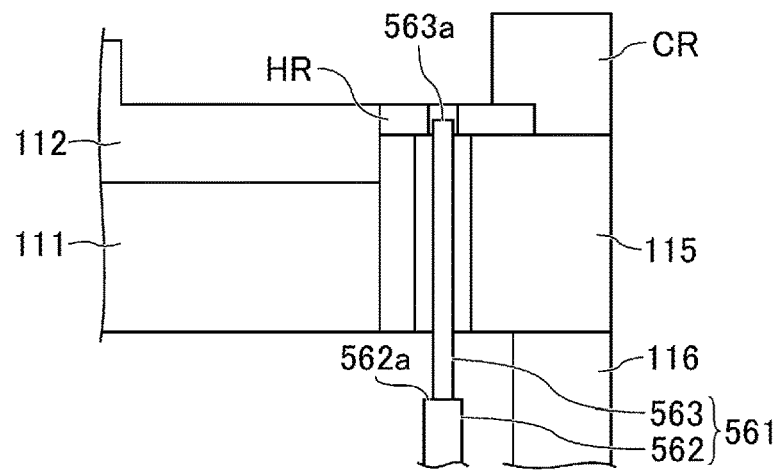

Subsequently, as depicted in FIG. 47B, the controller CU withdraws the lower fork FK22 holding the edge ring FR.

Figure 48A:
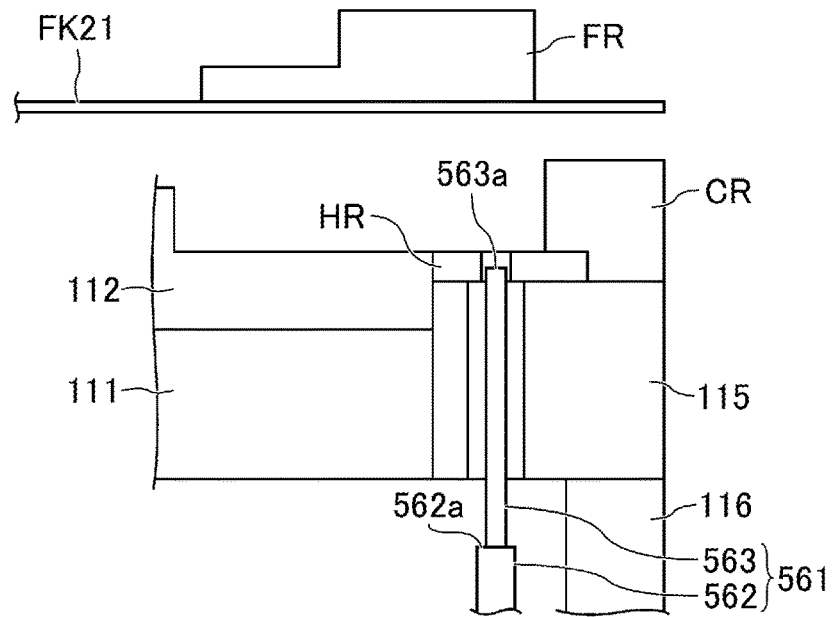
FIGS. 48A-48B are schematic cross-sectional views depicting an example of the sole transfer mode according to the third variant.

Subsequently, as illustrated in FIG. 48A, the controller CU moves the upper fork FK21, holding an edge ring FR for replacement, forward to above the electrostatic chuck 112.

Figure 48B:
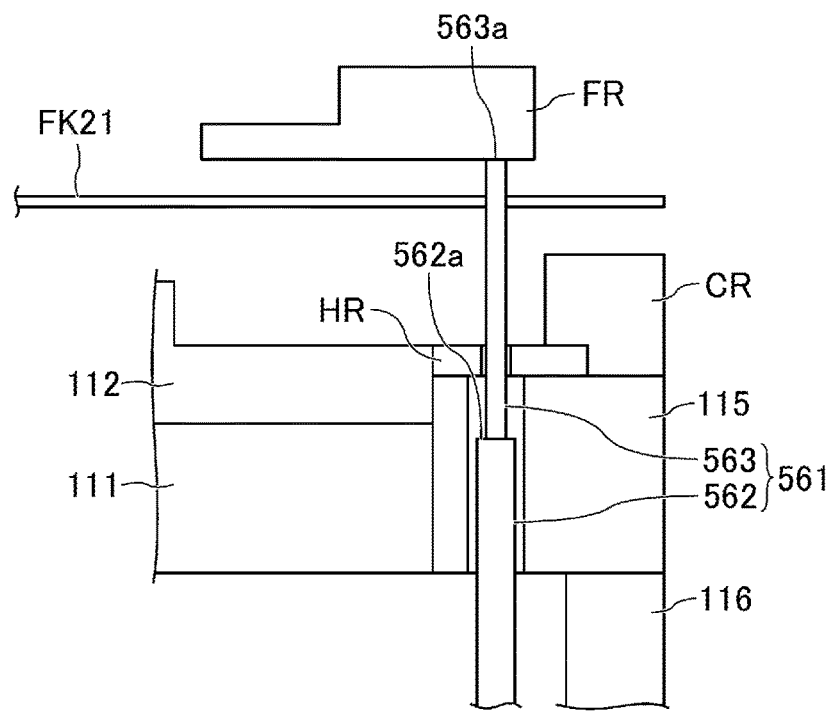

Subsequently, as depicted in FIG. 48B, the controller CU controls the plurality of support pins 511 to raise them from the standby positions to the first support positions. Thus, the upper end surfaces 563*a* of the upper rod portions 563 come into contact with the lower surface of the edge ring FR held by the upper fork FK21, the edge ring FR is raised by the plurality of support pins 511, and the edge ring FR is removed from the upper fork FK21.

Figure 49A:
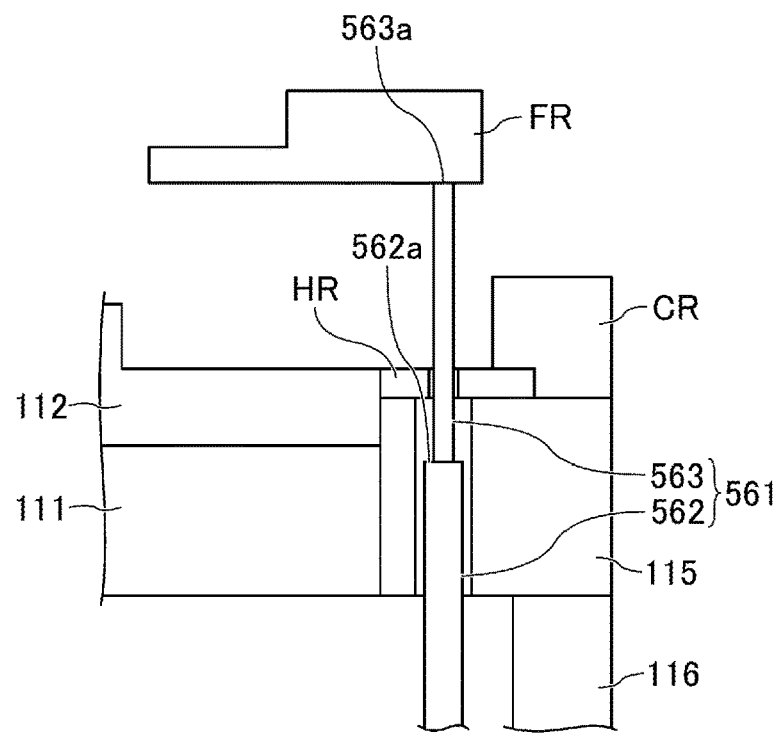
FIGS. 49A-49B are schematic cross-sectional views depicting an example of the sole transfer mode according to the third variant.

Subsequently, as depicted in FIG. 49A, the controller CU withdraws the upper fork FK21 that does not hold a transfer object.

Figure 49B:
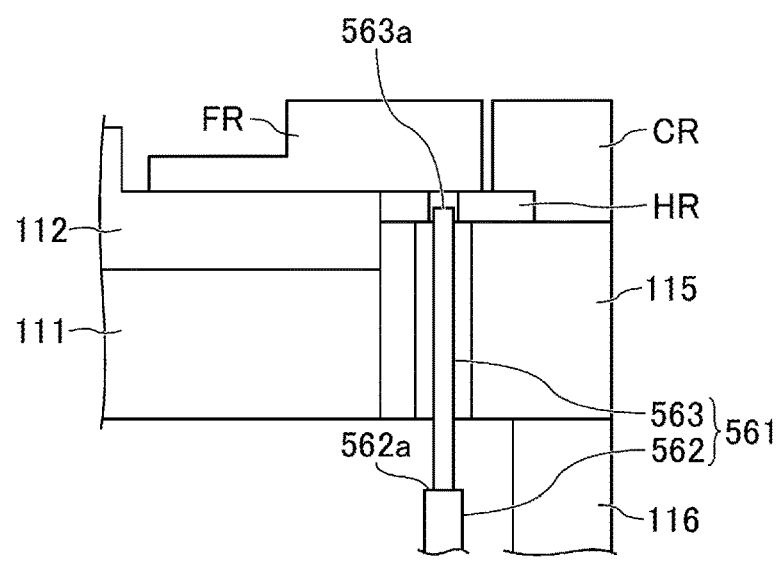

Subsequently, as depicted in FIG. 49B, the controller CU lowers the plurality of support pins 561 from the first support positions to the standby positions. Thus, the edge ring FR supported by the plurality of support pins 561 is placed on the electrostatic chuck 112.

Thus, also in the plasma process apparatus depicted in FIG. 39, after an edge ring FR is solely transferred out from the plasma process apparatus, an edge ring FR for replacement can be solely transferred into the plasma process apparatus.

In the above-described embodiment, edge rings FR and FRX and cover rings CR and CRX are examples of an annular member, edge rings FR and FRX are examples of an inner ring, and cover rings CR and CRX are examples of an outer ring. The transfer robots TR1 and TR2 are examples of a transfer apparatus. The support pins 521 are examples of a first support pin, the support pins 511 are examples of a second support pin, support pins 531 are examples of a third support pin, and the support pins 541 are examples of a fourth support pin.

Although the substrate processing systems and transfer methods have been described with reference to the embodiments, the present disclosure is not limited to the embodiments, and it should be understood that the embodiments disclosed herein are illustrative in all respects and are not restrictive. In the above-described embodiments, any elements may be omitted, replaced, or changed variously without departing from the scope of the claimed subject matter.

In the above-described embodiments, the lifters 50 and 50X to 50Z are described as mechanisms for raising and lowering an edge ring FR and/or a cover ring CR, but mechanisms are not limited thereto. For example, when the outer peripheral portion of an edge ring FR and the inner peripheral portion of a cover ring CR overlap each other, the edge ring FR and the cover ring CR can be raised and lowered independently from each other by support pins having first holding portions configured to fit into through-holes formed in the cover ring CR and second holding portions connected in the axial directions of the first holding portions and having portions protruding from the outer peripheries of the first holding portions. For example, the edge ring FR can be raised solely by causing the first holding portions to pass through the through-holes of the cover ring CR and causing the upper ends of the first holding portions to come into contact with the back surface of the cover ring CR. In addition, for example, the cover ring CR can be raised solely by causing the first holding portions to pass through the through-holes of the cover ring CR and causing the protruding portions of the second holding portions to come into contact with the lower surface of the cover ring CR. Details of this configuration are described in U.S. Patent Application Publication No. 2020/0219753, the entire contents of which are incorporated herein by reference.

In the above-described embodiments, an edge ring is transferred between the storage module and the process module, but the embodiments are not limited thereto. For example, instead of an edge ring, another consumable member mounted in the process module, such as a cover ring or a top plate of the upper electrode, may be transferred in the same manner.

With respect to the above embodiments, the following features of clauses 1-34 will be further disclosed:

(Clause 1)

A processing system configured to perform plasma process on a substrate, the processing system including:
 a chamber;
 a vacuum transfer module connected to the chamber;
 a transfer apparatus provided inside the vacuum transfer module;
 a stage configured to mount an outer ring and an inner ring on the stage, the outer ring and the inner ring being provided to surround the substrate in the chamber and having different inner diameters and outer diameters;
 a lifter configured to raise and lower the outer ring and the inner ring with respect to the stage; and
 a controller,
 wherein
 the controller is configured to select a simultaneous transfer mode in which the transfer apparatus is caused to simultaneously transfer the inner ring and the outer ring, and configured to select a sole transfer mode in which the transfer apparatus is caused to transfer only the inner ring.

(Clause 2)
 The processing system of clause 1,
 wherein
 the inner ring is at least partially placed on the outer ring.

(Clause 3)
 The processing system of clause 2,
 wherein
 the lifter includes:
 a plurality of first support pins configured to come into contact with a lower surface of the outer ring to raise and lower the outer ring and the inner ring integrally; and
 a second support pin configured to come into contact with a lower surface of a jig configured to support the inner ring from below to raise and lower the jig and the inner ring integrally.

(Clause 4)
 The processing system of clause 3,
 wherein
 the second support pin is configured to come into contact with a lower surface of the substrate to raise and lower the substrate.

(Clause 5)
 The processing system of clause 3 or 4,
 wherein
 the simultaneous transfer mode includes transferring the outer ring and the inner ring between the first support pins and the transfer apparatus in a state where the first support pins have been raised.

(Clause 6)
 The processing system of any one of clauses 3 to 5,
 wherein
 the sole transfer mode includes transferring the jig and the inner ring between the second support pin and the transfer apparatus in a state where the second support pin has been raised.

(Clause 7)
 The processing system of any one of clauses 3 to 6, further including
 a storage module connected to the vacuum transfer module and configured to store the outer ring and the inner ring.

(Clause 8)
 The processing system of claim 7,
 wherein
 the storage module is configured to store a first assembly in which the inner ring is placed on the outer ring.

(Clause 9)
 The processing system of clause 7 or 8,
 wherein
 the storage module is configured to store a second assembly in which the inner ring is placed on the jig.

(Clause 10)
 The processing system of claim 1,
 wherein
 an outer diameter of the inner ring is the same as or smaller than an inner diameter of the outer ring.

(Clause 11)
 The processing system of claim 10,
 wherein
 the lifter includes:
 a third support pin configured to come into contact with a lower surface of the inner ring to raise and lower the inner ring; and
 a fourth support pin configured to come into contact with a lower surface of the outer ring to raise and lower the outer ring.

(Clause 12)
 The processing system of clause 11,
 wherein
 the simultaneous transfer mode includes transferring the outer ring and the inner ring between the transfer apparatus and a set of the third support pin and the fourth support pin in a state where the third support pin and the fourth support pin have been raised.

(Clause 13)
 The processing system according to clause 11 or 12,
 wherein
 the sole transfer mode includes transferring the inner ring between the third support pin and the transfer apparatus in a state where the third support pin has been raised.

(Clause 14)

The processing system of any one of clauses 1 to 13, wherein the inner ring is an edge ring that is placed to surround a periphery of the substrate on an upper surface of the stage; and the outer ring is a cover ring that is placed to surround a periphery of the edge ring.

(Clause 15)

A transfer method of transferring an outer ring and an inner ring in a processing system that includes a chamber; a vacuum transfer module connected to the chamber; a transfer apparatus provided in the vacuum transfer module; a stage configured to mount the outer ring and the inner ring on the stage, the outer ring and the inner ring being provided to surround a substrate in the chamber and having different inner diameters and outer diameters; and a lifter configured to raise and lower the outer ring and the inner ring with respect to the stage, the transfer method having:

a simultaneous transfer mode including the transfer apparatus being caused to transfer the inner ring and the outer ring simultaneously; and a sole transfer mode including the transfer apparatus being caused to transfer only the inner ring.

(Clause 16)

A substrate processing system, including:

a vacuum transfer module;

a plasma process module connected to the vacuum transfer module; and a controller, wherein the vacuum transfer module includes:

a vacuum transfer chamber; and a transfer robot disposed in the vacuum transfer chamber, and the plasma process module includes:

a plasma process chamber;

a stage disposed in the plasma process chamber, the stage having a substrate support surface and a ring support surface;

a first ring that is placed on the ring support surface of the stage;

a second ring that is placed on the first ring to surround a substrate that is placed on the substrate support surface of the stage, the second ring having an inner diameter smaller than an inner diameter of the first ring;

a plurality of first support pins disposed below the ring support surface;

a plurality of second support pins disposed below the substrate support surface;

a first actuator configured to vertically move the plurality of first support pins with respect to the stage; and a second actuator configured to vertically move the plurality of second support pins with respect to the stage, and the controller is configured to selectively execute a simultaneous transfer mode in which the transfer robot is caused to transfer the first ring and the second ring simultaneously and a sole transfer mode in which the transfer robot is caused to transfer only the second ring, the simultaneous transfer mode includes:

raising the plurality of first support pins so that the first ring and the second ring are raised together by the plurality of first support pins; and transferring the first ring and the second ring together between the plurality of first support pins and the transfer robot in a state where the plurality of first support pins have been raised, and the sole transfer mode includes:

raising the plurality of first support pins so that the first ring and the second ring are raised together by the plurality of first support pins;

raising the plurality of second support pins so that the transfer jig is supported by the plurality of second support pins at a height lower than a height of the second ring;

lowering the plurality of first support pins so that the first ring is lowered to a position lower than a height of the transfer jig in a state where the first ring is supported by the plurality of first support pins while the second ring is supported by the transfer jig; and transferring the transfer jig and the second ring together between the plurality of second support pins and the transfer robot in a state where the plurality of second support pins have been raised.

(Clause 17)

The substrate processing system of clause 16, wherein the first ring is made of an electrically insulating material, and the second ring is made of an electrically conductive material.

(Clause 18)

The substrate processing system of clause 16, wherein the first ring is made of quartz, and the second ring is made of Si or SiC.

(Clause 19)

The substrate processing system of any one of clauses 16 to 18, wherein an outer annular portion of the second ring is supported by the first ring and an inner annular portion of the second ring is supported by the transfer jig.

(Clause 20)

A substrate processing system, including:

a vacuum transfer module;

a plasma process module connected to the vacuum transfer module; and a controller, wherein the vacuum transfer module includes:

a vacuum transfer chamber; and a transfer robot disposed in the vacuum transfer chamber, the plasma process module includes:

a plasma process chamber;

a stage disposed in the plasma process chamber, the stage having a substrate support surface and a ring support surface;

a first ring and a second ring that are placed on the ring support surface of the stage to surround a substrate that is placed on the substrate support surface of the stage; and a lifter configured to raise and lower the first ring and the second ring with respect to the stage, and the controller is configured to selectively execute a simultaneous transfer mode in which the transfer robot is caused to simultaneously transfer the first ring and the second ring, and a sole transfer mode in which the transfer robot is caused to transfer only the second ring.

(Clause 21)
The substrate processing system of clause 20,
wherein
at least a part of the second ring is placed on the first ring.

(Clause 22)
The substrate processing system of clause 21,
wherein
the lifter includes:
a plurality of first support pins disposed below the ring support surface; and
a plurality of second support pins disposed below the substrate support surface.

(Clause 23)
The substrate processing system of clause 22,
wherein
the plurality of second support pins are configured to raise and lower the substrate that is placed on the substrate support surface.

(Clause 24)
The substrate processing system of clause 22 or 23,
wherein
the simultaneous transfer mode includes transferring the first ring and the second ring together between the plurality of first support pins and the transfer robot in a state where the plurality of first support pins have been raised.

(Clause 25)
The substrate processing system of any one of clauses 22 to 24,
wherein
the sole transfer mode includes transferring the transfer jig and the second ring together between the plurality of second support pins and the transfer robot in a state where the plurality of second support pins have been raised.

(Clause 26)
The substrate processing system of any one of clauses 21 to 25, further including
a storage module connected to the vacuum transfer module and configured to store the first ring and the second ring.

(Clause 27)
The substrate processing system of clause 26,
wherein
the storage module is configured to store a first assembly including the first ring and the second ring placed on the first ring.

(Clause 28)
The substrate processing system of clause 26 or 27,
wherein
the storage module is configured to store a second assembly including the transfer jig and the second ring placed on the transfer jig.

(Clause 29)
The substrate processing system of clause 27,
wherein
an outer diameter of the second ring is the same as or smaller than an inner diameter of the first ring.

(Clause 30)
The substrate processing system of clause 29,
wherein
the lifter includes:
a plurality of third support pins disposed below the second ring; and
a plurality of fourth support pins disposed below the first ring.

(Clause 31)
The substrate processing system of clause 30,
wherein
the simultaneous transfer mode includes transferring the first ring and the second ring between the transfer robot and a set of the plurality of third support pins and the plurality of fourth support pins in a state where the plurality of third support pins and the plurality of fourth support pins have been raised.

(Clause 32)
The substrate processing system of clause 30 or 31,
wherein
the sole transfer mode includes transferring the second ring between the plurality of third support pins and the transfer robot in a state where the plurality of third support pins have been raised.

(Clause 33)
The substrate processing system of any one of clauses 20 to 32,
wherein
the second ring is an edge ring made of an electrically conductive material, and
the first ring is a cover ring made of an electrically insulating material.

(Clause 34)
A transfer method of transferring an outer ring and an inner ring in a processing system that includes a chamber; a vacuum transfer module connected to the chamber; a transfer apparatus provided in the vacuum transfer module; a stage configured to mount the outer ring and the inner ring on the stage, the outer ring and the inner ring being provided to surround a substrate in the chamber and having different inner diameters and outer diameters; and a lifter configured to raise and lower the outer ring and the inner ring with respect to the stage, the transfer method having:
a simultaneous transfer mode including the transfer apparatus being caused to simultaneously transfer the inner ring and the outer ring; and
a sole transfer mode including the transfer apparatus being caused to transfer only the inner ring.

(Clause 35)
A transfer method of transferring an outer ring and an inner ring in a processing system that includes a chamber; a vacuum transfer module connected to the chamber; a transfer apparatus provided in the vacuum transfer module; a stage configured to mount the outer ring and the inner ring on the stage, the outer ring and the inner ring being provided to surround a substrate in the chamber and having different inner diameters and outer diameters; and a lifter configured to raise and lower the outer ring and the inner ring with respect to the stage, the transfer method having:
a simultaneous transfer mode including the transfer apparatus being caused to simultaneously transfer the inner ring and the outer ring; and
a sole transfer mode including the transfer apparatus being caused to transfer only the inner ring,
wherein
each of the simultaneous transfer mode and the sole transfer mode includes raising the lifter so that the inner ring is raised in a state of being placed on the outer ring as a result of the outer ring being raised by the lifter.

While certain embodiments have been described, these embodiments have been presented by way of example only, and are not intended to limit the scope of the claimed subject matter. Indeed, the embodiments described herein may be embodied in a variety of other forms. Furthermore, various omissions, substitutions and changes in the forms of the embodiments described herein may be made without departing from the scope of the claimed subject matter. The accompanying claims and their equivalents are intended to cover such forms or modifications as would fall within the scope of the claimed subject matter.

DESCRIPTION OF SYMBOLS

10: plasma process chamber
11: substrate support
112: electrostatic chuck
113: ring assembly
50: lifter
78: cassette
781: base plate
782: guide pin
CR: cover ring
CRa: cutout
CU: controller
FR: edge ring
FRa: cutout
PS: processing system
TM1, TM2: vacuum transfer modules
TR1, TR2: transfer robots
W: substrate

What is claimed is:

1. A substrate processing system comprising:
a vacuum transfer module;
a plasma process module connected to the vacuum transfer module; and
a controller,
wherein
the vacuum transfer module includes:
  a vacuum transfer chamber; and
  a transfer robot disposed in the vacuum transfer chamber, and
the plasma process module includes:
  a plasma process chamber;
  a stage disposed in the plasma process chamber and having a substrate support surface and a ring support surface;
  a first ring disposed on the ring support surface of the stage;
  a second ring disposed on the first ring to surround a substrate that is placed on the substrate support surface, the second ring having an inner diameter smaller than an inner diameter of the first ring;
  a plurality of first support pins disposed below the ring support surface;
  a plurality of second support pins disposed below the substrate support surface;
  a first actuator configured to vertically move the plurality of first support pins with respect to the stage; and
  a second actuator configured to vertically move the plurality of second support pins with respect to the stage,
the controller is configured to selectively execute a simultaneous transfer mode in which the transfer robot is caused to simultaneously transfer the first ring and the second ring and a sole transfer mode in which the transfer robot is caused to transfer only the second ring,
the simultaneous transfer mode includes:
  raising the plurality of first support pins so that the first ring and the second ring are raised together by the plurality of first support pins; and
  transferring the first ring and the second ring together between the plurality of first support pins and the transfer robot in a state where the plurality of first support pins have been raised, and
the sole transfer mode includes:
  raising the plurality of first support pins so that the first ring and the second ring are raised together by the plurality of first support pins;
  raising the plurality of second support pins so that a transfer jig is supported by the plurality of second support pins at a height lower than a height of the second ring;
  lowering the plurality of first support pins so that the first ring is lowered to a position lower than a height of the transfer jig in a state where the first ring is supported by the plurality of first support pins while the second ring is supported by the transfer jig; and
  transferring the transfer jig and the second ring together between the plurality of second support pins and the transfer robot in a state where the plurality of second support pins have been raised.

2. The substrate processing system as claimed in claim 1, wherein
the first ring is made of an electrically insulating material, and
the second ring is made of an electrically conductive material.

3. The substrate processing system as claimed in claim 1, wherein
the first ring is made of quartz, and
the second ring is made of Si or SiC.

4. The substrate processing system as claimed in claim 1, wherein
the second ring includes an outer annular portion configured to be supported by the first ring and an inner annular portion configured to be supported by the transfer jig.

5. A substrate processing system, comprising:
a vacuum transfer module;
a plasma process module connected to the vacuum transfer module; and
a controller,
wherein
the vacuum transfer module includes:
  a vacuum transfer chamber; and
  a transfer robot disposed in the vacuum transfer chamber,
the plasma process module includes:
  a plasma process chamber;
  a stage disposed in the plasma process chamber, and having a substrate support surface and a ring support surface;
  a first ring and a second ring disposed on the ring support surface of the stage to surround a substrate that is placed on the substrate support surface of the stage; and
  a lifter configured to raise and lower the first ring and the second ring with respect to the stage, and
the controller is configured to selectively execute a simultaneous transfer mode in which the transfer robot is caused to simultaneously transfer the first ring and the second ring together and a sole transfer mode in which the transfer robot is caused to transfer only the second ring, and
each of the simultaneous transfer mode and the sole transfer mode includes raising the lifter so that the second ring is raised in a state of being placed on the first ring as a result of the first ring being raised by the lifter, the first ring and the second ring being in direct contact with each other while being raised.

6. The substrate processing system as claimed in claim 5, wherein
at least a part of the second ring is placed on the first ring.

7. The substrate processing system as claimed in claim 6, wherein
the lifter includes:
a plurality of first support pins disposed below the ring support surface; and
a plurality of second support pins disposed below the substrate support surface.

8. The substrate processing system as claimed in claim 7, wherein
the plurality of second support pins are configured to raise and lower the substrate that is placed on the substrate support surface.

9. The substrate processing system as claimed in claim 7, wherein
the simultaneous transfer mode includes transferring the first ring and the second ring together between the plurality of first support pins and the transfer robot in a state where the plurality of first support pins have been raised.

10. The substrate processing system as claimed in claim 6, further comprising
a storage module connected to the vacuum transfer module and configured to store the first ring and the second ring.

11. The substrate processing system as claimed in claim 10, wherein
the storage module is configured to store a first assembly including the first ring and the second ring placed on the first ring.

12. The substrate processing system as claimed in claim 10, wherein
the storage module is configured to store a second assembly including a transfer jig and the second ring placed on the transfer jig.

13. The substrate processing system as claimed in claim 5, wherein
the second ring is an edge ring made of an electrically conductive material, and
the first ring is a cover ring made of an electrically insulating material.

14. The substrate processing system as claimed in claim 5, wherein
an innermost diameter of the second ring is smaller than an innermost diameter of the first ring.

15. The substrate processing system as claimed in claim 5, wherein
an outermost diameter of the second ring is greater than an innermost diameter of the first ring.

16. The substrate processing system as claimed in claim 5, wherein
an outermost diameter of the second ring is smaller than an outermost diameter of the first ring.

17. A substrate processing system, comprising:
a vacuum transfer module;
a plasma process module connected to the vacuum transfer module; and
a controller,
wherein
the vacuum transfer module includes:
a vacuum transfer chamber; and
a transfer robot disposed in the vacuum transfer chamber,
the plasma process module includes:
a plasma process chamber;
a stage disposed in the plasma process chamber, and having a substrate support surface and a ring support surface;
a first ring and a second ring disposed on the ring support surface of the stage to surround a substrate that is placed on the substrate support surface of the stage; and
a lifter configured to raise and lower the first ring and the second ring with respect to the stage, and
the controller is configured to selectively execute a simultaneous transfer mode in which the transfer robot is caused to simultaneously transfer the first ring and the second ring together and a sole transfer mode in which the transfer robot is caused to transfer only the second ring, and
each of the simultaneous transfer mode and the sole transfer mode includes raising the lifter so that the second ring is raised in a state of being placed on the first ring as a result of the first ring being raised by the lifter,
wherein
at least a part of the second ring is placed on the first ring,
wherein
the lifter includes:
a plurality of first support pins disposed below the ring support surface; and
a plurality of second support pins disposed below the substrate support surface,
wherein
the sole transfer mode includes transferring a transfer jig and the second ring together between the plurality of second support pins and the transfer robot in a state where the plurality of second support pins have been raised.

18. A substrate processing system, comprising:
a vacuum transfer module;
a plasma process module connected to the vacuum transfer module; and
a controller,
wherein
the vacuum transfer module includes:
a vacuum transfer chamber; and
a transfer robot disposed in the vacuum transfer chamber,
the plasma process module includes:
a plasma process chamber;
a stage disposed in the plasma process chamber, and having a substrate support surface and a ring support surface;
a first ring and a second ring disposed on the ring support surface of the stage to surround a substrate that is placed on the substrate support surface of the stage; and a lifter configured to raise and lower the first ring and the second ring with respect to the stage, the controller is configured to selectively execute a simultaneous transfer mode in which the transfer robot is caused to simultaneously transfer the first ring and the second ring together and a sole transfer mode in which the transfer robot is caused to transfer only the second ring, and an outer diameter of the second ring is smaller than or equal to an inner diameter of the first ring, so that the first ring and the second ring do not overlap in plan view.

19. The substrate processing system as claimed in claim 18, wherein the lifter includes:

a plurality of third support pins disposed below the second ring; and a plurality of fourth support pins disposed below the first ring.

20. The substrate processing system as claimed in claim 19, wherein the simultaneous transfer mode includes transferring the first ring and the second ring between the transfer robot and a set of the plurality of third support pins and the plurality of fourth support pins in a state where the plurality of third support pins and the plurality of fourth support pins have been raised.

21. The substrate processing system as claimed in claim 19, wherein the sole transfer mode includes transferring the second ring between the plurality of third support pins and the transfer robot in a state where the plurality of third support pins have been raised.

* * * * *